(12) United States Patent
Boukai et al.

(10) Patent No.: US 10,644,216 B2
(45) Date of Patent: *May 5, 2020

(54) METHODS AND DEVICES FOR FORMING THERMOELECTRIC ELEMENTS

(71) Applicant: Matrix Industries, Inc., Menlo Park, CA (US)

(72) Inventors: Akram I. Boukai, Menlo Park, CA (US); Douglas W. Tham, Menlo Park, CA (US); Haifan Liang, Menlo Park, CA (US)

(73) Assignee: MATRIX INDUSTRIES, INC., Menlo Park, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/958,231

(22) Filed: Apr. 20, 2018

(65) Prior Publication Data
US 2018/0240957 A1    Aug. 23, 2018

Related U.S. Application Data

(63) Continuation of application No. 14/989,225, filed on Jan. 6, 2016, now abandoned, which is a continuation
(Continued)

(51) Int. Cl.
*H01L 35/32* (2006.01)
*H01L 35/34* (2006.01)
*H01L 35/22* (2006.01)

(52) U.S. Cl.
CPC .............. *H01L 35/32* (2013.01); *H01L 35/22* (2013.01); *H01L 35/34* (2013.01)

(58) Field of Classification Search
None
See application file for complete search history.

(56) References Cited

U.S. PATENT DOCUMENTS

| 365,990 A | 7/1887 | Giles |
|---|---|---|
| 3,653,989 A | 4/1972 | Alois |

(Continued)

FOREIGN PATENT DOCUMENTS

| CN | 1382626 A | 12/2002 |
|---|---|---|
| CN | 101449403 A | 6/2009 |

(Continued)

OTHER PUBLICATIONS

Advisory action dated Jul. 21, 2017 for U.S. Appl. No. 14/372,443.
(Continued)

*Primary Examiner* — Michael Jung
(74) *Attorney, Agent, or Firm* — Wilson Sonsini Goodrich & Rosati

(57) ABSTRACT

The present disclosure provides a thermoelectric element comprising a flexible semiconductor substrate having exposed surfaces with a metal content that is less than about 1% as measured by x-ray photoelectron spectroscopy (XPS) and a figure of merit (ZT) that is at least about 0.25, wherein the flexible semiconductor substrate has a Young's Modulus that is less than or equal to about $1 \times 10^6$ pounds per square inch (psi) at 25° C.

19 Claims, 27 Drawing Sheets

Related U.S. Application Data of application No. 14/667,177, filed on Mar. 24, 2015, now Pat. No. 9,263,662.

(60) Provisional application No. 62/013,468, filed on Jun. 17, 2014, provisional application No. 61/970,322, filed on Mar. 25, 2014.

(56) References Cited

U.S. PATENT DOCUMENTS

| | | |
|---|---|---|
| 4,070,821 A | 1/1978 | Somogyi |
| 4,078,945 A | 3/1978 | Gonsiorawski |
| 4,092,445 A | 5/1978 | Tsuzuki et al. |
| 4,106,279 A | 8/1978 | Martin et al. |
| 4,261,049 A | 4/1981 | Komiyama et al. |
| 4,681,657 A | 7/1987 | Hwang et al. |
| 4,985,722 A | 1/1991 | Ushijima et al. |
| 5,089,293 A | 2/1992 | Bohara et al. |
| 5,139,624 A | 8/1992 | Searson et al. |
| D332,408 S | 1/1993 | Cbodat et al. |
| 5,206,523 A | 4/1993 | Goesele et al. |
| D365,767 S | 1/1996 | Hitter |
| 5,552,328 A | 9/1996 | Orlowski et al. |
| 5,565,084 A | 10/1996 | Lee et al. |
| 5,695,557 A | 12/1997 | Yamagata et al. |
| 5,767,020 A | 6/1998 | Sakaguchi et al. |
| 5,868,947 A | 2/1999 | Sakaguchi et al. |
| 5,873,003 A | 2/1999 | Inoue et al. |
| 5,889,735 A | 3/1999 | Kawata et al. |
| 5,895,223 A | 4/1999 | Peng et al. |
| D409,097 S | 5/1999 | Monachon |
| 5,970,361 A | 10/1999 | Kumomi et al. |
| 5,981,400 A | 11/1999 | Lo |
| 5,990,605 A | 11/1999 | Yoshikawa et al. |
| 6,017,811 A | 1/2000 | Winton et al. |
| 6,093,941 A | 7/2000 | Russell et al. |
| 6,194,323 B1 | 2/2001 | Downey et al. |
| 6,222,114 B1 | 4/2001 | Mitamura |
| 6,304,520 B1 | 10/2001 | Watanabe |
| 6,304,521 B1 | 10/2001 | Kanesaka |
| 6,313,015 B1 | 11/2001 | Lee et al. |
| 6,407,965 B1 | 6/2002 | Matoge et al. |
| 6,762,134 B2 | 7/2004 | Bohn et al. |
| 6,790,785 B1 | 9/2004 | Li et al. |
| 6,803,260 B2 | 10/2004 | Shin et al. |
| 6,882,051 B2 | 4/2005 | Majumdar et al. |
| D504,624 S | 5/2005 | Bodino |
| 7,075,161 B2 | 7/2006 | Barth |
| 7,115,971 B2 | 10/2006 | Stumbo et al. |
| 7,135,728 B2 | 11/2006 | Duan et al. |
| 7,161,168 B2 | 1/2007 | Heath et al. |
| D536,994 S | 2/2007 | Sugisawa et al. |
| 7,189,435 B2 | 3/2007 | Tuominen et al. |
| 7,190,049 B2 | 3/2007 | Tuominen et al. |
| 7,254,953 B2 | 8/2007 | Callas et al. |
| 7,291,282 B2 | 11/2007 | Tong |
| 7,309,830 B2 | 12/2007 | Zhang et al. |
| 7,465,871 B2 | 12/2008 | Chen et al. |
| 7,569,941 B2 | 8/2009 | Majumdar et al. |
| 7,572,669 B2 | 8/2009 | Tuominen et al. |
| 7,629,531 B2 | 12/2009 | Stark |
| 7,645,625 B2 | 1/2010 | Ono et al. |
| 7,675,084 B2 | 3/2010 | Wierer, Jr. et al. |
| 7,960,258 B2 | 6/2011 | Chao et al. |
| D646,183 S | 10/2011 | De |
| 8,087,254 B2 | 1/2012 | Arnold |
| 8,101,449 B2 | 1/2012 | Liang et al. |
| 8,278,191 B2 | 10/2012 | Hildreth et al. |
| 8,324,699 B2 | 12/2012 | Ichijo et al. |
| 8,486,843 B2 | 7/2013 | Li et al. |
| 8,641,912 B2 | 2/2014 | Heath et al. |
| 8,980,656 B2 | 3/2015 | Li et al. |
| D729,638 S | 5/2015 | Favre |
| 9,065,016 B2 | 6/2015 | Peter et al. |
| D736,103 S | 8/2015 | Behling |
| D744,866 S | 12/2015 | Behling |
| 9,209,375 B2 | 12/2015 | Boukai et al. |
| 9,263,662 B2 | 2/2016 | Boukai et al. |
| D752,045 S | 3/2016 | Kim et al. |
| 9,419,498 B2 | 8/2016 | Kimura et al. |
| 9,515,246 B2 | 12/2016 | Boukai et al. |
| 1,000,300 A1 | 6/2018 | Boukai et al. |
| 2004/0152240 A1 | 8/2004 | Dangelo |
| 2005/0133254 A1 | 6/2005 | Tsakalakos |
| 2005/0176264 A1 | 8/2005 | Lai et al. |
| 2005/0215063 A1 | 9/2005 | Bergman |
| 2005/0253138 A1 | 11/2005 | Choi et al. |
| 2006/0032526 A1 | 2/2006 | Fukutani et al. |
| 2006/0118158 A1 | 6/2006 | Zhang et al. |
| 2006/0185710 A1 | 8/2006 | Yang et al. |
| 2007/0258213 A1 | 11/2007 | Chen et al. |
| 2007/0277866 A1 | 12/2007 | Sander et al. |
| 2008/0019876 A1 | 1/2008 | Chau et al. |
| 2008/0112669 A1 | 5/2008 | Choi et al. |
| 2008/0173344 A1 | 7/2008 | Zhang et al. |
| 2008/0257395 A1 | 10/2008 | Jovanovic et al. |
| 2008/0271772 A1 | 11/2008 | Leonov et al. |
| 2008/0314429 A1 | 12/2008 | Leonov |
| 2009/0020148 A1 | 1/2009 | Boukai et al. |
| 2009/0020188 A1 | 1/2009 | Ulicny et al. |
| 2009/0069045 A1 | 3/2009 | Cheng |
| 2009/0117741 A1 | 5/2009 | Heath et al. |
| 2010/0035163 A1 | 2/2010 | Kobrin |
| 2010/0065810 A1 | 3/2010 | Goesele et al. |
| 2010/0126548 A1 | 5/2010 | Jang et al. |
| 2010/0147350 A1 | 6/2010 | Chou et al. |
| 2010/0193001 A1 | 8/2010 | Hirono et al. |
| 2010/0248449 A1 | 9/2010 | Hildreth et al. |
| 2011/0003279 A1 | 1/2011 | Patel |
| 2011/0114145 A1 | 5/2011 | Yang et al. |
| 2011/0114146 A1 | 5/2011 | Scullin |
| 2011/0168978 A1 | 7/2011 | Kochergin |
| 2011/0179806 A1 | 7/2011 | Ipposhi et al. |
| 2011/0215441 A1 | 9/2011 | Lin et al. |
| 2011/0263119 A1 | 10/2011 | Li et al. |
| 2011/0266521 A1 | 11/2011 | Ferrari et al. |
| 2012/0097204 A1 | 4/2012 | Yu et al. |
| 2012/0152295 A1 | 6/2012 | Matus et al. |
| 2012/0160290 A1 | 6/2012 | Chen et al. |
| 2012/0167936 A1 | 7/2012 | Park et al. |
| 2012/0174956 A1 | 7/2012 | Smythe et al. |
| 2012/0217165 A1 | 8/2012 | Feng et al. |
| 2012/0282435 A1 | 11/2012 | Yang et al. |
| 2012/0290051 A1 | 11/2012 | Boyden et al. |
| 2012/0295074 A1 | 11/2012 | Yi et al. |
| 2012/0319082 A1 | 12/2012 | Yi et al. |
| 2012/0326097 A1 | 12/2012 | Ren et al. |
| 2013/0019918 A1 | 1/2013 | Boukai et al. |
| 2013/0052762 A1 | 2/2013 | Li et al. |
| 2013/0087180 A1 | 4/2013 | Stark et al. |
| 2013/0143407 A1 | 6/2013 | Lin et al. |
| 2013/0175484 A1 | 7/2013 | Ren et al. |
| 2013/0186445 A1 | 7/2013 | Lorimer et al. |
| 2014/0117380 A1 | 5/2014 | Loboda et al. |
| 2014/0299169 A1 | 10/2014 | Schneider et al. |
| 2014/0306250 A1 | 10/2014 | Gardner et al. |
| 2014/0326287 A1 | 11/2014 | Wiant et al. |
| 2014/0373888 A1 | 12/2014 | Boukai et al. |
| 2015/0083180 A1 | 3/2015 | Lang |
| 2015/0101788 A1 | 4/2015 | Smith et al. |
| 2015/0162517 A1 | 6/2015 | Kasichainula |
| 2015/0179911 A1 | 6/2015 | Lemmer et al. |
| 2015/0216718 A1 | 8/2015 | Diller et al. |
| 2015/0280099 A1 | 10/2015 | Boukai et al. |
| 2016/0035956 A1 | 2/2016 | Carroll et al. |
| 2016/0056360 A1 | 2/2016 | Cho et al. |
| 2016/0141480 A1* | 5/2016 | Zhu .......... H01L 35/34 136/200 |
| 2016/0197259 A1 | 7/2016 | Boukai et al. |

(56) References Cited

U.S. PATENT DOCUMENTS

| | | | |
|---|---|---|---|
| 2017/0162776 | A1 | 6/2017 | Boukai et al. |
| 2017/0365766 | A1 | 12/2017 | Boukai et al. |

FOREIGN PATENT DOCUMENTS

| | | |
|---|---|---|
| JP | S63266829 A | 11/1988 |
| JP | H11317547 A | 11/1999 |
| JP | 2004193526 A | 7/2004 |
| JP | 2006261451 A | 9/2006 |
| JP | 2007300127 A | 11/2007 |
| JP | 2010192580 A | 9/2010 |
| JP | 2010537430 A | 12/2010 |
| WO | WO-0102556 A3 | 8/2001 |
| WO | WO-0223607 A1 | 3/2002 |
| WO | WO-2009011975 A2 | 1/2009 |
| WO | WO-2009014985 A2 | 1/2009 |
| WO | WO-2010003629 A2 | 1/2010 |
| WO | WO-2011049804 A2 | 4/2011 |
| WO | WO-2012054777 A2 | 4/2012 |
| WO | WO-2012068426 A2 | 5/2012 |
| WO | WO-2013012842 A1 | 1/2013 |
| WO | WO-2013109729 A1 | 7/2013 |
| WO | WO-2014028903 A1 | 2/2014 |
| WO | WO-2014070795 A1 | 5/2014 |
| WO | WO-2014179622 A1 | 11/2014 |
| WO | WO-2015134394 A1 | 9/2015 |
| WO | WO-2015148554 A1 | 10/2015 |
| WO | WO-2017096094 A1 | 6/2017 |
| WO | WO-2017192738 A1 | 11/2017 |

OTHER PUBLICATIONS

Agnes, et al. Doping of the nanocrystalline semiconductor zinc oxide with the donor indium, Amer Institute of Phystcs, vol. 83, No. 6, 1204, (Aug. 11, 2003).

Beckman, et al., Bridging Dimensions: Demultiplexing Ultrahigh-Density nanowire Circuits, Science 2005, 310: 465-468.

Beckman, et al. Fabrication of Conducting. Silicon nanowire Arrays, J. Appi. Phys. 96 (10), 5921-5923'(2004).

Behnen. Quantitative examination of the thermoelectric power of n-typesilicon in the phono drag regime.Journal of Applied Physics, vol. 67, pp. 287-292, Jan. 1, 1990.

Bera, et al. Marked Effects of Alloying on the Thermal Conductivity of nanoporous Materials, Mar. 19, 2010, American Physical Society Physical Review Letters, 104, pp. 115502-01 to 115502-4.

Boukai, et al. Silicon nanowires as efficient thermoelectric materials. nature, vol. 451, pp. 168-171, Jan. 10, 2008.

Boukai, et al. Size-Dependent transport and thermoelectric properties of individual polycrystalline bismuth nanowires. Advanced Materials, 18, pp. 864-869, 2006.

Boukai. Thermoelectric properties of bismuth and silicon nanowires. Dissertation (Ph.D.), California Institute of Technology. 2008.

Bunimovich, et al. Quantitative Real-Time Measurements of DnA Hybridization with Alkylated nonoxidized Silicon nanowires in Electrolyte Solution, JACS 2006, 128: 16323-16331.

Chadwick, et al. Plane waves in an elastic solid conducting heat. Journal of the Mechanics and Physics of Solids 6, 223-230 (1958).

Chen, et al. Dispenser Printed Microscale Thermoelectric Generators for Powering Wireless Sensor Networks. Paper No. IMECE2009-11636, pp. 343-352; 10 pages.

Chen, et al. Recent developments in thermoelectric materials. International Materials Reviews, vol. 48, pp. 45-66, 2003.

Choi, et al. Fabrication of bismuth nanowires with a silver nanocrystal shadowmask, J. Vac. Sci. Tech. A-Vac. Surf. and Films, 18, 1236, 1328 (2000).

Choi, et al. Fabrication of nanometer size photoresist wire patterns With a silver nanocrystal shadowmask. J. Vac. Sci. & Tech. A-Vac. Surf. and Films, 17, 1425 (1999).

Chung, et al. Fabrication and Alignment of Wires in Two-Dimensions. The Journal of PhysiCal Chemistry B. 102. 6685 (1998).

Collier, et al. Nanocrystal superlattices. Annu. Rev. Phys. Chem. 1998, 49: 371-404.

Co-pending U.S. Appl. No. 15/982,672, filed May 17, 2018.

Co-pending U.S. Appl. No. 15/992,635, filed May 30, 2018.

Deresiewicz. Plane waves in a thermoelastic solid. Journal of the Acoustical Society of America 29, 204-209 (1957).

Diehl, et al. Self-Assembly of Deterministic Carbon nanottibe Wiring networks. Angew. 'Chem. Int Ed. 41, 353 (2002).

European search report and opinion dated Feb. 26, 2016 for EP Application No. 13829134.9.

European search report and opinion dated Mar. 25, 2014 for EP Application No. 11835180.8.

Extended European Search Report and Search Opinion dated Oct. 9, 2017 for European Patent Application No. EP 15768608.0.

Fan, et al. Self-Oriented Regular Arrays of Carbon nanotubes and their Field Emission Devices. Science, v. 283, p. 512 (Jan. 22, 1999).

Geballe, et al. Seebeck Effect in Silicon. Physical Review, vol. 98, pp. 940-947, May 15, 1955.

Green, et al., A 160-kilobit molecular electronic memory patterned at 1011 bits per square centimeter, nature 2007, 445: 414-417.

Gurevich. Thermoelectric properties of conductors J. Phys. (U.S.S. R.) 9, 477 (1945).

Harman, et al. Quantum dot superlattice thermoelectric materials and devices. Science, vol. 297, pp. 2229-2232, Sep. 27, 2002.

Haynes, et al. nanosphere Lithography: A Versatile nanofabrication Tool for Studies of Size-Dependent nanoparticle Optics. J. Phys. Chem. B, 105, 5599-5611 (2001).

Heat sinks heat spreaders peltier coolers, novel concepts, Inc., 2014, Available at novelconceptsinc.comhttp://www.novelconceptsinc.com/heat-spreaders.htm, accessed on Aug. 21, 2017, 2 pages.

Heath, et al. A Defect-Tolerant Computer Architecture: Opportunities for nanotechnology, Science 1998, 280: 1716-1721.

Heath, et al. Pressure/Temperature Phase Diagrams and Superlattices of Organically Functionalized Metal nanocrystal Monolayers: The Influence of Particle Size, Size Distribution, and Surface Passivant, J. Phys. Chem. B 1997, 101: 189-197.

Herring. Theory of the thermoelectric power of semiconductors. Physical Review, vol. 96, No. 5, pp. 1163-1187, 1954.

Hicks, et al., Thermoelectric figure of merit of a one-dimensional conductor. Physical Review B 47, 1 6631-6634 (1993).

Hochbaum, et al. Enchanced thermoelectric performance of rough silicon nanowires, Jan. 2008, nature Publishing Group, vol. 451, pp. 1-6.

Hsu, et al. Cubic AgPbmSbTe2+m: Bulk thermoelectric materials with high Figure of Merit. Science, vol. 303, pp. 818-821, Feb. 6, 2004.

Huang, et al. Metal-assisted chemical etching of silicon: a review. Adv Mater. Jan. 11, 2011;23(2):285-308. doi: 10.1002/adma. 201001784.

Huang, et al. Spontaneous formation of nanoparticle strip patterns through dewetting. nature Materials vol. 4, p. 896 (2005).

Hulteen, et al. nanosphere lithography: A materials general fabrication process for periodic particle array surfaces, J. Vac. Sci. Technol. 1995, 13: 1553-1558.

Humphrey, et al. Reversible thermoelectric nanomaterials. Physical Review Letters 94, 096601 (2005).

Husain, et al. Nanowire-based very-high-frequency electromechanical resonator. Applied physics letters, vol. 83, No. 6, Aug. 11, 2003, pp. 1240-1242.

Ihab, et al. Manipulation of thermal phonons: a phononic crystal route to high-ZT thermoelectrics. Photonic and Phononic Properties of Engineered nanostructures, SPIE. 1000 20th ST. Bellingham, WA 98225-6705. Feb. 10, 2011; 7946:1-9.

International search report and written opinion dated Feb. 9, 2009 for PCT/US2008/070309.

International search report and written opinion dated Apr. 7, 2017 for PCT Application No. US-201664501.

International search report and written opinion dated Apr. 15, 2009 for PCT/US2008/064439.

International search report and written opinion dated Apr. 26, 2013 for PCT/US2013/021900.

(56) References Cited

OTHER PUBLICATIONS

International search report and written opinion dated May 29, 2012 for PCT/US2011/057171.
International search report and written opinion dated Jul. 3, 2015 for PCT Application No. US2015/022312.
International search report and written opinion dated Jul. 17, 2012 for PCT Application No. PCT/US2012/047021.
International search report and written opinion dated Aug. 7, 2017 for PCT Application US-201730868.
International search report and written opinion dated Dec. 27, 2013 for PCT/US2013/055462.
International search report dated Feb. 10, 2014 for PCT/US2013/067346.
Joannopoulos, et al. Photonic crystals: putting a new twist on light, nature 1997, 386: 143-149.
Jung, et al. Circuit Fabrication at 17 nm Half-Pitch by nanoimprint-tithography. nanoLetters, 6, 351 (2006).
Koga, et al. Experimental proof-of-principle investigation of enhanced Z3DT in (100) oriented Si/Ge superlattices. Applied Physics Letters 77, 1490-1492 (2000).
Lee, et al. Enhanced thermoelectric figure-of-merit in nanostructured p-type silicon germanium bulk alloys. nano. Lett. 2008; 8(12):4670-4674.
Lee, et al nanoporous Si as an Efficient Thermoelectric Material. nano Letter, 8, 2008, 3750-3754.
Lee, et al. nanostructured bulk thermoelectric materials and their properties. ICT 2005. 24th International Conference on Thermoelectrics (ICT). 2005 284-287.
Li, et al. Measuring thermal and thermoelectric properties of one-dimensional nanostructures using a microfabricated device. Journal of heart transfer, vol. 125, pp. 881-888, Oct. 2003.
Li et al. Thermal Conductivity of Individual Silicon Nanowires. Appl Phys Lett 83(14):2934-2936 (Oct. 6, 2003).
Lifshitz, et al. Thermoelastic damping in micro- and nanomechanical systems. Physical Review B 61, 5600-5609 (2000).
Liu, et al. Thermal conduction in ultrahigh pure and doped single-crystal silicon layers at high temperatures. Journal of Applied Physics 98, 123523 (2005).
Llaguno, et al. Observation of thermopower oscillations in the coulomb blockade regime in a semiconducting carbon nanotube. nano Lett. 4, 45-49 (2004).
Mahan, et al. The best thermoelectric. PnAS 93, 7436-7439 (1996).
Mahan, et al. Thermoelectric materials: new approaches to an old problem. Physics Today 50, pp. 42-47, Mar. 1997.
Majumdar. Thermoelectricity in Semiconductor nanostructures. Science Feb. 6, 2004; 303(5659):777-778. DOI: 10.1126/science.1093164.
Maranganti, et al. Length scales at which classical elasticity breaks down for various materials. Physical Review Letters 98, 195504 (2007).
Marthur, et al., Thermoelectric power in porous silicon, Journal of Applied Physics, Jun. 1, 1998, 83(11):5855-5857.
Martin. nanomaterials—A membrane based synthetic approach. Science, v. 266, p. 1961-1966 (Dec. 23, 1994).
Melosh, et al. Ultra-high density nanowire lattices and circuits. Science, vol. 300, pp. 112-115,Apr. 4, 2003.
Morales, et al. A laser ablation method for the synthesis of semiconductor crystalline nanowires. Science, vol. 279, pp. 208-211, Jan. 9, 1998.
NDT Resource Center, Thermal Conductivity. Downloaded Nov. 26, 2013. https://www.nde-ed.org/EducationResources/CommunityCollege/Materials/Physical_Chemical/ThermalConductivity.htm.
Notice of allowance dated Jan. 22, 2016 for U.S. Appl. No. 14/667,177.
Notice of allowance dated Jun. 15, 2016 for U.S. Appl. No. 13/278,074.
Notice of allowance dated Jul. 13, 2011 for U.S. Appl. No. 12/125,043.
Notice of allowance dated Jul. 29, 2015 for U.S. Appl. No. 12/175,027.
Notice of allowance dated Jul. 29, 2016 for U.S. Appl. No. 14/624,506.
Notice of allowance dated Aug. 18, 2017 for U.S. Appl. No. 14/700,082.
Notice of allowance dated Oct. 2, 2013 for U.S. Appl. No. 12/125,043.
Notice of allowance dated Oct. 8, 2015 for U.S. Appl. No. 14/667,177.
Notice of allowance dated Nov. 6, 2015 for U.S. Appl. No. 14/667,177.
Notice of allowance dated Dec. 10, 2015 for U.S. Appl. No. 14/667,177.
Office action dated Jan. 9, 2015 for U.S. Appl. No. 12/175,027.
Office Action dated Jan. 16, 2018 for U.S. Appl. No. 14/989,225.
Office Action dated Jan. 17, 2018 for U.S. Appl. No. 14/372,443.
Office action dated Jan. 23, 2015 for U.S. Appl. No. 13/278,074.
Office action dated Feb. 2, 2017 for U.S. Appl. No. 14/700,082.
Office action dated Feb. 12, 2015 for U.S. Appl. No. 13/550,424.
Office action dated Feb. 18, 2011 for U.S. Appl. No. 12/125,043.
Office action dated Apr. 19, 2017 for U.S. Appl. No. 14/372,443.
Office action dated Apr. 25, 2013 for U.S. Appl. No. 13/278,074.
Office action dated May 23, 2013 for U.S. Appl. No. 12/175,027.
Office action dated Jun. 16, 2015 for U.S. Appl. No. 13/278,074.
Office action dated Jun. 22, 2011 for U.S. Appl. No. 12/175,027.
Office action dated Jun. 23, 2016 for U.S. Appl. No. 14/372,443.
Office action dated Jun. 26, 2017 for U.S. Appl. No. 14/989,225.
Office action dated Jun. 28, 2016 for U.S. Appl. No. 14/624,506.
Office action dated Jun. 29, 2016 for U.S. Appl. No. 13/550,424.
Office action dated Jun. 30, 2014 for U.S. Appl. No. 12/175,027.
Office action dated Jul. 18, 2014 for U.S. Appl. No. 13/278,074.
Office action dated Aug. 7, 2013 for U.S. Appl. No. 13/278,074.
Office action dated Aug. 28, 2015 for U.S. Appl. No. 13/550,424.
Office action dated Oct. 7, 2016 for U.S. Appl. No. 14/989,225.
Office action dated Nov. 10, 2010 for U.S. Appl. No. 12/175,027.
Office action dated Nov. 17, 2015 for U.S. Appl. No. 14/372,443.
Office action dated Nov. 18, 2015 for U.S. Appl. No. 13/278,074.
Office action dated Nov. 27, 2013 for U.S. Appl. No. 12/175,027.
Pearson. Survey of thermoelectric studies of the group-1 metals at low temperatures carried out at the national-research-laboratories, Ottawa. Soviet Physics-Solid State 3, 1024-1033 (1961).
Peng, et al. Ordered silicon nanowire'arrays via nanosphere lithography and metal induced etching. Applied Physics Letters, v.90, article # 163123 (2007).
Prasher. Thermal conductivity of composites of aligned nanoscale and microscale wires and pores. Journal of Applied Physics, 100, 034307, 2006, p. 1-9.
Qiu, et al. Large complete band gap in two-dimensional photonic crystals with elliptic air holes, Physical Review B 1999, 60: 10 610-10 612.
Routkevitch, et al. Electrochemical Fabrication of CdS nanowires arrays in porous anodic aluminum oxide templates. The Journal of Physical Chemistry, v. 100, p. 14037-14047 (1996).
She, et al. Fabrication of vertically aligned Si nanowires and their application in a gated field emission device. Applied Physics Letters. v; 88. article # 013112 (2006).
Silverstein, et al. Porous polymers. John Wiley & Sons, 2011.
Small, et al. Modulation of thermoelectric power of individual carbon nanotubes. Physical Review letters, vol. 91, pp. 256801-1 to 256801-4, 2003.
Snyder, et al. Thermoelectric microdevice fabricated by a MEMS-like electrochemical process. nature Material, vol. 2, pp. 528-531, Aug. 2003.
Tang, et al. Holey silicon as an efficient thermoelectric material. nano. Lett. 2010; 10:4279-4283.
Tao, et al. Langrfluir Blodgett Silver nanowire Monolayers for Molecular Sensing Using Surface-Enhanced Raman Spectroscopy. nanoLetters 3, 1229 (2003).
Trzcinski, et al. Quenched Phonon Drag in Silicon Microcontacts. Physical Review Letters, vol. 56, No. 10, pp. 1086-1089, 1986.
U.S. Appl. No. 29/584,211 Notice of Allowance dated Jan. 26, 2018.
Venkatasubramanian, et al. Thin-film thermoelectric devices with high room-temperature figures of merit. nature, vol. 413, pp. 597-602, Oct. 11, 2001.
Vining. Desperately seeking silicon. nature, vol. 451, pp. 132-133, Jan. 10, 2008.
Vossmeyer, et al. Light-directed assembly of nanoparticles, Angew. Chem. Int. Ed. Engl. 1997, 36: 1080-1083.

(56) References Cited

OTHER PUBLICATIONS

Wallarah Minerals, Downloaded Mar. 26, 2015. http://www.wallarahminerals.com.au/high-temperature-seebeck-probes.htm.
Wang, et al. A new type of lower power thermoelectric microgenerator fabricated by nanowire array thermoelectric material. Microelectronic Engineering. 2005; 77:223-229.
Wang, et al. Complementary Symmetry Silicon nanowire Logic: Power-Efficient Inverters with Gain, Small 2006, 2: 1153-1158.
Wang, et al. Oxidation Resistant Germanium nanowires:. Bulk. Synthesis. Long Chain Alkahethioi Functionalization, and Langmuir-Blodgett Assembly. Journal of the American Chemical Society, 127, 11871 (2005).
Wang, et al., Silicon p-FETs from Ultrahigh Density nanowire Arrays, nano Letters 2006, 6: 1096-1100.
Wang, et al. Surface Chemistry and Electrical Properties of Germanium nanowires, JACS 2004, 126: 11602-11611.
Wang, et al. Use of phopshine as an n-type dopant source for vapor-liquid-solid growth of silicon nanowires. nano Letters. 2005; 5(11):2139-2143.
Webelement Periodic Table, Silicon the essentials. Downloaded from https://www.webelemetns.com/silicon/ on Aug. 12, 2015.
Weber, et al. Silicon-nanowire transistors with Intruded nickel-Silicide Contacts. nano Letters v. 6, p. 2660-2666 (2006).
Weber, et al. Transport properties of silicon. Applied Physics A: Solids and Surfaces, pp. 136-140, 1991.
Whang, et al. Large-Scale Hierarchical Organization of nanowire Arrays for Integrated nanosystems. nanoLetters 3, 1255-1259 (2003).
Williams, et al. Etch rates for micromachining processing. Journal of Microelectromechanical Systems 5(4):761-778 (1996).
Wolfsteller; et al., "Comparison of the top-down and bottom-up approach to fabricate nanowire-based silicon/germanium heterostructures. Thin Solid Films 518.9 (2010): 2555-2561."
Wu, et al. Single-crystal metallic nanowires and meta semiconductor nanowires heterostructures. nature, 430. p. 61'(2004).
Xu, et al. Controlled fabrication of long quasione-dimensional superconducting nanowire arrays. nano letters, vol. 8, No. 1, Dec. 6, 2007, pp. 136-141.
Yablonovitch. Photonic band-gap structures, J. Opt. Soc. Am. B. 1993, 10: 283-297.
Yang, et al. Encoding Electronic Properties.By Synthesis of Axial Modulation Doped Silicon nanowires. Science, 310, p. 1304 (2005).
Yang, et al. Single p-Type/Intrinsic/n-TypeSilicon nanowires as nanoscale Avalanche Photodetectors, nano Letters 2006, 6: 2929-2934.
Yang, et al. Thermal conductivity of simple and tubular nanowire composites in the longitudinal direction. Physiucal Review B, 72, 125418, 2005, p. 1-7.
Yu, et al. Reduction of thermal conductivity in phononic nanomesh structures. nature nanotechnology. 2010; 5:718-721.
Yu-Ming, et al. Semimetal-semicinductor transition in bil_xSbx alloy nanowires and their thermoelectric properties. Applied Physics Letter, Volov. 81, No. 13, pp. 2403-2405, Sep. 23, 2002.
Zener, et al. Internal friction in solids III. Experimental demonstration of thermoelastic internal friction. Physical Review 53, 100-101 (1938).
Zener. Internal friction in solids I. Theory of internal friction in reeds. Physical Review 52, 230-235 (1937).
Zhong, et al. Nanowire Crossbar Arrays as Address Decoders for Integrated nanosystems, Science 2003, 302: 1377-1379.
Zhou. Determination of transport properties in chromium disilicide nanowires via combined thermoelectric and structural characterizations. nano Letters 7, 1649-1654 (2007).
Zhou, et al. Verticaly aligned Zn2SiO4 nanotube/ZnO nanowire Heterojunction Arrays. Small, v.3. p. 622-626 (2007).

* cited by examiner

METHODS AND DEVICES FOR FORMING THERMOELECTRIC ELEMENTS

CROSS-REFERENCE

This application is a continuation of U.S. patent application Ser. No. 14/989,225, filed Jan. 6, 2016, which is a continuation of U.S. patent application Ser. No. 14/667,177, filed Mar. 24, 2015, which claims priority to U.S. Provisional Patent Application No. 62/013,468, filed Jun. 17, 2014, and U.S. Provisional Patent Application No. 61/970,322, filed Mar. 25, 2014, each of which is entirely incorporated herein by reference.

BACKGROUND

Over 15 Terawatts of heat is lost to the environment annually around the world by heat engines that require petroleum as their primary fuel source. This is because these engines only convert about 30 to 40% of petroleum's chemical energy into useful work. Waste heat generation is an unavoidable consequence of the second law of thermodynamics.

The term "thermoelectric effect" encompasses the Seebeck effect, Peltier effect and Thomson effect. Solid-state cooling and power generation based on thermoelectric effects typically employ the Seebeck effect or Peltier effect for power generation and heat pumping. The utility of such conventional thermoelectric devices is, however, typically limited by their low coefficient-of-performance (COP) (for refrigeration applications) or low efficiency (for power generation applications).

Thermoelectric device performance may be captured by a so-called thermoelectric figure-of-merit, $Z=S^2\sigma/k$, where 'S' is the Seebeck coefficient, '$\sigma$' is the electrical conductivity, and 'k' is thermal conductivity. Z is typically employed as the indicator of the COP and the efficiency of thermoelectric devices—that is, COP scales with Z. A dimensionless figure-of-merit, ZT, may be employed to quantify thermoelectric device performance, where 'T' can be an average temperature of the hot and the cold sides of the device.

Applications of conventional semiconductor thermoelectric coolers are rather limited, as a result of a low figure-of-merit, despite many advantages that they provide over other refrigeration technologies. In cooling, low efficiency of thermoelectric devices made from conventional thermoelectric materials with a small figure-of-merit limits their applications in providing efficient thermoelectric cooling.

SUMMARY

The present disclosure provides thermoelectric elements, devices and systems, and methods for forming such elements, devices and systems.

Although there are thermoelectric devices currently available, recognized herein are various limitations associated with such thermoelectric devices. For example, some thermoelectric devices currently available may not be flexible and able to conform to objects of various shapes, making it difficult to maximize a surface area for heat transfer. As another example, some thermoelectric devices currently available are substantially thick and not suitable for use in electronic devices that require more compact thermoelectric devices.

The present disclosure provides thermoelectric elements, devices and systems, and methods for forming such thermoelectric elements, devices and systems. Thermoelectric elements and devices of the present disclosure can be flexible and able to conform to objects of various shapes, sizes and configurations, making such elements and devices suitable for use in various settings, such as consumer and industrial settings. Thermoelectric elements and devices of the present disclosure can conform to surfaces to collect waste heat and transform at least a fraction of the waste heat to usable energy. In some cases waste heat can be generated during a chemical, electrical, and/or mechanical energy transformation process.

In an aspect of the present disclosure, a method for forming a thermoelectric element having a figure of merit (ZT) that is at least about 0.25 comprises (a) providing a reaction space comprising a semiconductor substrate, a working electrode in electrical communication with a first surface of the semiconductor substrate, an etching solution (e.g., electrolyte) in contact with a second surface of the semiconductor substrate, and a counter electrode in the etching solution, wherein the first and second surfaces of the semiconductor substrate is substantially free of a metallic coating; and (b) using the electrode and counter electrode to (i) direct electrical current to the semiconductor substrate at a current density of at least about 0.1 mA/cm$^2$, and (ii) etch the second surface of the semiconductor substrate with the etching solution to form a pattern of holes in the semiconductor substrate, thereby forming the thermoelectric element having the ZT that is at least about 0.25, wherein the etch is performed at an electrical potential of at least about 1 volt (V) across the semiconductor substrate and etching solution, and wherein the etch has an etch rate that is at least about 1 nanometer (nm) per second at 25° C. In some embodiments, the electrical potential is at least about 1 volt (V) across the working electrode, etching solution and counter electrode.

In some embodiments, the electrical potential is an alternating current (AC) voltage. In some embodiments, the electrical potential is a direct current (DC) voltage.

In some embodiments, the working electrode is in contact with the first surface. In some embodiments, the working electrode is in ohmic contact with the first surface. In some embodiments, the semiconductor substrate is part of the working electrode.

In some embodiments, the etch rate is at least about 10 nm per second. In some embodiments, the etch rate is at least about 100 nm per second. In some embodiments, the etch rate is at least about 1000 nm per second.

In some embodiments, the current density is at least about 1 mA/cm$^2$. In some embodiments, the current density is at least about 10 mA/cm$^2$. In some embodiments, the current density is from about 10 mA/cm$^2$ to 50 mA/cm$^2$, 10 mA/cm$^2$ to 30 mA/cm$^2$, or 10 mA/cm$^2$ to 20 mA/cm$^2$. In some embodiments, the current density is less than or equal to about 100 mA/cm$^2$ or 50 mA/cm$^2$. In some embodiments, the semiconductor substrate is etched under an alternating current at the current density.

In some embodiments, the working electrode is an anode during the etching. In some embodiments, the method further comprises annealing the semiconductor substrate subsequent to (b). In some embodiments, the method further comprises, prior to (b), heating the etching solution to a temperature that is greater than 25° C. In some embodiments, the semiconductor substrate is etched in the absence of (or without the aid of) a metal catalyst.

In some embodiments, the pattern of holes includes a disordered pattern of holes. In some embodiments, the working electrode does not contact the etching solution.

In some embodiments, the etching solution includes an acid. In some embodiments, the acid is selected from the group consisting of HF, HCl, HBr and HI. In some embodiments, the etching solution includes an alcohol additive. In some embodiments, the etch is performed in the absence of illuminating the semiconductor substrate.

In some embodiments, the ZT is at least 0.5, 0.6, 0.7, 0.8, 0.9, or 1 at 25° C. In some embodiments, the semiconductor substrate comprises silicon.

In another aspect, a method for forming a thermoelectric element having a figure of merit (ZT) that is at least about 0.25, comprises (a) providing a semiconductor substrate in a reaction space comprising an etching solution (e.g., electrolyte); (b) inducing flow of electrical current to the semiconductor substrate at a current density of at least about 0.1 mA/cm$^2$; and (c) using the etching solution to etch the semiconductor substrate under the current density of at least about 0.1 mA/cm$^2$ to form a disordered pattern of holes in the semiconductor substrate, thereby forming the thermoelectric element having the ZT that is at least about 0.25, wherein the etching is performed (i) in the absence of a metal catalyst and (ii) at an electrical potential of at least about 1 volt (V) across the semiconductor substrate and etching solution, and wherein the etching has an etch rate of at least about 1 nanometer (nm) per second at 25° C.

In some embodiments, the electrical potential is an alternating current (AC) voltage. In some embodiments, the electrical potential is a direct current (DC) voltage.

In some embodiments, the etch rate is at least about 10 nm per second. In some embodiments, the etch rate is at least about 100 nm per second. In some embodiments, the etch rate is at least about 1000 nm per second.

In some embodiments, the current density is at least about 1 mA/cm$^2$. In some embodiments, the current density is at least about 10 mA/cm$^2$. In some embodiments, the current density is from about 10 mA/cm$^2$ to 50 mA/cm$^2$, 10 mA/cm$^2$ to 30 mA/cm$^2$, or 10 mA/cm$^2$ to 20 mA/cm$^2$. In some embodiments, the current density is less than or equal to about 100 mA/cm$^2$ or 50 mA/cm$^2$. In some embodiments, the semiconductor substrate is etched under an alternating current at the current density.

In some embodiments, the etching solution includes an acid. In some embodiments, the acid is selected from the group consisting of HF, HCl, HBr and HI. In some embodiments, the etching solution includes an alcohol additive. In some embodiments, the etch is performed in the absence of illuminating the semiconductor substrate.

In some embodiments, the method further comprises annealing the semiconductor substrate subsequent to (c). In some embodiments, the method further comprises, prior to (c), heating the etching solution to a temperature that is greater than 25° C. In some embodiments, the semiconductor substrate comprises silicon.

Another aspect of the present disclosure provides a computer readable medium comprising machine executable code that, upon execution by one or more computer processors, implements any of the methods above or elsewhere herein.

Another aspect of the present disclosure provides a computer control system comprising one or more computer processor and memory coupled thereto. The memory comprises machine executable code that, upon execution by the one or more computer processors, implements any of the methods above or elsewhere herein In another aspect of the present disclosure, a thermoelectric device comprising at least one flexible thermoelectric element including a semiconductor substrate, wherein surfaces of the semiconductor substrate have a metal content less than about 1% as measured by x-ray photoelectron spectroscopy (XPS), wherein the flexible thermoelectric element has a figure of merit (ZT) that is at least about 0.25 at 25° C., and wherein the flexible thermoelectric element has a Young's Modulus that is less than or equal to about $1\times10^6$ pounds per square inch (psi) at 25° C. as measured by static deflection of the thermoelectric element.

In some embodiments, the semiconductor substrate has a surface roughness between about 0.1 nanometers (nm) and 50 nm as measured by transmission electron microscopy (TEM). In some embodiments, the surface roughness is between about 1 nm and 20 nm as measured by TEM. In some embodiments, the surface roughness is between about 1 nm and 10 nm as measured by TEM.

In some embodiments, the metal content is less than or equal to about 0.001% as measured by XPS. In some embodiments, the Young's Modulus is less than or equal to about 800,000 psi at 25° C. In some embodiments, the figure of merit is at least about 0.5, 0.6, 0.7, 0.8, 0.9, or 1.

In some embodiments, the semiconductor substrate is chemically doped n-type or p-type. In some embodiments, the semiconductor substrate comprises silicon.

In some embodiments, the thermoelectric element includes a pattern of holes. In some embodiments, the pattern of holes is polydisperse. In some embodiments, the pattern of holes includes a disordered pattern of holes. In some embodiments, the disordered pattern of holes is polydisperse.

In some embodiments, the thermoelectric element includes a pattern of wires. In some embodiments, the pattern of wires is polydisperse. In some embodiments, the pattern of wires includes a disordered pattern of wires. In some embodiments, the disordered pattern of wires is polydisperse.

Another aspect of the present disclosure provides an electronic device comprising a flexible thermoelectric element including a semiconductor substrate, wherein surfaces of the semiconductor substrate have a metal content less than about 1% as measured by x-ray photoelectron spectroscopy (XPS), wherein the flexible thermoelectric element has a figure of merit (ZT) that is at least about 0.25 at 25° C., and wherein the flexible thermoelectric element bends at an angle of at least about 10° relative to a measurement plane at a plastic deformation that is less than 20% as measured by three-point testing.

In some embodiments, the semiconductor substrate has a surface roughness between about 0.1 nanometers (nm) and 50 nm as measured by transmission electron microscopy (TEM). In some embodiments, the surface roughness is between about 1 nm and 20 nm as measured by TEM. In some embodiments, the surface roughness is between about 1 nm and 10 nm as measured by TEM.

In some embodiments, the metal content is less than or equal to about 0.001% as measured by XPS. In some embodiments, the flexible thermoelectric element bends at an angle of at least about 20° relative to the measurement plane. In some embodiments, the figure of merit is at least about 0.5, 0.6, 0.7, 0.8, 0.9, or 1.

In some embodiments, the electronic device is a watch, a health or fitness tracking device, or a waste heat recovery unit. The electronic device can be part of a larger system including other electronic devices and a control module, for example.

In some embodiments, the semiconductor substrate is chemically doped n-type or p-type. In some embodiments, the semiconductor substrate comprises silicon.

In some embodiments, the electronic device comprises a plurality of thermoelectric elements. Each of the plurality of thermoelectric elements can be as described above or elsewhere herein. In some embodiments, the plurality of thermoelectric elements are oppositely chemically doped n-type and p-type.

In some embodiments, the thermoelectric element includes a pattern of holes. In some embodiments, the pattern of holes is polydisperse. In some embodiments, the pattern of holes includes a disordered pattern of holes. In some embodiments, the disordered pattern of holes is polydisperse.

In some embodiments, the thermoelectric element includes a pattern of wires. In some embodiments, the pattern of wires is polydisperse. In some embodiments, the pattern of wires includes a disordered pattern of wires. In some embodiments, the disordered pattern of wires is polydisperse.

Another aspect of the present disclosure provides a system for generating power, comprising a fluid flow channel for directing a fluid; and a thermoelectric device comprising at least one flexible thermoelectric element adjacent to at least a portion of the fluid flow channel, wherein the flexible thermoelectric element has a Young's Modulus that is less than or equal to about $1 \times 10^6$ pounds per square inch (psi) at 25° C., wherein the flexible thermoelectric element has a first surface that is in thermal communication with the fluid flow channel and a second surface that is in thermal communication with a heat sink, and wherein the thermoelectric device generates power upon the flow of heat from the fluid flow channel through the thermoelectric device to the heat sink.

In some embodiments, the thermoelectric device comprises at least two thermoelectric elements that are oppositely chemically doped n-type and p-type. In some embodiments, the Young's Modulus is less than or equal to about 800,000 psi at 25° C.

In some embodiments, the thermoelectric element comprises a semiconductor material. In some embodiments, the semiconductor material includes silicon.

In some embodiments, the flexible thermoelectric element substantially conforms to a shape of the fluid flow channel. In some embodiments, the fluid flow channel is a pipe. In some embodiments, the fluid flow channel is cylindrical.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "figure" and "FIG." herein), of which:

DETAILED DESCRIPTION

Figure 1:
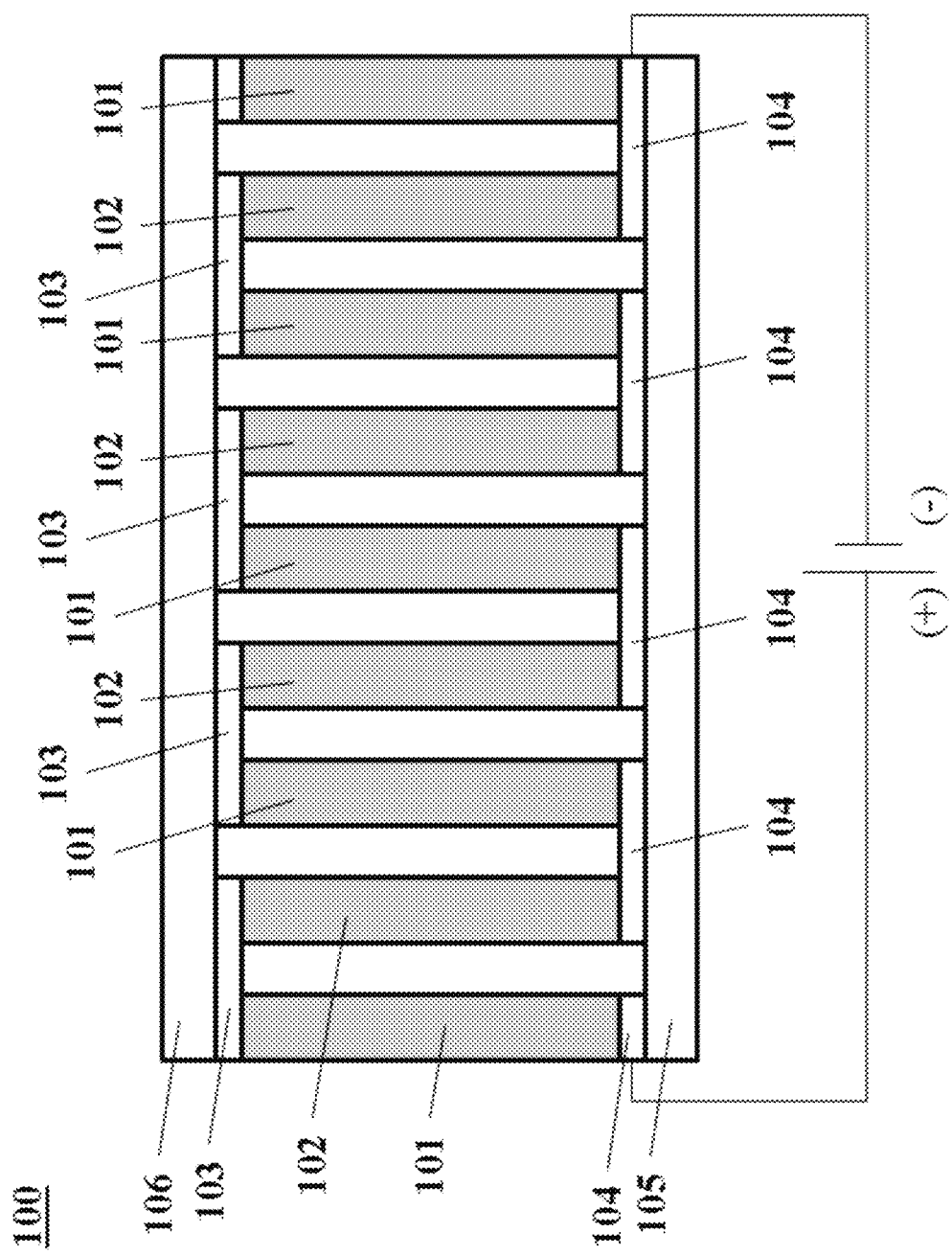
FIG. 1 shows a thermoelectric device having a plurality of elements.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

The term "nanostructure," as used herein, generally refers to structures having a first dimension (e.g., width) along a first axis that is less than about 1 micrometer ("micron") in size. Along a second axis orthogonal to the first axis, such nanostructures can have a second dimension from nanometers or smaller to microns, millimeters or larger. In some cases, the dimension (e.g., width) is less than about 1000 nanometers ("nm"), or 500 nm, or 100 nm, or 50 nm, or smaller. Nanostructures can include holes formed in a substrate material. The holes can form a mesh having an array of holes. In other cases, nanostructure can include rod-like structures, such as wires, cylinders or box-like structure. The rod-like structures can have circular, elliptical, triangular, square, rectangular, pentagonal, hexagonal, heptagonal, octagonal or nonagonal, or other cross-sections.

The term "nanohole," as used herein, generally refers to a hole, filled or unfilled, having a width or diameter less than or equal to about 1000 nanometers ("nm"), or 500 nm, or 100 nm, or 50 nm, or smaller. A nanohole filled with a metallic, semiconductor, or insulating material can be referred to as a "nanoinclusion."

The term "nanowire," as used herein, generally refers to a wire or other elongate structure having a width or diameter that is less than or equal to about 1000 nm, or 500 nm, or 100 nm, or 50 nm, or smaller.

The term "n-type," as used herein, generally refers to a material that is chemically doped ("doped") with an n-type dopant. For instance, silicon can be doped n-type using phosphorous or arsenic.

The term "p-type," as used herein, generally refers to a material that is doped with an p-type dopant. For instance, silicon can be doped p-type using boron or aluminum.

The term "metallic," as used herein, generally refers to a substance exhibiting metallic properties. A metallic material can include one or more elemental metals.

The term "monodisperse," as used herein, generally refers to features having shapes, sizes (e.g., widths, cross-sections, volumes) or distributions (e.g., nearest neighbor spacing, center-to-center spacing) that are similar to one another. In some examples, monodisperse features (e.g., holes, wires) have shapes or sizes that deviate from one another by at most about 20%, 15%, 10%, 5%, 4%, 3%, 2%, 1%, 0.5%, or 0.1%. In some cases, monodisperse features are substantially monodisperse.

The term "etching material," as used herein, generally refers to a material that facilitates the etching of substrate (e.g., semiconductor substrate) adjacent to the etching material. In some examples, an etching material catalyzes the etching of a substrate upon exposure of the etching material to an oxidizing agent and a chemical etchant.

The term "etching layer," as used herein, generally refers to a layer that comprises an etching material. Examples of etching materials include silver, platinum, chromium, molybdenum, tungsten, osmium, iridium, rhodium, ruthenium, palladium, copper, nickel and other metals (e.g., noble metals), or any combination thereof, or any non-noble metal that can catalyze the decomposition of a chemical oxidant, such as, for example, copper, nickel, or combinations thereof.

The term "etch block material," as used herein, generally refers to a material that blocks or otherwise impedes the etching of a substrate adjacent to the etch block material. An etch block material may provide a substrate etch rate that is reduced, or in some cases substantially reduced, in relation to a substrate etch rate associated with an etching material. The term "etch block layer," as used herein, generally refers to a layer that comprises an etch block material. An etch block material can have an etch rate that is lower than that of an etching material.

The term "reaction space," as used herein, generally refers to any environment suitable for the formation of a thermoelectric device or a component of the thermoelectric device. A reaction space can be suitable for the deposition of a material film or thin film adjacent to a substrate, or the measurement of the physical characteristics of the material film or thin film. A reaction space may include a chamber, which may be a chamber in a system having a plurality chambers. The system may include a plurality of fluidically separated (or isolated) chambers. The system may include multiple reactions spaces, with each reaction space being fluidically separated from another reaction space. A reaction space may be suitable for conducting measurements on a substrate or a thin film formed adjacent to the substrate.

The term "current density," as used herein, generally refers to electric (or electrical) current per unit area of cross section, such as the cross section of a substrate. In some examples, current density is electric current per unit area of a surface of a semiconductor substrate.

The term "adjacent" or "adjacent to," as used herein, includes 'next to', 'adjoining', 'in contact with', and 'in proximity to'. In some instances, adjacent components are separated from one another by one or more intervening layers. The one or more intervening layers may have a thickness less than about 10 micrometers ("microns"), 1 micron, 500 nanometers ("nm"), 100 nm, 50 nm, 10 nm, 1 nm, 0.5 nm or less. For example, a first layer adjacent to a second layer can be in direct contact with the second layer. As another example, a first layer adjacent to a second layer can be separated from the second layer by at least a third layer.

Thermoelectric Elements, Devices and Systems

The present disclosure provides thermoelectric elements, devices and systems that can be employed for use in various applications, such as heating and/or cooling applications, power generation, consumer applications and industrial applications. In some examples, thermoelectric materials are used in consumer electronic devices (e.g., smart watches, portable electronic devices, and health/fitness tracking devices). As another example, a thermoelectric material of the present disclosure can be used in an industrial setting, such as at a location where there is heat loss. In such a case, heat can be captured by a thermoelectric device and used to generate power.

Thermoelectric devices of the present disclosure can be used to generate power upon the application of a temperature gradient across such devices. Such power can be used to provide electrical energy to various types of devices, such as consumer electronic devices.

Thermoelectric devices of the present disclosure can have various non-limiting advantages and benefits. In some cases, thermoelectric devices can have substantially high aspect ratios, uniformity of holes or wires, and figure-of-merit, ZT, which can be suitable for optimum thermoelectric device performance. With respect to the figure-of-merit, Z can be an indicator of coefficient-of-performance (COP) and the efficiency of a thermoelectric device, and T can be an average temperature of the hot and the cold sides of the thermoelectric device. In some embodiments, the figure-of-merit (ZT) of a thermoelectric element or thermoelectric device is at least about 0.01, 0.02, 0.03, 0.04, 0.05, 0.06, 0.07, 0.08, 0.09, 0.1, 0.15, 0.2, 0.25, 0.3, 0.35, 0.4, 0.45 0.5, 0.55, 0.6, 0.65, 0.7, 0.75, 0.8, 0.85, 0.9, 0.95, 1.0, 1.1, 1.2, 1.3, 1.4, 1.5, 1.6, 1.7, 1.8, 1.9, 2.0, 2.1, 2.2, 2.3, 2.4, 2.5, 2.6, 2.7, 2.8, 2.9, or 3.0 at 25° C. In some case, the figure-of-merit is from about 0.01 to 3, 0.1 to 2.5, 0.5 to 2.0 or 0.5 to 1.5 at 25° C.

The figure of merit (ZT) can be a function of temperature. In some cases, ZT increases with temperature. For example, a thermoelectric having a ZT of 0.5 at 25° C. can have a greater ZT at 100° C.

Thermoelectric devices of the present disclosure can have electrodes each comprising an array of nano structures (e.g., holes or wires). The array of nano structures can include a plurality of holes or elongate structures, such as wires (e.g., nanowires). The holes or wires can be ordered and have uniform sizes and distributions. As an alternative, the holes or wires may not be ordered and may not have a uniform distribution. In some examples, there is no long range order with respect to the holes or wires. In some cases, the holes or wires may intersect each other in random directions. Methods for forming patterned or disordered patterns of nano structures (e.g., holes or wires) are provided elsewhere herein.

The present disclosure provides thermoelectric elements that are flexible or substantially flexible. A flexible material can be a material that can be conformed to a shape, twisted, or bent without experiencing plastic deformation. This can enable thermoelectric elements to be used in various settings, such as settings in which contact area with a heat source or heat sink is important. For example, a flexible thermoelectric element can be brought in efficient contact with a heat source or heat sink, such as by wrapping the thermoelectric element around the heat source or heat sink.

A thermoelectric device can include one or more thermoelectric elements. The thermoelectric elements can be flexible. An individual thermoelectric element can include at least one semiconductor substrate which can be flexible. In some cases, individual semiconductor substrates of a thermoelectric element are rigid but substantially thin (e.g., 500 nm to 1 mm or 1 micrometer to 0.5 mm) such that they provide a flexible thermoelectric element when disposed adjacent one another. Similarly, individual thermoelectric elements of a thermoelectric device can be rigid but substantially thin such that they provide a flexible thermoelectric device when disposed adjacent one another.

FIG. 1 shows a thermoelectric device 100, in accordance with some embodiments of the present disclosure. The thermoelectric device 100 includes n-type 101 and p-type 102 elements disposed between a first set of electrodes 103 and a second set of electrodes 104 of the thermoelectric device 100. The first set of electrodes 103 connects adjacent n-type 101 and p-type elements, as illustrated.

The electrodes 103 and 104 are in contact with a hot side material 105 and a cold side material 106 respectively. In some embodiments, the hot side material 105 and cold side material 106 are electrically insulating but thermally conductive. The application of an electrical potential to the electrodes 103 and 104 leads to the flow of current, which generates a temperature gradient ($\Delta T$) across the thermoelectric device 100. The temperature gradient ($\Delta T$) extends from a first temperature (average), T1, at the hot side material 105 to a second temperature (average), T2, at the cold side material 106, where T1>T2. The temperature gradient can be used for heating and cooling purposes.

The n-type 101 and p-type 102 elements of the thermoelectric device 100 can be formed of structures having dimensions from nanometers to micrometers, such as, e.g., nanostructures. In some situations, the nanostructures are holes or inclusions, which can be provided in an array of holes (i.e., mesh). In other situations, the nanostructures are rod-like structures, such as nanowires. In some cases, the rod-like structures are laterally separated from one another.

In some cases, the n-type 101 and/or p-type 102 elements are formed of an array of wires or holes oriented along the direction of the temperature gradient. That is, the wires extend from the first set of electrodes 103 to the second set of electrodes 104. In other cases, the n-type 101 and/or p-type 102 elements are formed of an array of holes oriented along a direction that is angled between about 0° and 90° in relation to the temperature gradient. In an example, the array of holes is orthogonal to the temperature gradient. The holes or wires, in some cases, have dimensions on the order of nanometers to micrometers. In some cases, holes can define a nanomesh.

Figure 2:
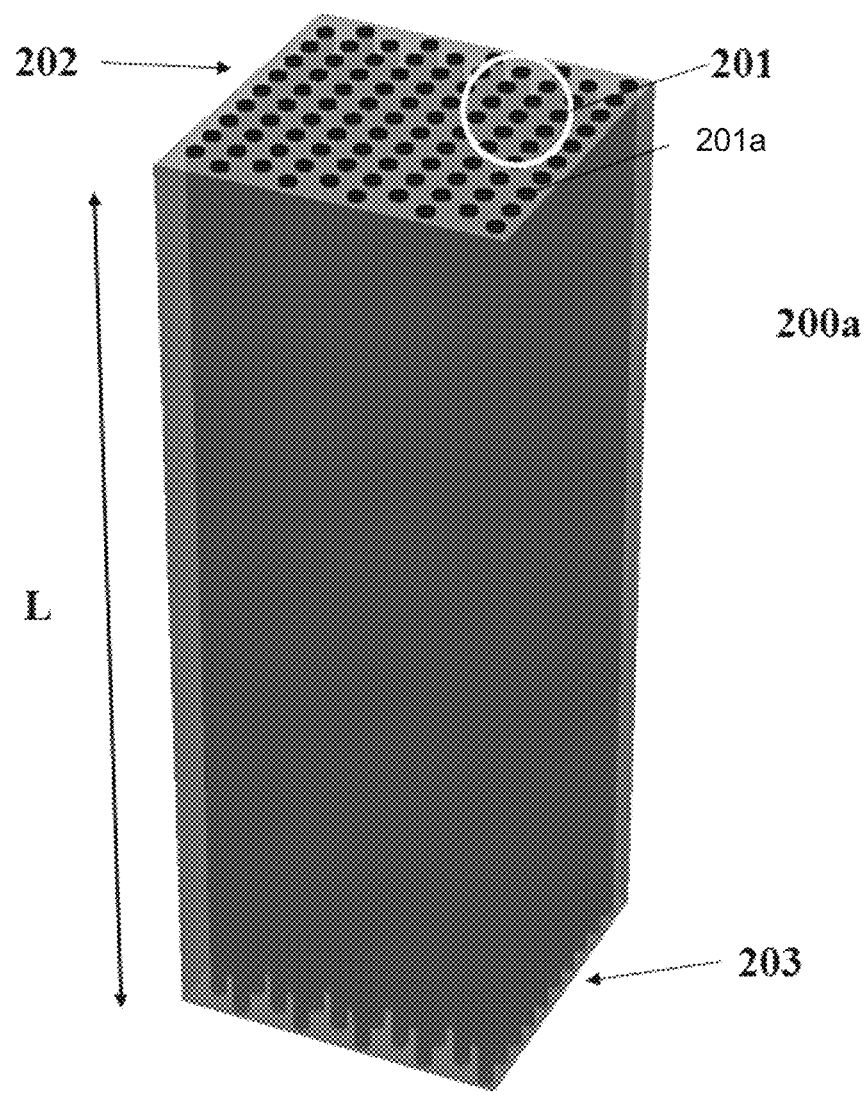
FIG. 2 is a schematic perspective view of a thermoelectric element, in accordance with an embodiment of the present disclosure.
Figure 3:
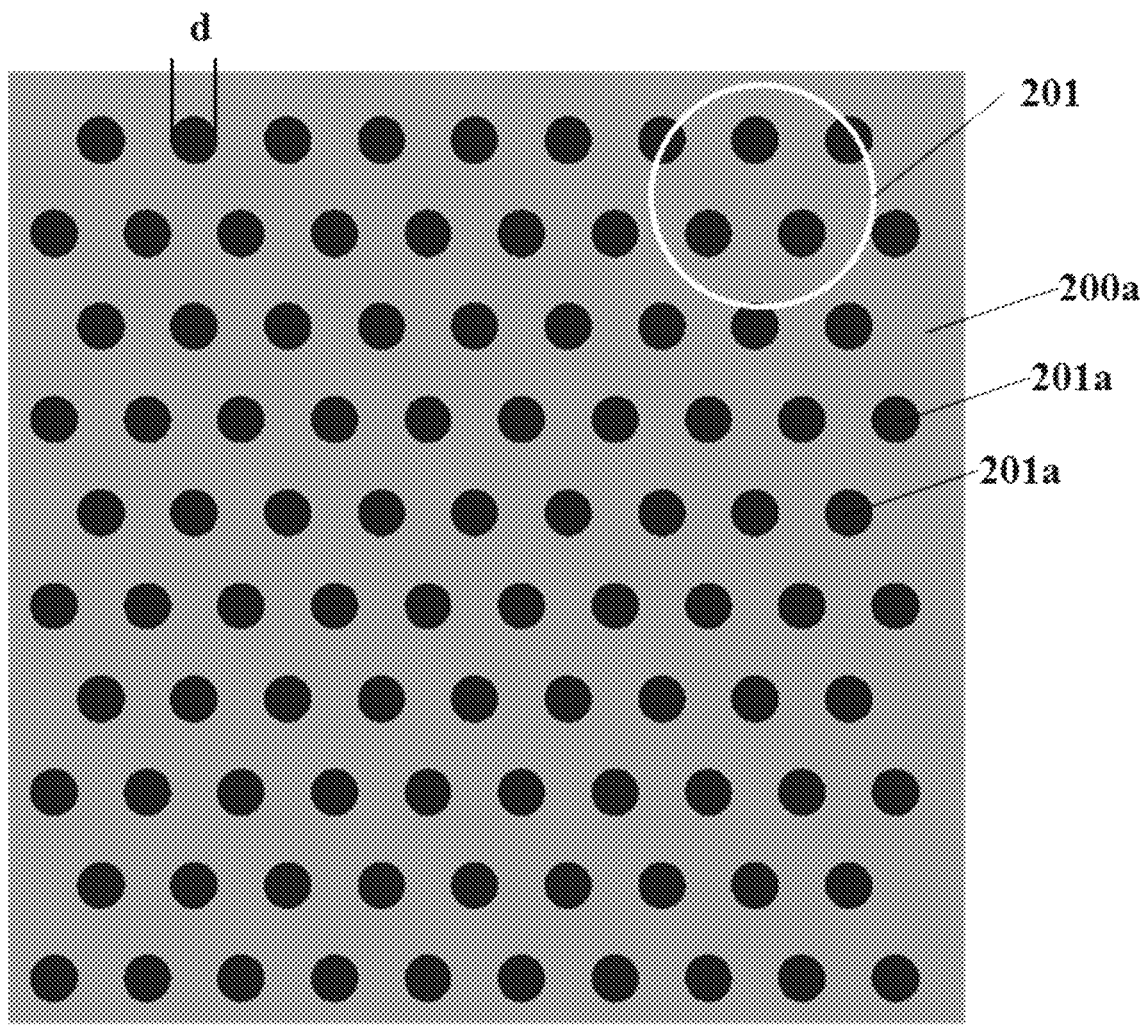
FIG. 3 is a schematic top view of the thermoelectric element of FIG. 2, in accordance with an embodiment of the present disclosure.
Figure 4:
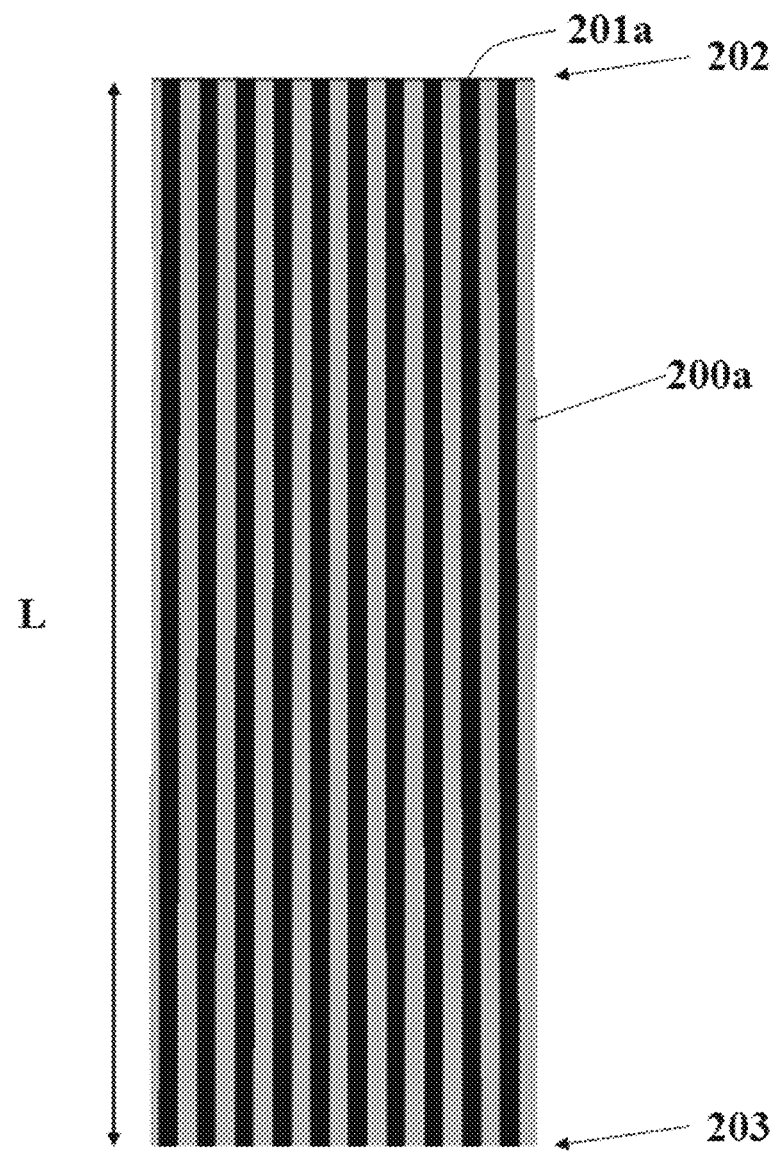
FIG. 4 is a schematic side view of the thermoelectric element of FIGS. 2 and 3, in accordance with an embodiment of the present disclosure.

FIG. 2 is a schematic perspective view of a thermoelectric element 200 having an array of holes 201 (select holes circled), in accordance with an embodiment of the present disclosure. The array of holes can be referred to as a "nanomesh" herein. FIGS. 3 and 4 are perspective top and side views of the thermoelectric element 200. The element 200 can be an n-type or p-type element, as described elsewhere herein. The array of holes 201 includes individual holes 201a that can have widths from several nanometers or less up to microns, millimeters or more. In some embodiments, the holes have widths (or diameters, if circular) ("d") between about 1 nm and 500 nm, or 5 nm and 100 nm, or 10 nm and 30 nm. The holes can have lengths ("L") from about several nanometers or less up to microns, millimeters or more. In some embodiments, the holes have lengths between about 0.5 microns and 1 centimeter, or 1 micron and 500 millimeters, or 10 microns and 1 millimeter.

The holes 201a are formed in a substrate 200a. In some cases, the substrate 200a is a solid state material, such as e.g., carbon (e.g., graphite or graphene), silicon, germanium, gallium arsenide, aluminum gallium arsenide, silicides, silicon germanium, bismuth telluride, lead telluride, oxides (e.g., $SiO_x$, where 'x' is a number greater than zero), gallium nitride and tellurium silver germanium antimony (TAGS) containing alloys. For example, the substrate 200a can be a Group IV material (e.g., silicon or germanium) or a Group III-V material (e.g., gallium arsenide). The substrate 200a may be formed of a semiconductor material comprising one or more semiconductors. The semiconductor material can be doped n-type or p-type for n-type or p-type elements, respectively.

In some cases, the holes 201a are filled with a gas, such as He, Ne, Ar, $N_2$, $H_2$, $CO_2$, $O_2$, or a combination thereof. In other cases, the holes 201a are under vacuum. Alternatively, the holes may be filled (e.g., partially filled or completely filled) with a semiconductor material, an insulating (or dielectric) material, or a gas (e.g., He, Ar, $H_2$, $N_2$, $CO_2$).

A first end 202 and second end 203 of the element 200 can be in contact with a substrate having a semiconductor-containing material, such as silicon or a silicide. The substrate can aid in providing an electrical contact to an electrode on each end 202 and 203. Alternatively, the substrate can be precluded, and the first end 202 and second end 203 can be in contact with a first electrode (not shown) and a second electrode (not shown), respectively.

In some embodiments, the holes 201a are substantially monodisperse. Monodisperse holes may have substantially the same size, shape and/or distribution (e.g., cross-sectional distribution). In other embodiments, the holes 201a are distributed in domains of holes of various sizes, such that the holes 201a are not necessarily monodisperse. For example, the holes 201a may be polydisperse. Polydisperse holes can have shapes, sizes and/or orientations that deviate from one another by at least about 0.1%, 0.5%, 1%, 2%, 3%, 4%, 5%, 10%, 15%, 20%, 30%, 40%, or 50%. In some situations, the device 200 includes a first set of holes with a first diameter and a second set of holes with a second diameter. The first diameter is larger than the second diameter. In other cases, the device 200 includes two or more sets of holes with different diameters.

The holes 201a can have various packing arrangements. In some cases, the holes 201a, when viewed from the top (see FIG. 3), have a hexagonal close-packing arrangement.

In some embodiments, the holes 201a in the array of holes 201 have a center-to-center spacing between about 1 nm and 500 nm, or 5 nm and 100 nm, or 10 nm and 30 nm. In some cases, the center-to-center spacing is the same, which may be the case for monodisperse holes 201a. In other cases, the center-to-center spacing can be different for groups of holes with various diameters and/or arrangements.

The dimensions (lengths, widths) and packing arrangement of the holes 201, and the material and doping configuration (e.g., doping concentration) of the element 200 can be selected to effect a predetermined electrical conductivity and thermal conductivity of the element 200, and a thermoelectric device having the element 200. For instance, the diameters and packing configuration of the holes 201 can be selected to minimize the thermal conductivity, and the doping concentration can be selected to maximize the electrical conductivity of the element 200.

The doping concentration of the substrate 200a can be at least about $10^{18}$ cm$^{-3}$, $10^{19}$ cm$^{-3}$, $10^{20}$ cm$^{-3}$, or $10^{21}$ cm$^{-3}$. In some examples, the doping concentration is from about $10^{18}$ to $10^{21}$ cm$^{-3}$, or $10^{19}$ to $10^{20}$ cm$^{-3}$. The doping concentration can be selected to provide a resistivity that is suitable for use as a thermoelectric element. The resistivity of the substrate 200a can be at least about 0.001 ohm-cm, 0.01 ohm-cm, or 0.1 ohm-cm, and in some cases less than or equal to about 1 ohm-cm, 0.5 ohm-cm, 0.1 ohm-cm. In some examples, the resistivity of the substrate 200a is from about 0.001 ohm-cm to 1 ohm-cm, 0.001 ohm-cm to 0.5 ohm-cm, or 0.001 ohm-cm to 0.1 ohm-cm.

The array of holes 201 can have an aspect ratio (e.g., the length of the element 200 divided by width of an individual hole 201a) of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more.

The holes 201 can be ordered and have uniform sizes and distributions. As an alternative, the holes 201 may not be ordered and may not have a uniform distribution. For example, the holes 201 can be disordered such that there is no long range order for the pattern of holes 201.

In some embodiments, thermoelectric elements can include an array of wires. The array of wires can include individual wires that are, for example, rod-like structures.

As an alternative to the array of holes of the element 200, the holes may not be ordered and may not have a uniform distribution. In some examples, there is no long range order with respect to the holes. In some cases, the holes may intersect each other in random directions. The holes may include intersecting holes, such as secondary holes that project from the holes in various directions. The secondary holes may have additional secondary holes. The holes may have various sizes and may be aligned along various directions, which may be random and not uniform.

Figure 5:
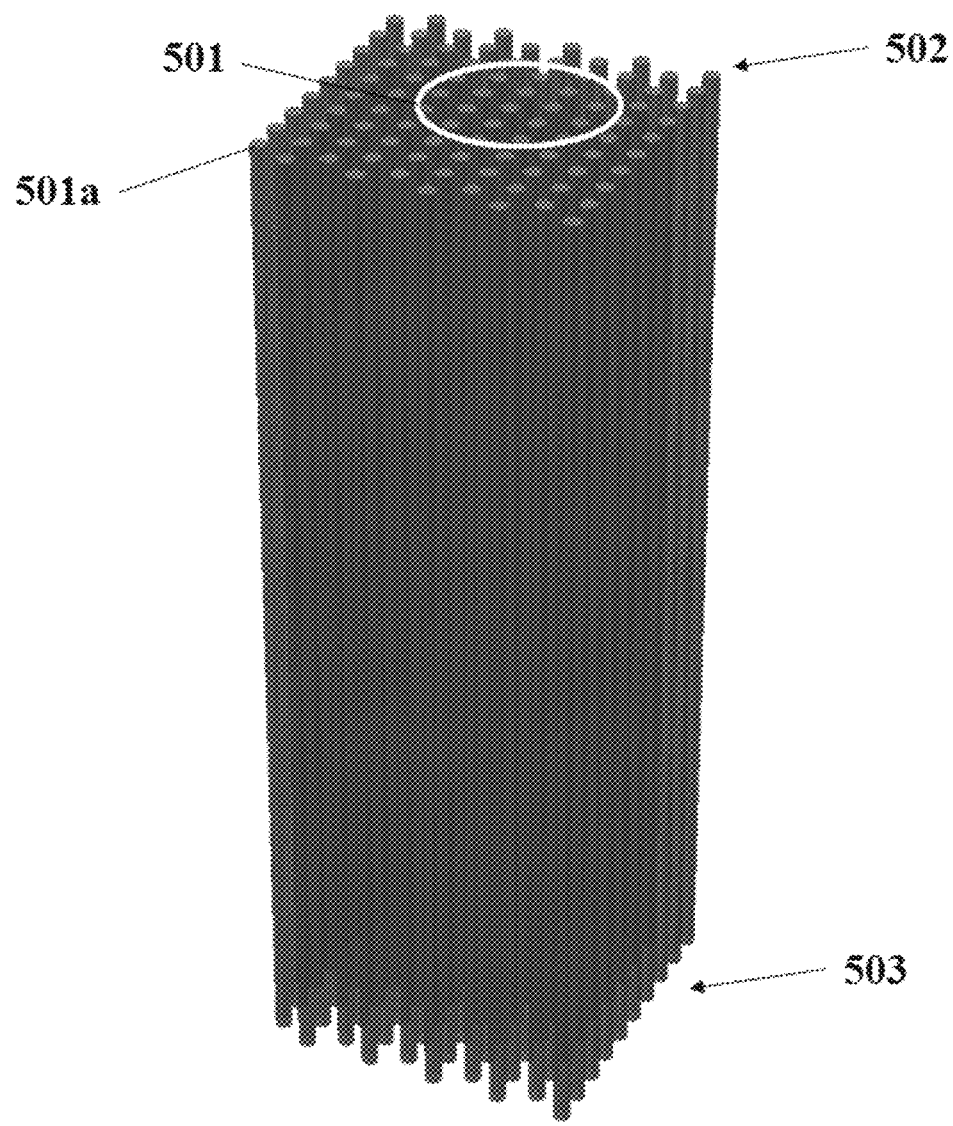
FIG. 5 is a schematic perspective top view of a thermoelectric element, in accordance with an embodiment of the present disclosure.
Figure 6:
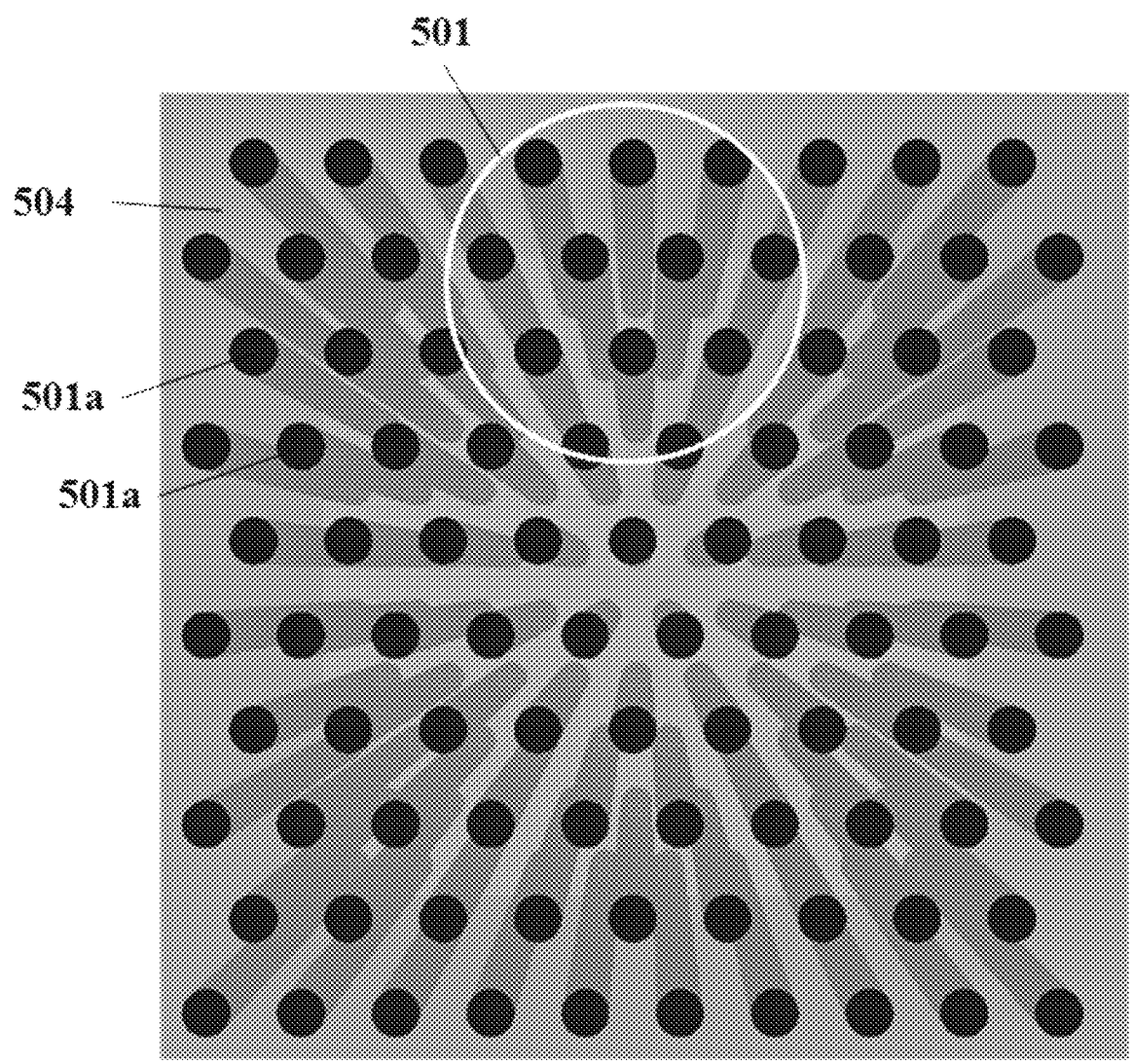
FIG. 6 is a schematic perspective top view of the thermoelectric element of FIG. 5, in accordance with an embodiment of the present disclosure.

FIG. 5 is a schematic perspective top view of a thermoelectric element 500, in accordance with an embodiment of the present disclosure. FIG. 6 is a schematic perspective top view of the thermoelectric element 500. The thermoelectric element 500 may be used with devices, systems and methods provided herein. The element 500 includes an array of wires 501 having individual wires 501a. In some embodiments, the wires have widths (or diameters, if circular) ("d") between about 1 nm and 500 nm, or 5 nm and 100 nm, or 10 nm and 30 nm. The wires can have lengths ("L") from about several nanometers or less up to microns, millimeters or more. In some embodiments, the wires have lengths between about 0.5 microns and 1 centimeter, or 1 micron and 500 millimeters, or 10 microns and 1 millimeter.

In some embodiments, the wires 501a are substantially monodisperse. Monodisperse wires may have substantially the same size, shape and/or distribution (e.g., cross-sectional distribution). In other embodiments, the wires 501a are distributed in domains of wires of various sizes, such that the wires 501a are not necessarily monodisperse. For example, the wires 501a may be polydisperse. Polydisperse wires can have shapes, sizes and/or orientations that deviate from one another by at least about 0.1%, 0.5%, 1%, 2%, 3%, 4%, 5%, 10%, 15%, 20%, 30%, 40%, or 50%.

In some embodiments, the wires 501a in the array of wires 501 have a center-to-center spacing between about 1 nm and 500 nm, or 5 nm and 100 nm, or 10 nm and 30 nm. In some cases, the center-to-center spacing is the same, which may be the case for monodisperse wires 501. In other cases, the center-to-center spacing can be different for groups of wires with various diameters and/or arrangements.

In some embodiments, the wires 501a are formed of a solid state material, such as a semiconductor material, such as, e.g., silicon, germanium, gallium arsenide, aluminum gallium arsenide, silicide alloys, alloys of silicon germanium, bismuth telluride, lead telluride, oxides (e.g., $SiO_x$, where 'x' is a number greater than zero), gallium nitride and tellurium silver germanium antimony (TAGS) containing alloys. The wires 501a can be formed of other materials disclosed herein. The wires 501a can be doped with an n-type dopant or a p-type dopant. The doping concentration of the semiconductor material can be at least about $10^{18}$ cm$^{-3}$, $10^{19}$ cm$^{-3}$, $10^{20}$ cm$^{-3}$, or $10^{21}$ cm$^{-3}$. In some examples, the doping concentration is from about $10^{18}$ to $10^{21}$ cm$^{-3}$, or $10^{19}$ to $10^{20}$ cm$^{-3}$. The doping concentration of the semiconductor material can be selected to provide a resistivity that is suitable for use as a thermoelectric element. The resistivity of the semiconductor material can be at least about 0.001 ohm-cm, 0.01 ohm-cm, or 0.1 ohm-cm, and in some cases less than or equal to about 1 ohm-cm, 0.5 ohm-cm, 0.1 ohm-cm. In some examples, the resistivity of the semiconductor material is from about 0.001 ohm-cm to 1 ohm-cm, 0.001 ohm-cm to 0.5 ohm-cm, or 0.001 ohm-cm to 0.1 ohm-cm.

In some embodiments, the wires 501a are attached to semiconductor substrates at a first end 502 and second end 503 of the element 500. The semiconductor substrates can have the n-type or p-type doping configuration of the individual wires 501a. In other embodiments, the wires 501a at the first end 502 and second end 503 are not attached to semiconductor substrates, but can be attached to electrodes. For instance, a first electrode (not shown) can be in electrical contact with the first end 502 and a second electrode can be electrical contact with the second end 503.

With reference to FIG. 6, space 504 between the wires 501a may be filled with a vacuum or various materials. In some embodiments, the wires are laterally separated from one another by an electrically insulating material, such as a silicon dioxide, germanium dioxide, gallium arsenic oxide, spin on glass, and other insulators deposited using, for example, vapor phase deposition, such as chemical vapor deposition or atomic layer deposition. In other embodiments, the wires are laterally separated from one another by vacuum or a gas, such as He, Ne, Ar, $N_2$, $H_2$, $CO_2$, $O_2$, or a combination thereof.

The array of wires 501 can have an aspect ratio—length of the element 500 divided by width of an individual wire 501a—of at least about 1.5:1, or 2:1, or 5:1, or 10:1, or 20:1, or 50:1, or 100:1, or 1000:1, or 5,000:1, or 10,000:1, or 100,000:1, or 1,000,000:1, or 10,000,000:1, or 100,000,000:1, or more. In some cases, the length of the element 500 and the length of an individual wire 501a are substantially the same.

Thermoelectric elements provided herein can be incorporated in thermoelectric devices for use in cooling and/or heating and, in some cases, power generation. In some examples, the device 100 may be used as a power generation device. In an example, the device 100 is used for power generation by providing a temperature gradient across the electrodes and the thermoelectric elements of the device 100.

As an alternative to the array of wires of the element 500, the wires may not be ordered and may not have a uniform distribution. In some examples, there is no long range order with respect to the wires. In some cases, the wires may intersect each other in random directions. The wires may have various sizes and may be aligned along various directions, which may be random and not uniform.

Figure 7:
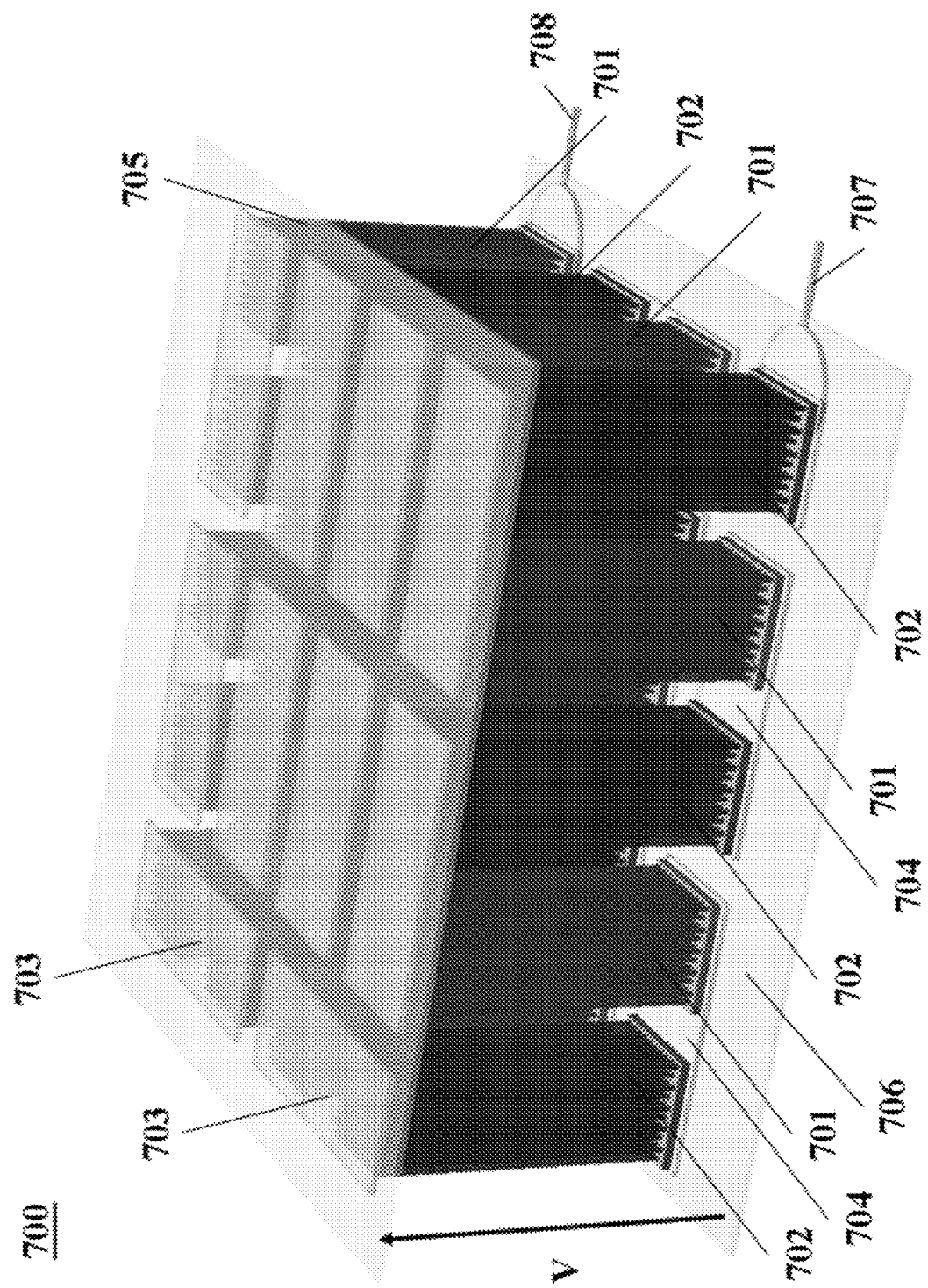
FIG. 7 is a schematic perspective view of a thermoelectric device comprising elements having an array of wires, in accordance with an embodiment of the present disclosure.

FIG. 7 shows a thermoelectric device 700 having n-type elements 701 and p-type elements 702, in accordance with an embodiment of the present disclosure. The n-type elements 701 and p-type elements 702 each include an array of wires, such as nanowires. An array of wires can include a plurality of wires. The n-type elements 701 include n-type (or n-doped) wires and the p-type elements 702 include p-type wires. The wires can be nanowires or other rod-like structures.

Adjacent n-type elements 701 and p-type elements 702 are electrically connected to one another at their ends using electrodes 703 and 704. The device 700 includes a first thermally conductive, electrically insulating layer 705 and a second thermally conductive, electrically insulating layer 706 at opposite ends of the elements 701 and 702.

The device 700 includes terminals 707 and 708 that are in electrical communication with the electrodes 703 and 704. The application of an electrical potential across the terminals 707 and 708 generates a flow of electrons and holes in the n-type and p-type elements 701 and 702, respectively, which generates a temperature gradient across the elements 701 and 702. The first thermally conductive, electrically insulating layer 705 is a cold side of the device 700; the second thermally conductive, electrically insulating layer 706 is a hot side of the device 700. The cold side is cooler (i.e., has a lower operating temperature) than the hot side.

Figure 8:
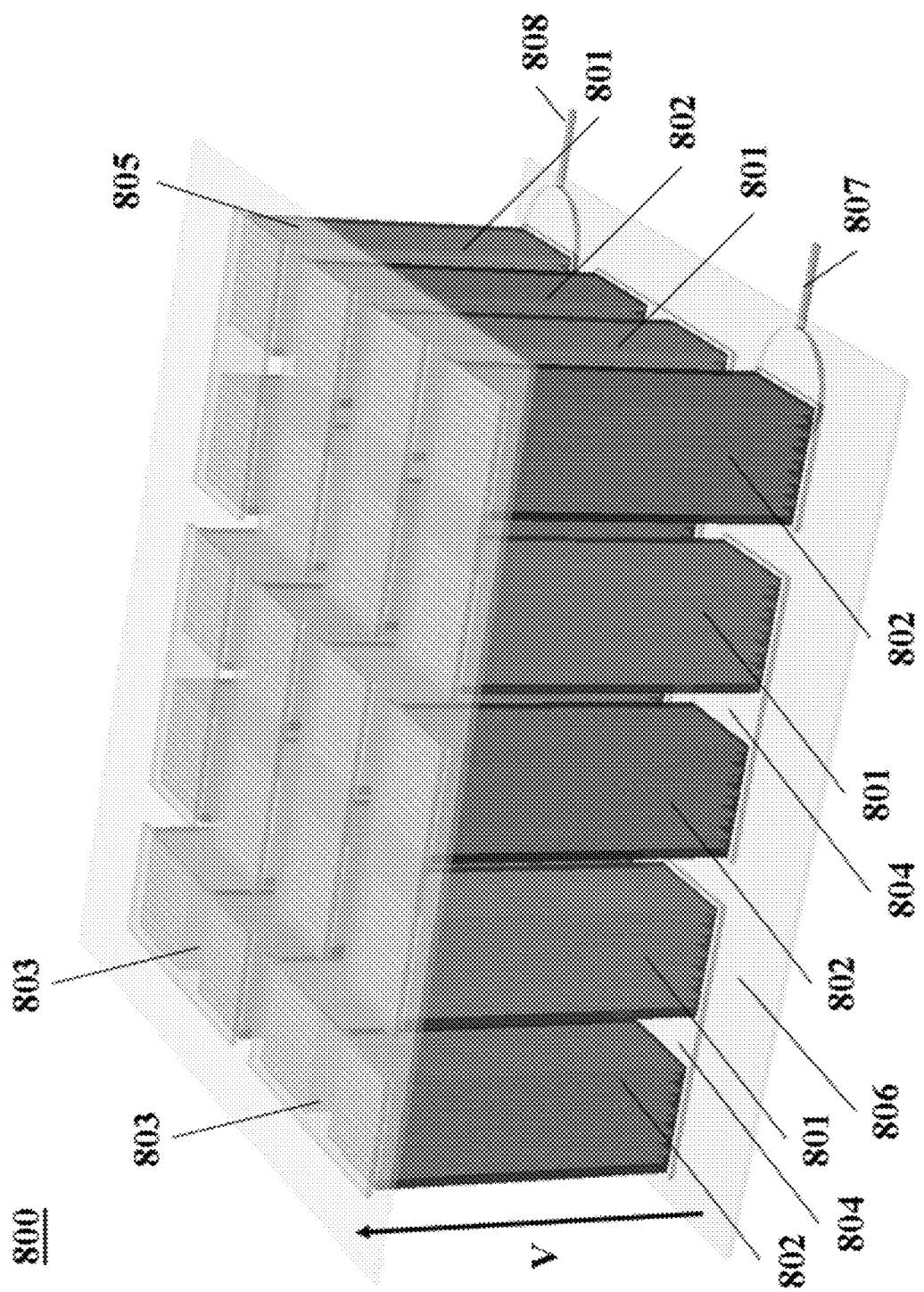
FIG. 8 is a schematic perspective view of a thermoelectric device comprising elements having an array of holes, in accordance with an embodiment of the present disclosure.

FIG. 8 shows a thermoelectric device 800 having n-type elements 801 and p-type elements 802, in accordance with an embodiment of the present disclosure. The n-type elements 801 and p-type elements 802 are formed in n-type and p-type semiconductor substrates, respectively. Each substrate can include an array of holes, such as nanoholes. The array of holes can include a plurality of holes. An individual hole can span the length of an n-type or p-type element. The holes can be monodisperse, in which case hole dimensions and center-to-center spacing may be substantially constant. In some cases, the array of holes includes holes with center-to-center spacing and hole dimensions (e.g., widths or diameters) that may be different. In such a case, the holes may not be monodisperse.

Select n-type elements 801 and p-type elements 802 are electrically connected to one another at their ends by electrodes 803 and 804. The device 800 includes a first thermally conductive, electrically insulating layer ("first layer") 805 and a second thermally conductive, electrically insulating layer ("second layer") 806 at opposite ends of the elements 801 and 802.

The device 800 includes terminals 807 and 808 that are in electrical communication with the electrodes 803 and 804. The application of an electrical potential across the terminals 807 and 808 generates the flow of electrons and holes in the n-type and p-type elements 801 and 802, respectively, which generates a temperature gradient across the elements 801 and 802. The first thermally conductive, electrically insulating layer 805 is a cold side of the device 800; the second thermally conductive, electrically insulating layer 806 is a hot side of the device 800. The cold side is cooler (i.e., has a lower operating temperature) than the hot side.

The thermoelectric device 800 has a temperature gradient from the second thermally conductive, electrically insulating layer 806 to the first thermally conductive, electrically insulating layer 805. In some cases, the holes are disposed parallel to a vector oriented from the first layer 805 to the second layer 806. In other cases, the holes are disposed at an angle greater than 0° in relation to the vector. For instance, the holes can be disposed at an angle of at least about 1°, 10°, 20°, 30°, 40°, 50°, 60°, 70°, 80°, or 90° in relation to the vector.

Figure 9:
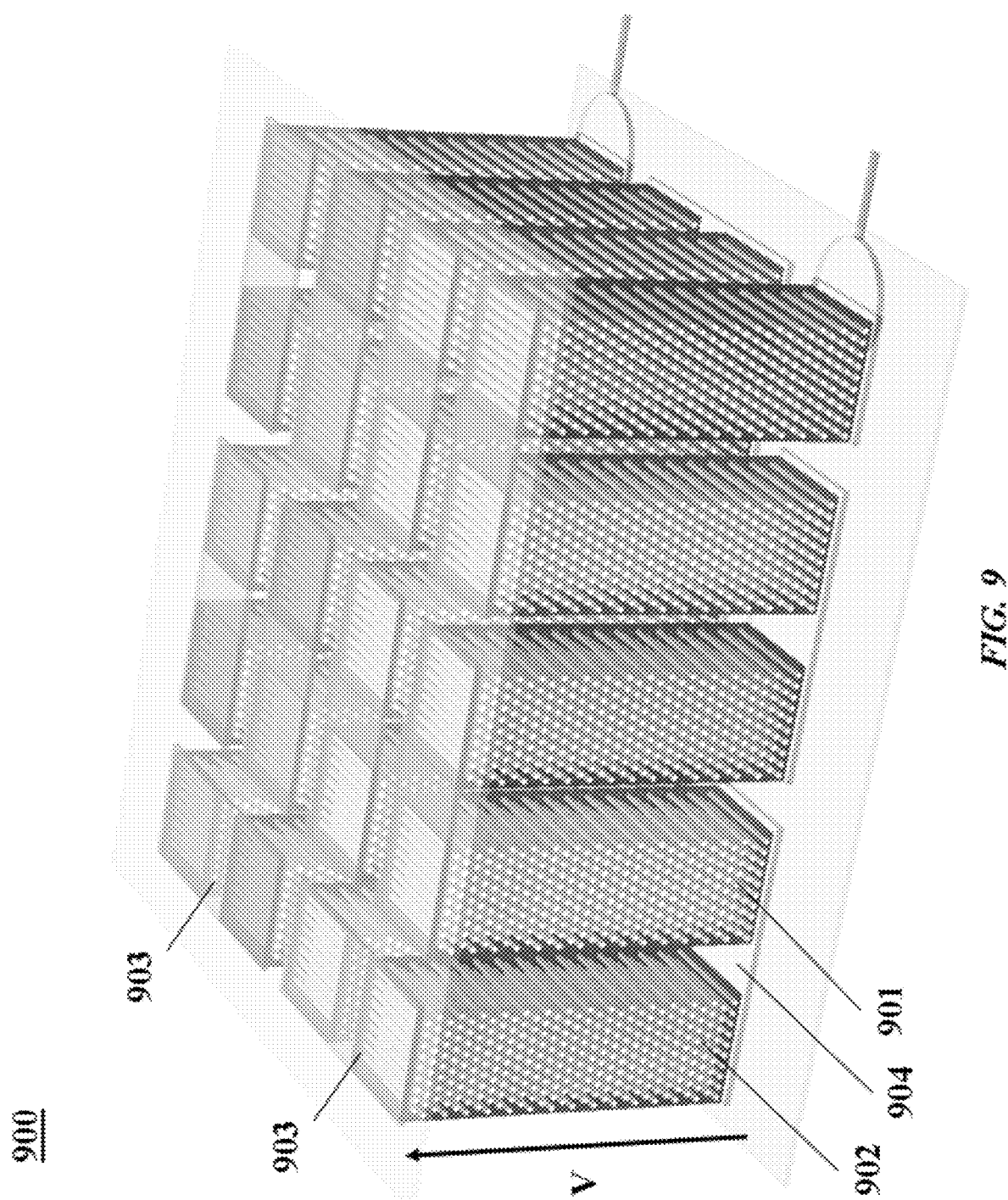
FIG. 9 is a schematic perspective view of a thermoelectric device comprising elements having an array of holes that are oriented perpendicularly with respect to the vector V, in accordance with an embodiment of the present disclosure.

FIG. 9 shows a thermoelectric device 900 having n-type elements 901 and p-type elements 902, with the elements having holes formed in substrates of the n-type and p-type elements. The holes are oriented perpendicular to a vector ("V") orthogonal to the electrodes 903 and 904 of the device 900.

Wires or holes of thermoelectric elements provided herein may be formed in a substrate and oriented substantially anti-parallel to a support structure, such as an electrode. In some examples, the wires or holes are oriented at an angle greater than 0°, or 10°, or 20°, or 30°, or 40°, or 50°, or 60°, or 70°, or 80°, or 85° in relation to the support structure. In an example, the wires or holes are oriented at an angle of about 90° in relation to the support structure. The electrode may be an electrode of a thermoelectric device. In some cases, wires or holes may be oriented substantially parallel to the electrode.

As an alternative to the devices of FIGS. 7-9, a thermoelectric device can have a thermoelectric element with an array of holes or wires with individual holes or wires that may have different sizes and/or distributions. An array of holes or wires may not be ordered and may not have a uniform distribution. In some examples, there is no long range order with respect to the holes or wires. In some cases, the holes or wires may intersect each other in random directions. The holes or wires may include intersecting holes or wires, such as secondary holes or wires that project from other holes or wires in various directions. The holes or wires may have various sizes and may be aligned along various directions, which may be random and not uniform. As another alternative, a thermoelectric device can include at least one thermoelectric element (p or n-type) with an order array of holes or wires, and at least one thermoelectric element (p or n-type) with a disordered array of holes or wires. The disordered array of holes or wires may include holes or wires that are not ordered and do not have a uniform distribution.

A hole or wire of the disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Methods for Forming Thermoelectric Elements

The present disclosure provides various methods for forming thermoelectric elements. A thermoelectric element can be formed using electrochemical etching. In some cases, a thermoelectric element is formed by cathodic or anodic etching, in some cases without the use of a catalyst. A thermoelectric element can be formed without use of a metallic catalysis. A thermoelectric element can be formed without providing a metallic coating on a surface of a substrate to be etched. This can also be performed using purely electrochemical anodic etching and suitable etch solutions and electrolytes. As an alternative, a thermoelectric can be formed using metal catalyzed electrochemical etching in suitable etch solutions and electrolytes, as described in, for example, PCT/US2012/047021, filed Jul. 17, 2012, PCT/US2013/021900, filed Jan. 17, 2013, PCT/US2013/055462, filed Aug. 16, 2013, PCT/US2013/067346, filed Oct. 29, 2013, each of which is entirely incorporated herein by reference.

Recognized herein are various benefits to not using catalysts to form thermoelectric elements. In an example, a non-metal catalyzed etch can preclude the need for metal (or metallic) catalysts, which can provide for fewer processing steps, including cleanup steps to remove the metal catalysts from the thermoelectric element after etching. This can also provide for reduced manufacturing cost, as metal catalysts can be expensive. Metal catalysts can include rare and/or expensive metallic materials (e.g., gold, silver, platinum, or palladium), and eliminating the use of a metallic catalyst can advantageously decrease the cost of forming thermoelectric elements. Additionally, the non-catalyzed process can be more reproducible and controllable. In some cases, the non-catalyzed process described herein can be scaled from a relatively small production scale of thermoelectric elements to a relatively larger production scale of thermoelectric elements.

The present disclosure provides methods for forming thermoelectric materials for use in various applications, such as consumer and industrial applications. In some examples, thermoelectric materials are used in consumer electronic devices (e.g., smart watches, portable electronic devices, and health/fitness tracking devices). As another example, a thermoelectric material of the present disclosure can be used in an industrial setting, such as at a location where there is heat loss, which heat can be captured and used to generate power.

The present disclosure provides methods for forming flexible or substantially flexible thermoelectric materials. A flexible material can be a material that bends at an angle of least about 1°, 5°, 10°, 15°, 20°, 25°, 30°, 35°, 40°, 45°, 50°, 60°, 70°, 80°, 90°, 100°, 120°, 130°, 140°, 150°, 160°, 170°, or 180° relative to a measurement plane without experiencing plastic deformation or breaking. The flexible material can bend under an applied force over a given area of the flexible material (i.e. pressure). Plastic deformation can be measured by, for example, three-point testing (e.g., instron extension) or tensile testing. As an alternative or in addition to, the flexible material can be a material that bends at an angle of least about 1°, 5°, 10°, 15°, 20°, 25°, 30°, 35°, 40°, 45°, 50°, 60°, 70°, 80°, 90°, 100°, 120°, 130°, 140°, 150°, 160°, 170°, or 180° relative to a measurement plane at a plastic deformation that is less than or equal to about 20%, 15%, 10%, 5%, 1%, or 0.1% as measured by three-point testing (e.g., instron extension) or tensile testing. A flexible material can be a substantially pliable material. A flexible material can be a material that can conform or mold to a surface. Such materials can be employed for use in various settings, such as consumer and industrial settings. Thermoelectric elements formed according to methods herein can be formed into various shapes and configurations. Such shapes can be changed as desired by a user, such as to conform to a given object. The thermoelectric elements can have a first shape, and after being formed into a shape or configuration the thermoelectric elements can have a second shape. The thermoelectric elements can be transformed from the second shape to the initial shape.

In an aspect of the present disclosure, a thermoelectric device (or material) is formed using anodic etching. Anodic etching can be performed in an electrochemical etch cell that provides electrical connections to the substrate being etched, one or more reservoirs to hold the etch solutions or electrolytes in contact with the substrate, and access for analytical measurements or monitoring of the etching process. The etch solutions and/or electrolytes can comprise an aqueous solution. The etch (or etching) solutions and/or electrolytes can be a basic, neutral, or acidic solution. Examples of etching solutions include acids, such as hydrofluoric acid (HF), hydrochloric acid (HCl), hydrogen bromide (HBr), hydrogen iodide (HI), or combinations thereof. The etch solutions and/or electrolytes can be an electrically conductive solution. In an example, the etch cell includes a top reservoir that contains a solution comprising an electrolyte. The top reservoir can be situated adjacent to (e.g., on top of) a substrate to be etched. The substrate to be etched can be substantially free of one or more metallic material, which may be catalytic materials. The substrate to be etched may be free of a metallic coating. In some examples, the substrate to be etched has a metal content (e.g., on a surface of the substrate) that is less than about 25%, 20%, 15%, 10%, 5%, 1%, 0.1%, 0.01%, 0.001%, 0.0001%, 0.00001%, or 000001%, as measured by x-ray photoelectron spectroscopy (XPS).

An etching solution can include an acid (e.g., HF) or a concentration of acids (taken as a weight percentage) that is less than or equal to about 70%, 60%, 50%, 40%, 30%, 20% or 10% (by weight), in some cases greater than or equal to about 1%, 10%, 20%, or 30%. In some examples, the concentration (by weight) is from about 1% to 60%, or 10% to 50%, or 20% to 45%. The balance of the etching solution can include a solvent (e.g., water) and an additive, such as an alcohol, carboxylic acid, ketone and/or aldehyde. In some examples, the additive is an alcohol, such as methanol, ethanol, isopropanol, or a combination thereof. The additive can enable the user of lower current densities while forming nanostructures (e.g., holes) with properties that are suitable for use in thermoelectric elements of the present disclosure, such as a substantially uniform distribution of holes having a disordered pattern. The additive can enable the user of lower current densities while forming nanostructures (e.g., holes) with properties that are suitable for use in thermoelectric elements of the present disclosure, such as increased control of the spacing between two or more holes. The additive can enable the user of lower current densities while forming nanostructures (e.g., holes) with properties that are suitable for use in thermoelectric elements of the present disclosure, such as spacing between two or more holes of at most about 5 nm. The additive can enable the user of lower current densities while forming nanostructures (e.g., holes) with properties that are suitable for use in thermoelectric elements of the present disclosure, such as spacing between two or more holes of at most about 20 nm. The additive can enable the user of lower current densities while forming nanostructures (e.g., holes) with properties that are suitable for use in thermoelectric elements of the present disclosure, such as spacing between two or more holes of at most about 100 nm.

Electric current can be sourced to and/or through the substrate using an edge or backside contact, through the solution/electrolyte, and into a counter electrode. The counter electrode can be in electrical communication with the top reservoir, in some cases situated in the top reservoir. In some cases, the counter electrode is adjacent or in contact with a topside of the substrate. The body of the etch cell can be fabricated from materials inert to the etch solution or electrolyte (e.g., PTFE, PFA, polypropylene, HDPE). The edge or backside contact can include a metal contact on the substrate, or it can be a liquid contact using a suitable electrolyte. The counter electrode can include a wire or mesh constructed from a suitable electrode material. The etch cell can contain mechanical paddles or ultrasonic agitators to maintain solution motion, or the entire cell may be spun, rotated or shaken. In some examples, agitating the solution before and/or during etching can provide for improved etching uniformity. This can enable the electrolyte to be circulated during etching. In another example, the etch cell can contain one or more recirculating reservoirs and etch chambers, with one or more solutions/electrolytes.

In an example, an unpatterned substrate is loaded into reaction space provided with up to five or more electrode connections. One of the electrodes is in ohmic contact with the substrate backside (the working electrode) and is isolated from an etchant electrolyte. One of the electrodes can be in ohmic contact with the substrate backside (the working electrode) and may not be in contact with an etchant electrolyte. Another electrode (the counter electrode) can be submerged in the electrolyte but not in direct contact with the substrate, and used to supply current through the electrolyte to the substrate working electrode. Another electrode (the reference electrode) is immersed in the electrolyte and isolated from both the working and counter electrodes, in some cases using a frit, and used to sense the operating potential of the etch cell using a known or predetermined reference standard. Another two or more electrodes may be placed outside the reaction space in order to set up an external electric field. In some cases, at least two electrodes—a working electrode and a counter electrode—are required.

The reaction space can be used in a number of ways. In one approach, the reaction space can be used in a two-electrode configuration by passing an anodic current via the substrate backside through a suitable electrolyte. The electrolyte can be, for example, a liquid mixture containing a diluent, such as water, or a fluoride-containing reagent, such as hydrofluoric acid, or an oxidizer, such as hydrogen peroxide. The electrolyte can include surfactants and/or modifying agents. The working potential can be sensed during anodization using the counter electrode in a three-electrode configuration. The anodization can be performed in the presence of a DC or AC external field using the electrodes placed outside the reaction space.

In anodic etching, a voltage/current assisted etch of a semiconductor can result in etching of the semiconductor at a rate dependent on the voltage/current. The etch rate, etch depth, etch morphology, pore density, pore structure, internal surface area and surface roughness can be controlled by the voltage/current, etch solution/electrolyte composition and other additives, pressure/temperature, front/backside illumination, and stirring/agitation. They can also be controlled by the crystal orientation, dopant type, resistivity (doping concentration), and growth process (e.g., float-zone or Czochralski) of the semiconductor. The resistivity of the semiconductor can be at least about 0.001 ohm-cm, 0.01 ohm-cm, or 0.1 ohm-cm, and in some cases less than or equal to about 1 ohm-cm, 0.5 ohm-cm, 0.1 ohm-cm. In some examples, the resistivity of the semiconductor is from about 0.001 ohm-cm to 1 ohm-cm, 0.001 ohm-cm to 0.5 ohm-cm, or 0.001 ohm-cm to 0.1 ohm-cm.

During etching of a semiconductor substrate using voltage/current control, a potential or bias (e.g., direct current bias) is applied to the substrate using an underlying electrode. This can result in the semiconductor substrate being etched. As a result of anodic etching, the semiconductor's thermal conductivity can drop significantly. In some examples, by employing an applied bias, the porosity (mass loss) can be controlled and tuned and therefore the thermal and electrical properties can be controlled. In other examples, by employing a specific etch solution/electrolyte composition and/or additives the porosity can be controlled. In yet other examples, by employing any number of variables already listed, the porosity can be controlled.

In some cases, the semiconductor substrate is unpatterned and in some cases it is patterned. In an unpatterned etch, the substrate is etched directly in the cell. In a patterned etch, a blocking layer that prevents etching can first be placed over the semiconductor, and then removed in specific locations. This layer may be formed in any manner suitable (e.g., chemical vapor deposition, spin-coating, oxidation) and then be removed in a subsequent step in desired locations (e.g., plasma etching, reactive ion etching, sputtering) using a suitable mask (e.g., photolithography). Alternatively, a blocking layer can be deposited directly (e.g., dip pen lithography, inkjet printing, spray coating through a stencil).

Subsequently, a negative replica of the pattern in the blocking layer is transferred into the substrate during the anodic etch.

The etch can be performed by applying an electrical potential ("potential") to the semiconductor substrate, in the presence of a suitable etch solution/electrolyte. The potential can be, for example, at least about +0.01 V, +0.02 V, +0.03 V, +0.04 V, +0.05 V, +0.06 V, +0.07 V, +0.08 V, +0.09 V, +0.1 V, +0.2 V, +0.3 V, +0.4 V, +0.5 V, +0.6 V, +0.7 V, +0.8 V, +0.9 V, +1.0 V, +2.0 V, +3.0 V, +4.0 V, +5.0 V, +10 V, +20 V, +30 V, +40 V, or +50 V relative to a reference, such as ground. In some examples, the potential is from about +0.01 V to +20 V, +0.1 V to +10 V, or +0.5 V to +5 V relative to a reference. In some examples, the potential can range from about +0.01 V to +0.05 V, +0.06 V to +0.1 V, +0.2 V to +0.5 V, +0.6 V to +1.0 V, +2.0 V to +5.0 V, +10 V to +20 V, +20V to +30 V, +30V to +40 V, or +40V to +50. In some examples, the potential is from about +0.5 V to +5 V, or +1 V to +5 V.

The etch can be performed by applying or generating an electrical current ("current") to or through the semiconductor substrate, in some cases in the presence of a suitable etch solution/electrolyte. The current can be applied to the substrate upon the application of the potential to the substrate. The current can have a current density, for example, of at least about +0.01 milliamps per square centimeter (mA/cm$^2$), +0.1 mA/cm$^2$, +0.2 mA/cm$^2$, +0.3 mA/cm$^2$, +0.4 mA/cm$^2$, +0.5 mA/cm$^2$, +0.6 mA/cm$^2$, +0.7 mA/cm$^2$, +0.8 mA/cm$^2$, +0.9 mA/cm$^2$, +1.0 mA/cm$^2$, +2.0 mA/cm$^2$, +3.0 mA/cm$^2$, +4.0 mA/cm$^2$, +5.0 mA/cm$^2$, +6.0 mA/cm$^2$, +7.0 mA/cm$^2$, +8.0 mA/cm$^2$, +9.0 mA/cm$^2$, +10 mA/cm$^2$, +20 mA/cm$^2$, +30 mA/cm$^2$, +40 mA/cm$^2$, +50 mA/cm$^2$, +60 mA/cm$^2$, +70 mA/cm$^2$, +80 mA/cm$^2$, +90 mA/cm$^2$, +100 mA/cm$^2$, +200 mA/cm$^2$, +300 mA/cm$^2$, +400 mA/cm$^2$, +500 mA/cm$^2$, +600 mA/cm$^2$, +700 mA/cm$^2$, +800 mA/cm$^2$, +900 mA/cm$^2$, +1000 mA/cm$^2$. In some examples, the current density ranges from about 0.01 mA/cm$^2$ to 20 mA/cm$^2$, 0.05 mA/cm$^2$ to 10 mA/cm$^2$, or 0.01 mA/cm$^2$ to 5 mA/cm$^2$. In some examples, the current density ranges from about +0.1 mA/cm$^2$ to +0.5 mA/cm$^2$, +0.6 to +1.0 mA/cm$^2$, +1.0 mA/cm$^2$ to +5.0 mA/cm$^2$, +5.0 mA/cm$^2$ to +10 mA/cm$^2$, +10 mA/cm$^2$ to +20 mA/cm$^2$, +20 mA/cm$^2$ to +30 mA/cm$^2$, +30 mA/cm$^2$ to +40 mA/cm$^2$, +40 mA/cm$^2$ to +50 mA/cm$^2$, +50 mA/cm$^2$ to +60 mA/cm$^2$, +60 mA/cm$^2$ to +70 mA/cm$^2$, +70 mA/cm$^2$ to +80 mA/cm$^2$, +80 mA/cm$^2$ to +90 mA/cm$^2$, +90 mA/cm$^2$ to +100 mA/cm$^2$, +10 mA/cm$^2$ to +200 mA/cm$^2$, +20 mA/cm$^2$ to +300 mA/cm$^2$, +300 mA/cm$^2$ to +400 mA/cm$^2$, +40 mA/cm$^2$ to +500 mA/cm$^2$, +500 mA/cm$^2$ to +600 mA/cm$^2$, +600 mA/cm$^2$ to +700 mA/cm$^2$, +700 mA/cm$^2$ to +800 mA/cm$^2$, +800 mA/cm$^2$ to +900 mA/cm$^2$, or +900 mA/cm$^2$ to +1000 mA/cm$^2$. In some examples, the current density is from about 1 mA/cm$^2$ to 30 mA/cm$^2$, 5 mA/cm$^2$ to 25 mA/cm$^2$, or 10 mA/cm$^2$ to 20 mA/cm$^2$. Such current densities may be achieved with potential provided herein, such as a potential from about +0.5 V to +5 V, or +1 V to +5 V.

The electrical potential (or voltage) can be measured using a voltmeter, for instance. The voltmeter can be in parallel with the substrate. For example, the voltmeter can be measure the electrical potential between two sides of the substrate, or the electrical potential between a working electrode and counter electrode in solution. The current density can be measured using an ammeter. The ammeter can be in series with a power source and the substrate. For example, the ammeter can be coupled to a backside of the substrate.

Thermoelectric elements of the present disclosure can be formed at an etching time that is selected to provide an array of nanostructures (e.g., holes or wires). Etching times can range from 1 second to 2 days, 1 minute to 1 day, 1 minute to 12 hours, 10 minutes to 6 hours, or 30 minutes to 3 hours. In some examples, the etching time is from 30 minutes to 6 hours, or 1 hour to 6 hours. In some cases, etching times can be at least about 1 second, 10 seconds, 30 seconds, 1 minute, 2 minutes, 3 minutes, 4 minutes, 5 minutes, 10 minutes, 30 minutes, 1 hour, 2 hours, 3 hours, 4 hours, 5 hours, 6 hours, 12 hours, or 1 day. Such etching times can be used in combination with applied voltage and/or current of the present disclosure.

In some cases, the bias applied to the semiconductor substrate can be changed during etching to regulate the etch rate, etch depth, etch morphology, pore density, pore structure, internal surface area and surface roughness of the semiconductor substrate, including the density and location of nano structuring in the semiconductor substrate. In another case, the etch solution/electrolyte composition and/or additives can be changed during etching. In yet other cases, the pressure/temperature or illumination or stirring/agitation can be changed. Alternatively, more than one of these variables may be changed simultaneously to obtain the desired etch characteristics.

During the period in which the substrate is etched, the electrical potential can be constant, varied or pulsed. In an example, the electrical potential is constant during the etching period. In another example, the electrical potential is pulsed on and off, or from positive to negative, during the etching period. In another example, the electrical potential is varied during the etching period, such as varied gradually from a first value to a second value, which second value can be less than or greater than the first value. The electrical potential can then be varied from the second value to the first value, and so on. In yet another example, the bias/current may be oscillated according to a sinusoidal/triangular/arbitrary waveform. In some cases, the bias/current can be pulsed with a frequency of at least about 1 Hz, 10 Hz, 1000 Hz, 5000 Hz, 10000 Hz, 50000 Hz, or 100000 Hz.

The bias and/or current can be DC or AC, or a combination of DC and AC. Use of an AC bias and/or current with DC offset can provide control over the etch rate using the DC bias/current and control over ions using the AC bias/current. The AC bias/current can alternately enhance and retard the etch rate, or increase/decrease the porosity/surface roughness, or modify the morphology and structure in a periodic or non-periodic fashion. The amplitude and frequency of the AC bias/current can be used to tune the etch rate, etch depth, etch morphology, pore density, pore structure, internal surface area and surface roughness.

In some situations, the application of an electrical potential to a semiconductor substrate during etching can provide for a given etch rate. In some examples, the substrate can be etched at a rate of at least about 0.1 nanometers (nm)/second (s), 0.5 nm/s, 1 nm/s, 2 nm/s, 3 nm/s, 4 nm/s, 5 nm/s, 6 nm/s, 7 nm/s, 8 nm/s, 9 nm/s, 10 nm/s, 20 nm/s, 30 nm/s, 40 nm/s, 50 nm/s, 60 nm/s, 70 nm/s, 80 nm/s, 90 nm/s, 100 nm/s, 200 nm/s, 300 nm/s, 400 nm/s, 500 nm/s, 600 nm/s, 700 nm/s, 800 nm/s, 900 nm/s, 1000 nm/s, or 10,000 nm/s at 25° C. In other cases, the etch rate may be increased/decreased with a change in pressure/temperature, solution/electrolyte composition and/or additives, illumination, stirring/agitation.

The porosity of a semiconductor substrate during etching using an applied potential or current density can provide a substrate with a porosity (mass loss) that can provide a thermoelectric element that is suitable for various applications. In some examples, the porosity is at least about 0.01%, 0.1%, 1%, 5%, 10%, 20%, 30%, 40%, 50%, or 60%. The porosity can be from about 0.01% to 99.99%, 0.1% to 60%, or 1% to 50%.

A substrate can have a thickness that is selected to yield a thermoelectric element that is suitable for various applications. The thickness can be at least about 100 nanometers (nm), 500 nm, 1 micrometer (micron), 5 microns, 10 microns, 100 microns, 500 microns, 1 millimeter (mm), or 10 mm. In some examples, the thickness is from about 500 nm to 1 mm, 1 micron to 0.5 mm, or 10 microns to 0.5 mm.

The etch may be performed to completion through the entire thickness of the substrate, or it may be stopped at any depth. A complete etch yields a self-supporting nanostructured material with no underlying unetched substrate. An incomplete etch yields a layer of nanostructured material over underlying unetched substrate. The nanostructured layer may have a thickness at least about 10 nanometers (nm), 20 nm, 30 nm, 40 nm, 50 nm, 60 nm, 70 nm, 80 nm, 90 nm, 100 nm, 200 nm, 300 nm, 400 nm, 500 nm, 600 nm, 700 nm, 800 nm, 900 nm, 1 micrometers (µm), 2 µm, 3 µm, 4 µm, 5 µm, 6 µm, 7 µm, 8 µm, 9 µm, 10 µm, 20 µm, 30 µm, 40 µm, 50 µm, 60 µm, 70 µm, 80 µm, 90 µm, 100 µm, 200 µm, 300 µm, 400 µm, 500 µm, 600 µm, 700 µm, 800 µm, 900 µm, 1 millimeters (mm), 2 millimeters (mm), 3 millimeters (mm), 4 millimeters (mm), 5 millimeters (mm), 6 millimeters (mm), 7 millimeters (mm), 8 millimeters (mm), 9 millimeters (mm), 10 millimeters (mm) or more.

The nanostructured layer may be left on the substrate, or it may be separated from the substrate in a number of ways. The layer may be mechanically separated from the substrate (e.g., using a diamond saw, scribing and cleaving, laser cutting, peeling off). Alternatively, the layer can be separated from the substrate by effecting electropolishing conditions at the etching front at the base of the layer. These conditions can be achieved by a change in pressure, change in temperature, change in solution composition, change in electrolyte composition, use of additives, illumination, stirring, and/or agitation, or by waiting a sufficient duration of time (e.g., more than about 1 day). In some cases, a partial or incomplete separation may be desired, such that the layer is still weakly attached to the substrate. This can be achieved by varying between normal etching conditions and electropolishing. Complete separation can then be achieved in a subsequent step.

After etching, the material may be chemically modified to yield functionally active or passive surfaces. For example, the material may be modified to yield chemically passive surfaces, or electronically passive surfaces, or biologically passive surfaces, or thermally stable surfaces, or a combination of the above. This can be accomplished using a variety of methods, e.g., thermal oxidation, thermal silanation, thermal carbonization, hydrosilylation, Grignard reagents, electrografting. In some cases, one or more of the above methods may be used to obtain a surface with the desired or otherwise predetermined combination of properties.

After modification, the voids in the material may also be fully or partially impregnated with a filling material. For example, the filling material may be electrically conductive, or thermally insulating, or mechanically strengthening, or a combination of the above. Suitable filling materials may include one or more of the following groups: insulators, semiconductors, semimetals, metals, polymers, gases, or vacuum. Filling can be accomplished using a variety of methods, e.g., atomic layer deposition, chemical vapor deposition, deposition from chemical bath or polymerization bath, electrochemical deposition, drop casting or spin coating or immersion followed by evaporation of a solvated filling material. In some cases, one or more of the above methods may be used to obtain filling materials with the desired combination of properties.

After filling, the material may also be sealed with a capping material. For example, the capping material may be impermeable to gases, or liquids, or both. Suitable filling materials may include one or more of the following groups: insulators, semiconductors, semimetals, metals or polymers. Capping can be accomplished using a variety of methods, e.g., atomic layer deposition, chemical vapor deposition, deposition from chemical bath or polymerization bath, electrochemical deposition, drop casting or spin coating or immersion followed by evaporation of a solvated filling material. In some cases, one or more of the above methods may be used to obtain capping materials with the desired or predetermined combination of properties.

After etching, the material can be washed with a suitable rinsing solution (e.g., water, methanol, ethanol, isopropanol, toluene, hexanes etc.) and dried (e.g., blow drying, evaporative drying, oven/furnace drying, vacuum drying, critical point drying, or air drying). The rinsing solution can be selected depending on the mode of drying.

After anodic etching, the thermal and electrical properties of the semiconductor may be further controlled or tuned by coarsening or annealing the semiconductor nanostructure (pore or hole morphology, density, structure, internal surface area and surface roughness) through the application of heat and time. Temperatures between about 50° C. and 1500° C., or 100° C. and 1300° C. for a time period from about 1 second to 1 week can be utilized to control the thermal and electrical properties of the semiconductor. In some cases, the time period is at least about 1 second, 10 seconds, 30 seconds, 1 minute, 2 minutes, 3 minutes, 4 minutes, 5 minutes, 10 minutes, 30 minutes, 1 hour, 2 hours, 3 hours, 4 hours, 5 hours, 6 hours, 12 hours, or 1 day. The annealing may be performed in vacuum (e.g., at a pressure that is from about $1 \times 10^{-10}$ Torr to <760 Torr) or in the presence of a suitable gas (e.g., helium, neon, argon, xenon, hydrogen, nitrogen, forming gas, carbon monoxide, carbon dioxide, oxygen, water vapor, air, methane, ethane, propane, sulfur hexafluoride and mixtures thereof). The gas can be an inert gas. Annealing can be performed on partially or completely etched substrates, completely separated etched layers on unetched substrates, partially separated etched layers on unetched substrates, or unseparated etched layers on unetched substrates. In some cases, when layers on unetched substrates are annealed, the semiconductor coarsening may proceed in such a fashion as to separate the layers from the unetched substrate. This can be convenient for effecting layer separation.

Electrical contacts may be deposited on or adjacent to the nanostructured material using standard deposition techniques (e.g., silk-screening, inkjet deposition, painting, spraying, dip-coating, soldering, metal sputtering, metal evaporation). These may be metal contacts (e.g., gold, silver, copper, aluminum, indium, gallium, lead-containing solder, lead-free solder or combinations thereof) with/without suitable adhesion layers (e.g., titanium, chromium, nickel or combinations thereof). Alternatively, they may be silicide contacts (e.g., titanium silicide, cobalt silicide, nickel silicide, palladium silicide, platinum silicide, tungsten silicide, molybdenum silicide etc.). Barrier layers (e.g., platinum, palladium, tungsten nitride, titanium nitride, molybdenum nitride etc.) may be inserted to prevent inter-diffusion between the silicon and the contact, or between contact layers, or between every layer. In other examples, they may be combinations of both metal and silicide contacts. A silicide contact can be provided to reduce contact resistance between a metal contact and the substrate. Examples of silicides include tungsten silicide, titanium disilicide and nickel silicide. A subsequent annealing step may be used to form the contact and improve its properties. For example annealing can reduce contact resistance, which can provide an ohmic contact.

After electrical contacts have been formed, the material can be assembled into a thermoelectric device comprising of p- and n-type thermoelectric elements (or legs). A thermoelectric device can include p- and n-legs connected electrically in series, and thermally in parallel with each other. They can be built upon electrically insulating and thermally conductive rigid plates (e.g., aluminum nitride, aluminum oxide, silicon carbide, silicon nitride etc.) with electrical connections between the legs provided by metal interconnects (e.g., copper, aluminum, gold, silver etc.). In another example, the thermoelectric material may be assembled on a flexible insulating material (e.g., polyimide, polyethylene, polycarbonate etc.). Electrical connections between the legs are provided via metal interconnects integrated on the flexible material. The resulting thermoelectric may be in sheet, roll or tape form. Desired sizes of thermoelectric material may be cut out from the sheet, roll or tape and assembled into devices.

Processing conditions (e.g., applied voltages and current densities) provided herein have various unexpected benefits, such as the formation of nano structures (e.g., holes) having orientations and configurations that provide thermoelectric elements and devices of the present disclosure with enhanced or otherwise improved properties, such as a thermoelectric element with a ZT from about 0.01 to 3, 0.1 to 2.5, 0.5 to 2.0 or 0.5 to 1.5 at 25° C. Such processing conditions can provide for the formation of an array nano structures in a substrate. The array of nano structures can have a disordered pattern. Such processing conditions can provide for the formation of flexible thermoelectric elements or devices.

Figure 10:
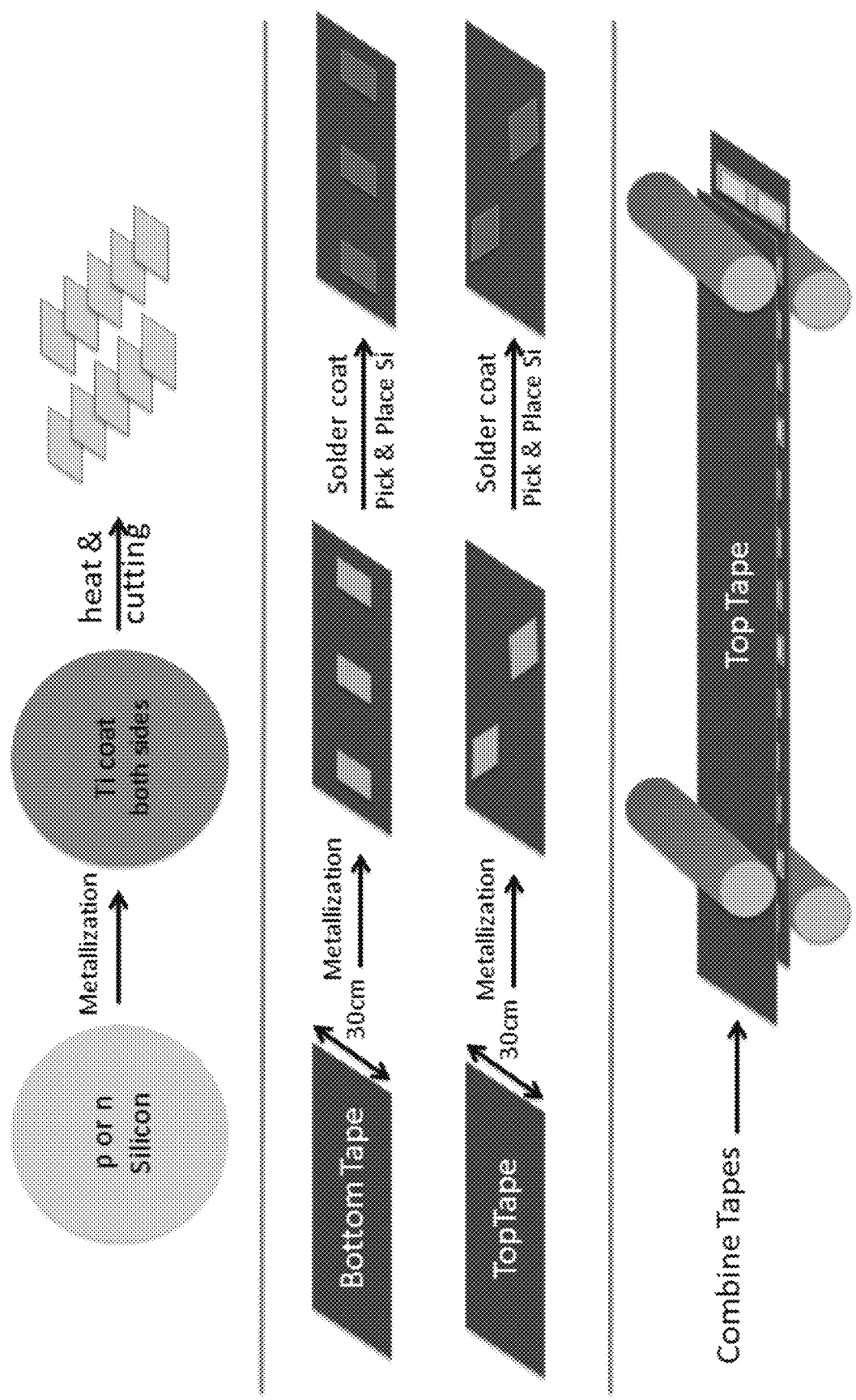
FIG. 10 schematically illustrates a method for manufacturing a flexible thermoelectric device comprising a plurality of thermoelectric elements.

FIG. 10 schematically illustrates a method for manufacturing a flexible thermoelectric device comprising a plurality of thermoelectric elements. A p-type or n-type silicon substrate that has been processed using, for example, a non-catalytic approach described elsewhere herein (e.g., anodic etching) is coated on both sides with a suitable contact material, such as titanium, nickel, chromium, tungsten, aluminum, gold, platinum, palladium, or any combination thereof. The substrate is then heated to a temperature of at least about 250° C., 300° C., 350° C., 400° C., 450° C., 500° C., 550° C., 600° C., 650° C., 700° C., 750° C., 800° C., 850° C., 900° C., 950° C., or 1000° C., and cut into multiple pieces using, for example, a diamond cutter, wire saw, or laser cutter.

Next, in a metallization operation, individual pieces of the cut substrate are placed on bottom and top tapes having widths of about 30 centimeters (cm). The tapes can be formed of a polymeric material, such as, for example, polyimide, polycarbonate, polyethylene, polypropylene, or copolymers, mixtures and composites of these and other polymers.

Next, the individual pieces are subjected to solder coating to form serial connections to the individual pieces across a given tape. The tapes are then combined through one or more rollers (two rollers are illustrated). A thermally conductive adhesive can be provided around the tables to help seal the individual pieces between the tapes.

Thermoelectric elements, devices and systems formed according to methods provided herein can have various physical characteristics. The performance of a thermoelectric device of the disclosure may be related to the properties and characteristics of holes and/or wires of thermoelectric elements. In some cases, optimum device performance may be achieved for an element having holes or wires, an individual hole or wire having a surface roughness between about 0.1 nm and 50 nm, or 1 nm and 20 nm, or 1 nm and 10 nm, as measured by transmission electron microscopy (TEM). In some cases, a thermoelectric element may have a residual metal content that is less than or equal to about 0.000001%, 0.00001%, 0.0001%, 0.001%, 0.01%, 0.1%, 1%, 5%, 10%, 15%, 20%, or 25%, as measured by x-ray photoelectron spectroscopy (XPS).

A thermoelectric element of the present disclosure may have a surface roughness that is suitable for optimized thermoelectric device performance. In some cases, the root mean square roughness of a hole or wire is between about 0.1 nm and 50 nm, or 1 nm and 20 nm, or 1 nm and 10 nm. The roughness can be determined by transmission electron microscopy (TEM) or other surface analytical technique, such as atomic force microscopy (AFM) or scanning tunneling microscopy (STM). The surface roughness may be characterized by a surface corrugation.

Uses of Thermoelectric Elements

Thermoelectric elements, devices and systems of the present disclosure can be employed for use in various settings or employed for various uses. Settings can include, without limitation, healthcare, consumer, and industrial settings. Such uses include, without limitation, flexible thermoelectric tape with flexible heat sinks, wearable electronic devices powered by body heat, waste heat recovery units for generating power (e.g., waste heat recovery unit in a vehicle or chemical plant).

Heat sink can aid in collecting or dissipating heat. A heat sink can include one or more heat fins which can be sized and arranged to provide increase heat transfer area.

Figure 11:
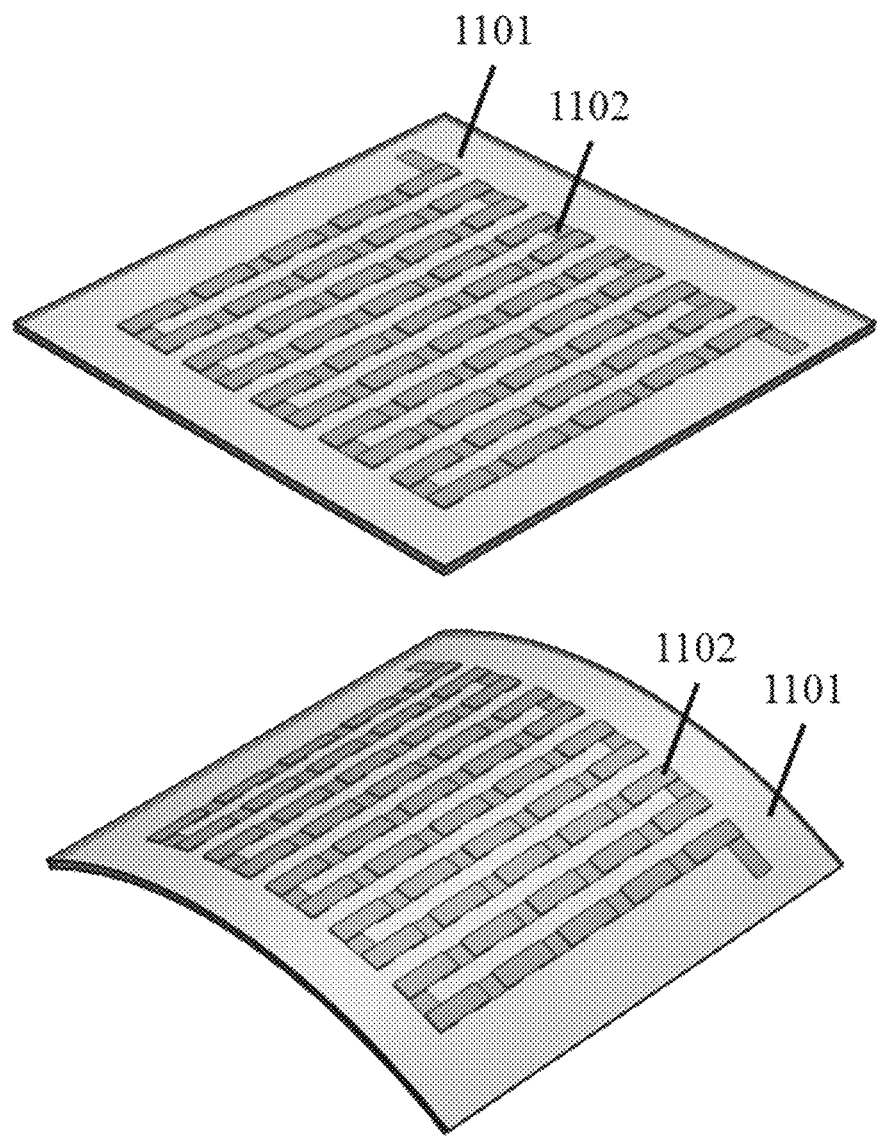
FIG. 11 schematically illustrates a flexible thermoelectric device having a flexible thermoelectric material.

FIG. 11 shows a flexible thermoelectric device 1101. The flexible thermoelectric device 1101 can include thermoelectric elements 1102 in a serial configuration (see, e.g., FIG. 1). The flexible thermoelectric device can have a Young's Modulus that is less than or equal to about $30 \times 10^6$ pounds per square inch (psi), $20 \times 10^6$ psi, $10 \times 10^6$ psi, $5 \times 10^6$ psi, $2 \times 10^6$ psi, $1 \times 10^6$ psi, 900,000 psi, 800,000 psi, 700,000 psi, 600,000 psi, 500,000 psi, 400,000, 300,000, or 200,000 psi at 25° C. The Young's Modulus can be measured by static deflection of the thermoelectric element. The Young's Modulus can be measured by a tensile test.

In some cases, a flexible thermoelectric device can be used with heat sinks and electrical interconnects. The device can be in the shape of a tape, film or sheet form. The device can be substantially flat and flexible, which can enable the device to have increased contact surface area with a surface.

A heat sink may be any flexible material, which can be sufficiently thermally conductive to provide low internal thermal resistance and sufficiently thin to bend in a flexible manner. In some cases, a heat sink can have a thickness from about 0.1 millimeters (mm) to 100 mm, or 1 mm to 10 mm. The heat sink can include thermoelectric elements provided herein within or in contact with a matrix or substrate. The matrix or substrate can be a polymer foil, elastomeric polymer, ceramic foil, semiconductor foil, insulator foil, insulated metal foil or combinations thereof. To increase the surface area presented to the environment for effective thermal transfer, the matrix or substrate may be patterned with dimples, corrugations, pins, fins or ribs.

Figure 12:
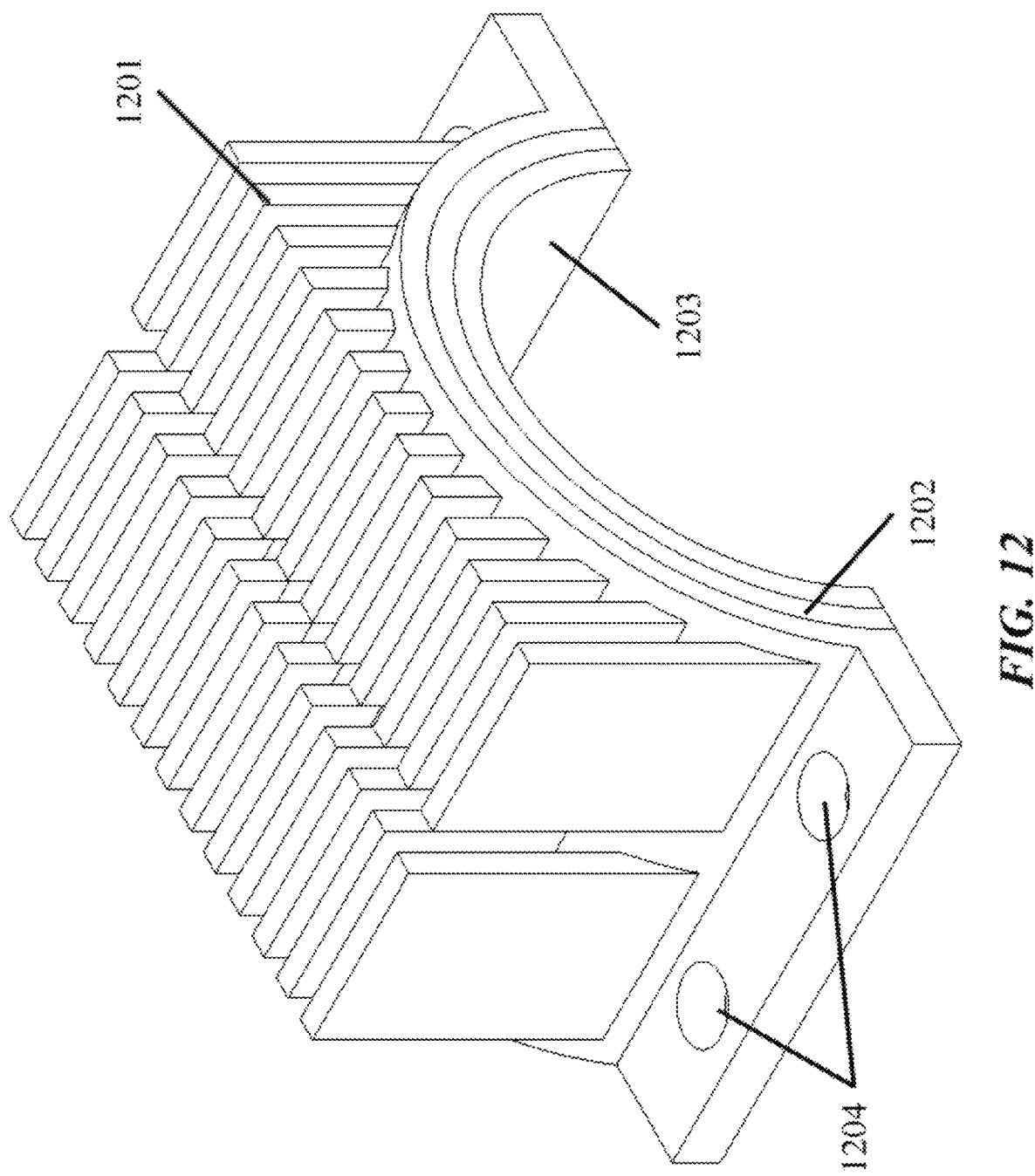
FIG. 12 schematically illustrates a heat recovery system comprising a heat sink and a thermoelectric device.

FIG. 12 shows a heat sink 1201 and a thermoelectric device 1202 with thermoelectric material adjacent to the heat sink 1201. The thermoelectric material can include thermoelectric elements disclosed herein. The thermoelectric device 1202 is adjacent to a mating surface 1203, which can be used to mate with an object, such as, for example, a pipe or an electronic device (e.g., computer processor). The thermoelectric material can be flexible and able to conform to the shape of the molding surface. The heat sink 1201 can include attachment members 1204 that can enable the heat sink 1201 to be secured to the object.

Figure 13:
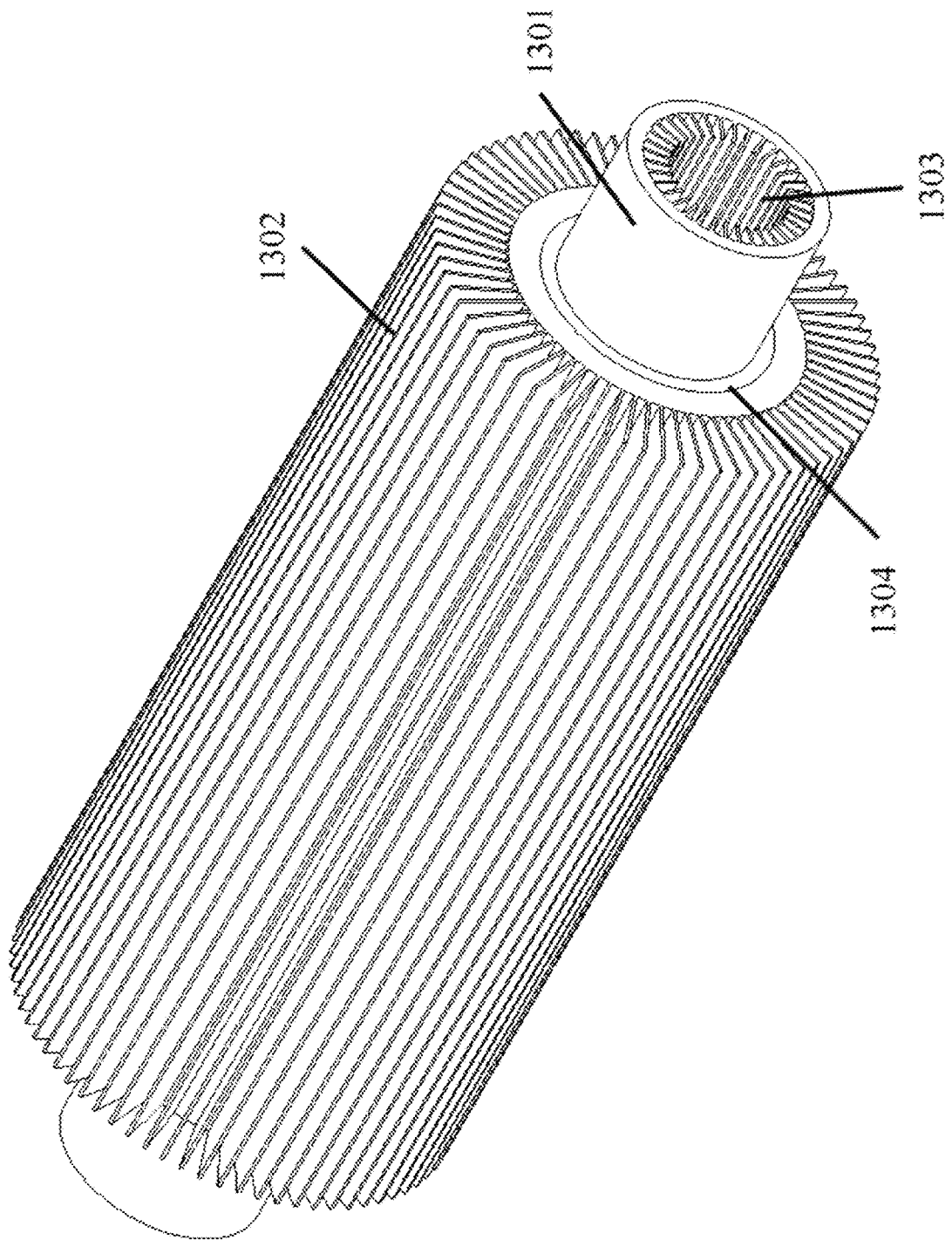
FIG. 13 schematically illustrates a weldable tube with an integrated thermoelectric device and heat sinks.

Heat sinks with integrated or standalone thermoelectric devices can be used with other objects, such as objects with surfaces that can provide for a temperature gradient. For examples, heat sinks can be used with tubes, which may be employed in various settings, such as industrial settings. FIG. 13 shows a weldable tube 1301 with an integrated thermoelectric device and heat sinks. A cold side heat sink 1302 is situated at an exterior of the tube 1301 and a hot side heat sink 1303 is situated at an interior of the tube 1301. The tube 1301 can be formed of a metallic or metal-containing material. A thermoelectric device 1304 comprising a thermoelectric material is disposed at an exterior of the tube, between the tube and the cold side heat sink.

Figure 14A:
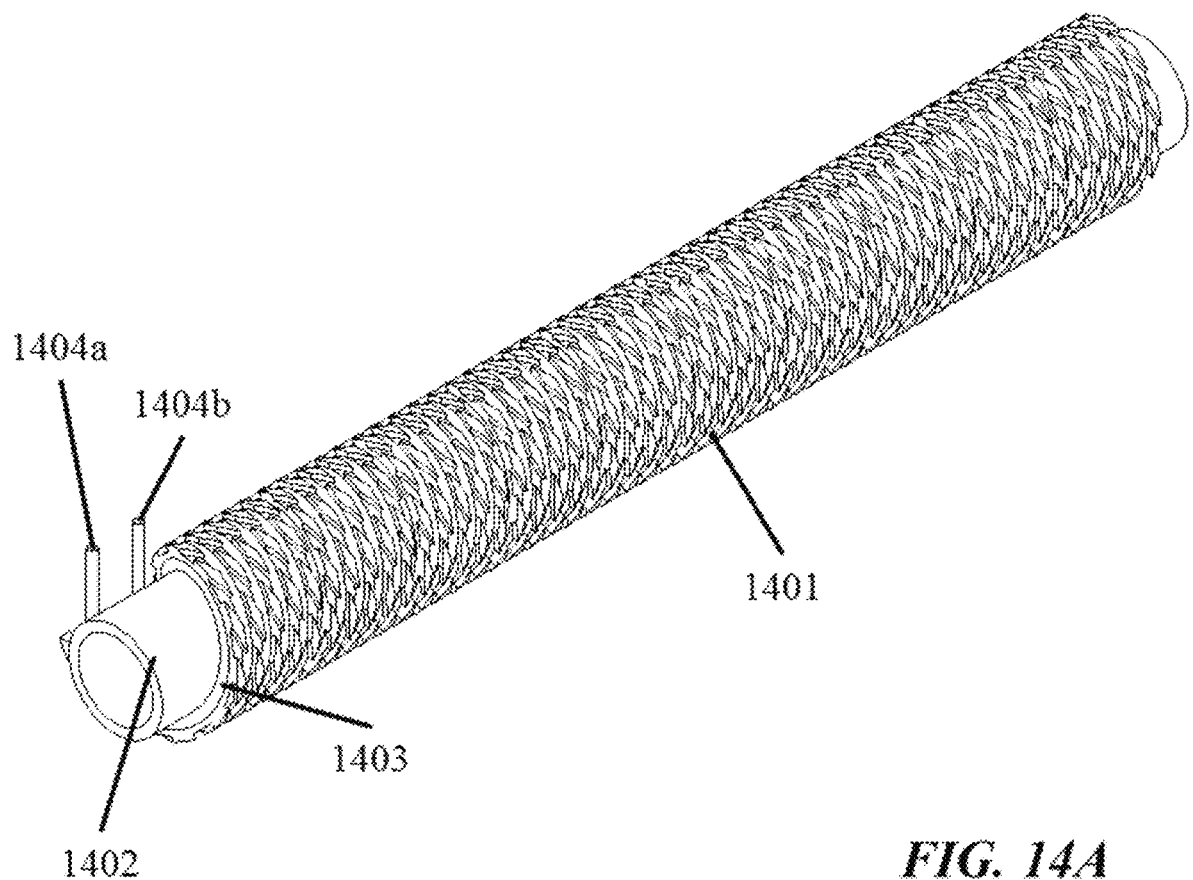
FIG. 14A schematically illustrates a flexible heat sink wrapped around an object.
Figure 14B:
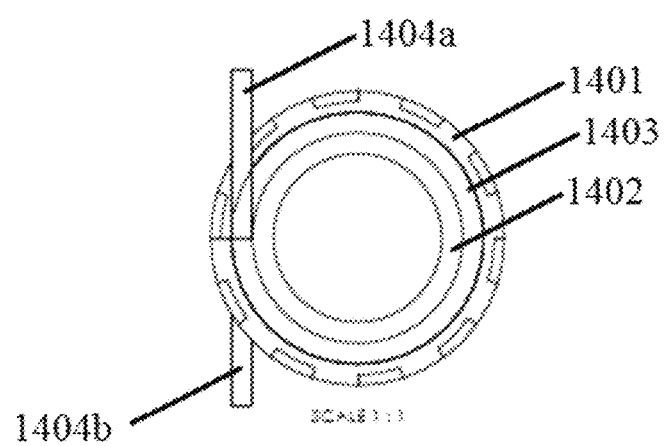
FIG. 14B is a cross-sectional side view of FIG. 14A.

FIGS. 14A and 14B show a flexible heat sink 1401 wrapped around an object 1402, which can be, for example, a pipe carrying a hot or cold fluid. FIG. 14B is a cross-sectional side view of FIG. 14A. The heat sink can include thermoelectric elements in a thermoelectric device layer 1403, which can include thermoelectric elements provided herein. The object 1402 can have a hot or cold surface, which can be situated adjacent to a side of the thermoelectric device layer 1403. An opposing side of the thermoelectric device layer can be situated adjacent to an environment that is hotter or colder than the surface, thereby providing a temperature differential. The thermoelectric elements can be in electrical communication as described herein (see, e.g., FIG. 1) and in electrical communication with electrical wires 1404a and 1404b at an end of the thermoelectric device layer 1403.

As an alternative, the heat sink can be separate from the thermoelectric device layer. The thermoelectric device layer can be in the form of a tape, which can be wrapped around an object. The heat sink can be subsequently applied to the thermoelectric device layer.

The thermoelectric device may have both sides attached to heat sinks, or have only one side attached to a heat sink, or have neither side attached to a heat sink. The thermoelectric device may have both sides coated with adhesive, or have only one side coated with adhesive, or have neither side coated with adhesive. The adhesive can permit the thermoelectric device to be securely coupled to an object and/or one or more heat sinks. The adhesive can be sufficiently thermally conductive.

Heat sink substrates or matrixes may be any flexible electrically insulating material, which can be thin enough to present a low thermal resistance. Examples include polymer foil (e.g., polyethylene, polypropylene, polyester, polystyrene, polyimide, etc.); elastomeric polymer foil (e.g., polydimethylsilazane, polyisoprene, natural rubber, etc.); fabric (e.g., conventional cloths, fiberglass mat, etc.); ceramic, semiconductor, or insulator foil (e.g., glass, silicon, silicon carbide, silicon nitride, aluminum oxide, aluminum nitride, boron nitride, etc.); insulated metal foil (e.g., anodized aluminum or titanium, coated copper or steel, etc.); or combinations thereof. The substrate can be both flexible and stretchable when an elastomeric material is used.

Figure 15:
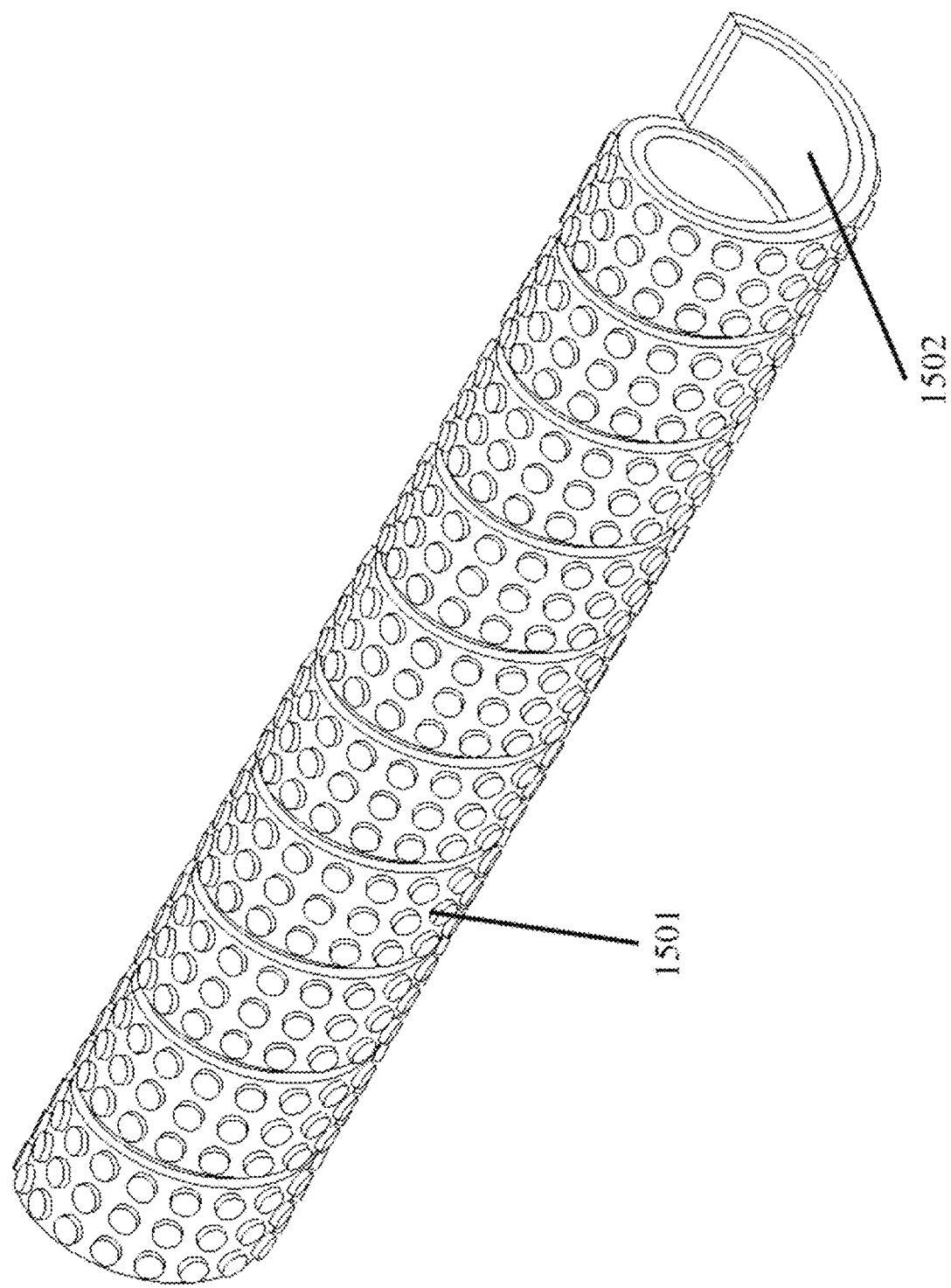
FIG. 15 schematically illustrates a flexible thermoelectric tape with an integrated heat sink.

FIG. 15 shows a flexible thermoelectric tape with an integrated heat sink. The tape includes a flexible heat sink 1501 and a thermoelectric material 1502 adjacent to the heat sink. The heat sink 1501 includes a pattern of dimples, which can provide for improved surface area for heat transfer. The tape can include electrical wires that are coupled to electrodes of the thermoelectric material 1502. The wires can be situated at an end of the tape.

The tape can be applied to various objects, such as planar or non-planar objects. In an example, the tape is wrapped around a pipe. The tape can be supplied from a roll and applied to an object from the roll.

Figure 16:
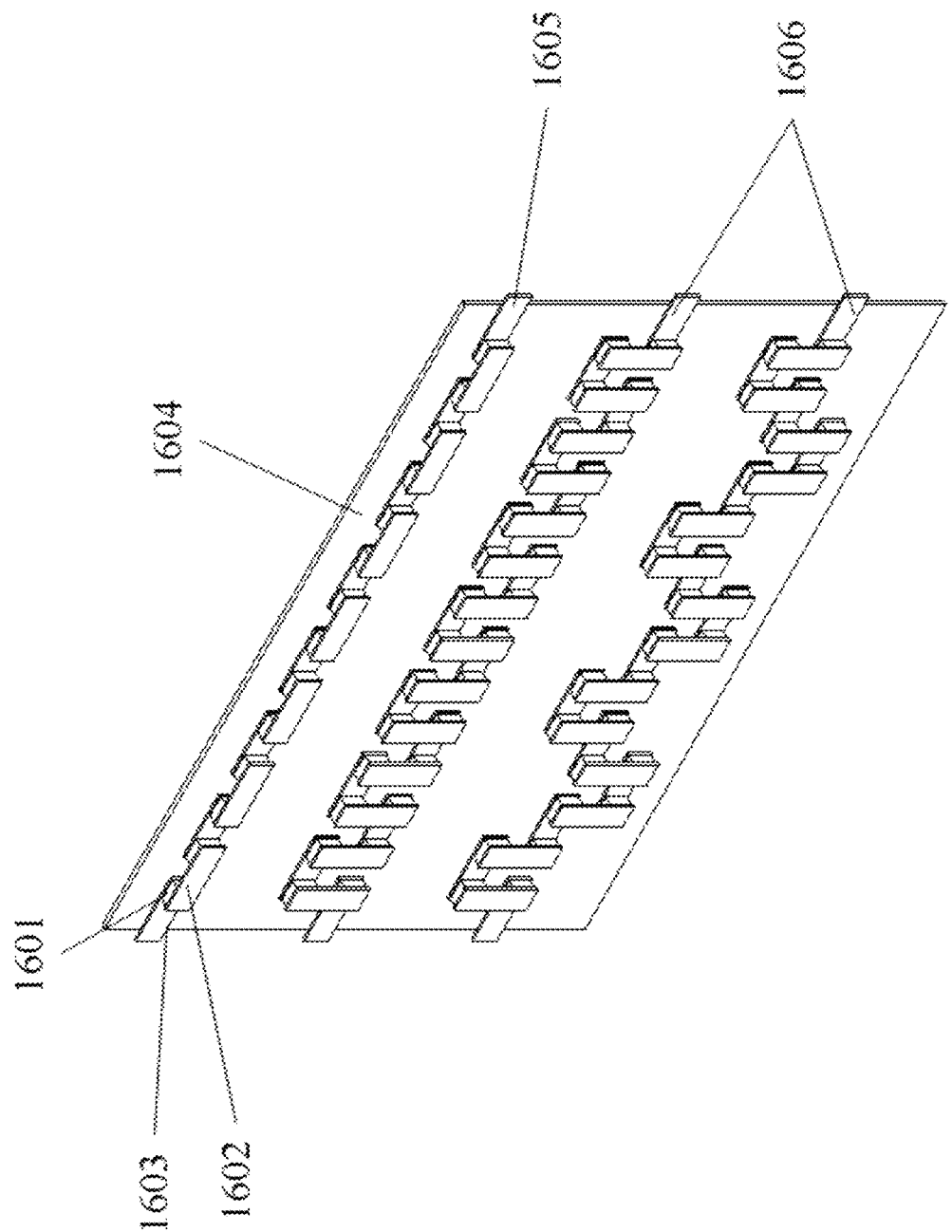
FIG. 16 schematically illustrates an electronic device having thermoelectric elements in electrical communication with top and bottom interconnects.
Figure 17A:
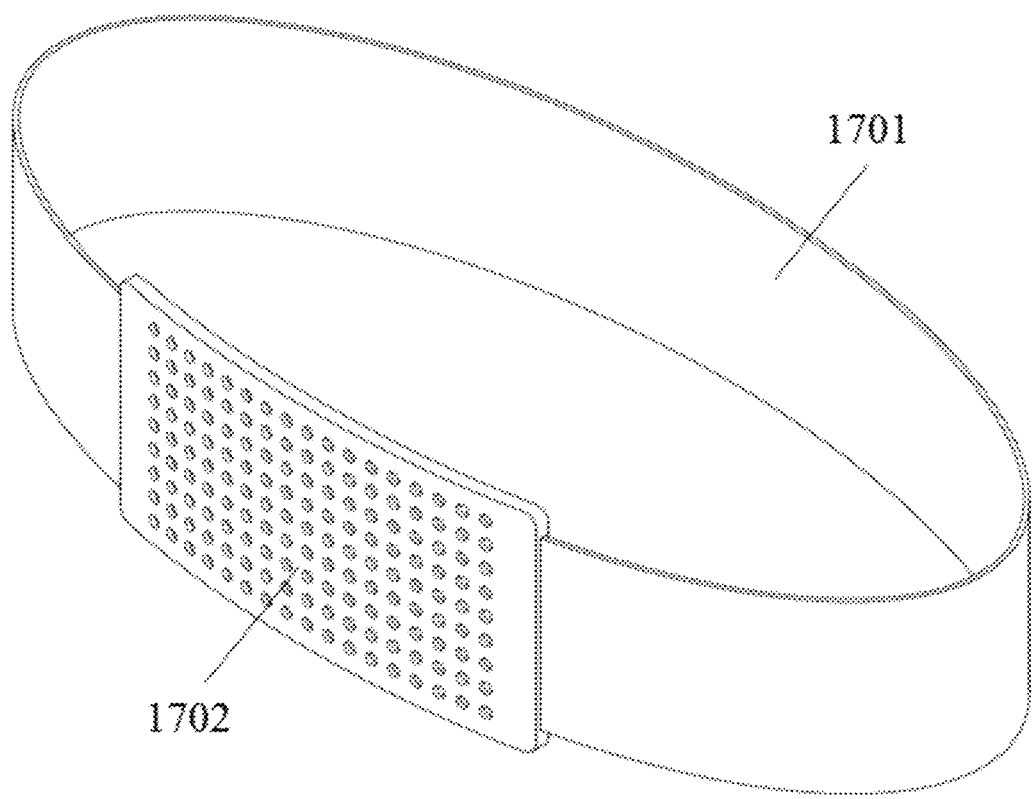
FIG. 17A is a schematic perspective side view of a baby monitor.
Figure 17B:
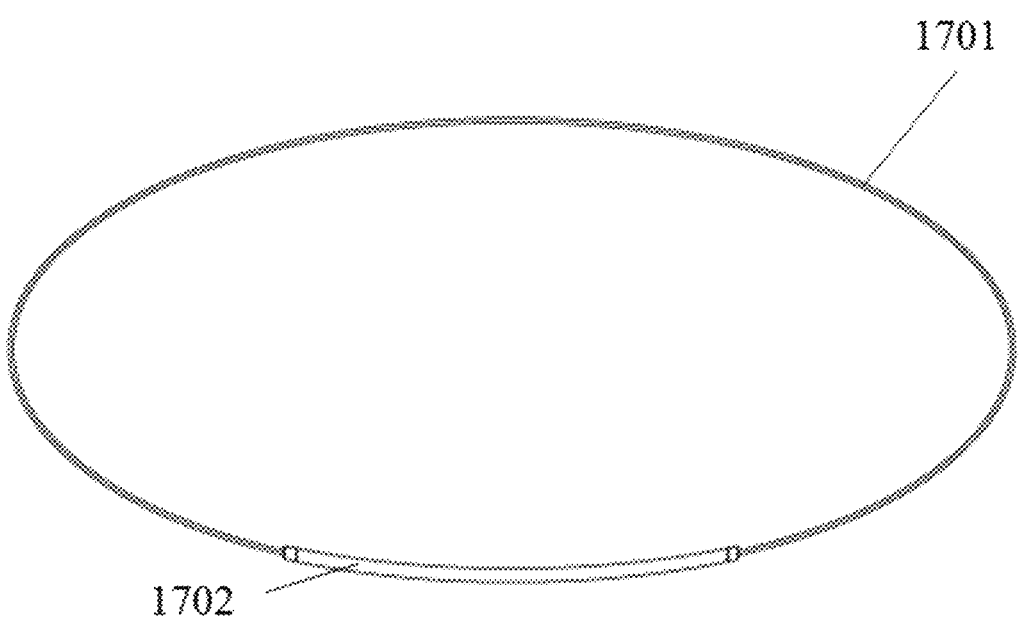
FIG. 17B is a schematic angled side view of the baby monitor of FIG. 17A.
Figure 17C:
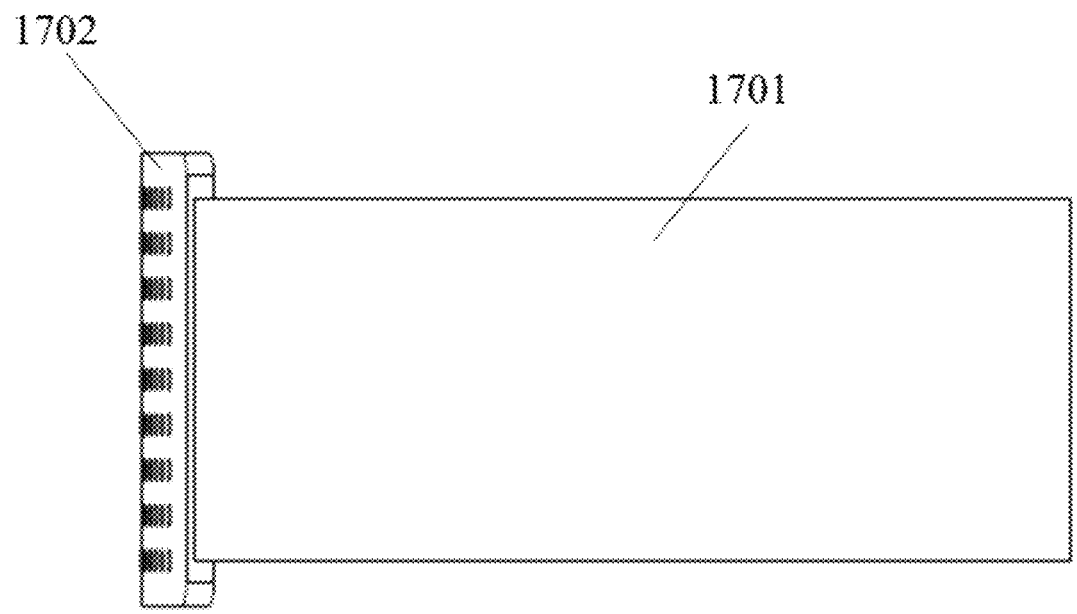
FIG. 17C is a schematic side view of the baby monitor of FIG. 17A.
Figure 17D:
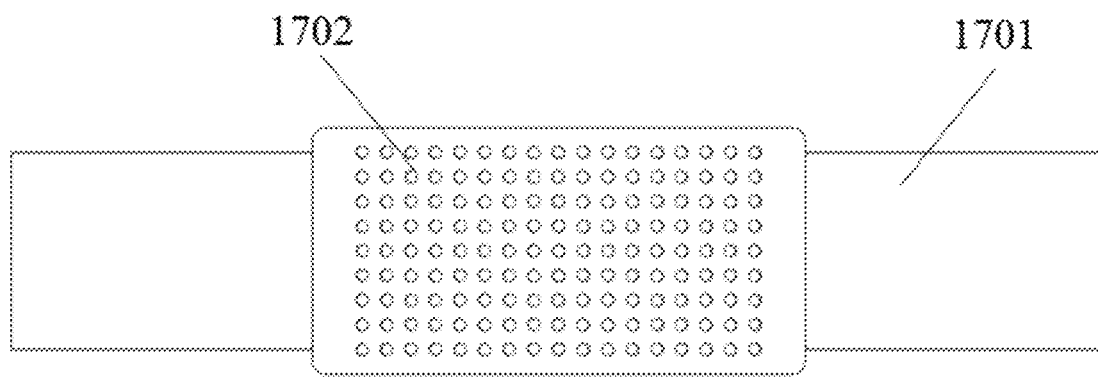
FIG. 17D is a schematic top view of the baby monitor of FIG. 17A.
Figure 18A:
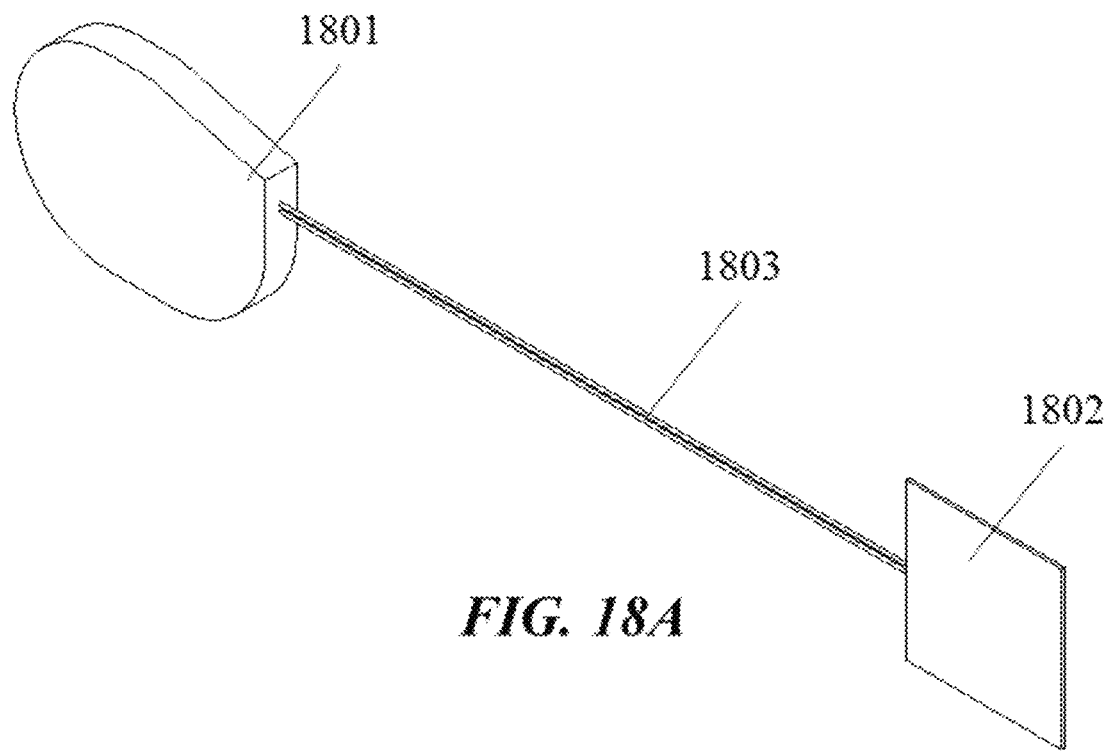
FIG. 18A is a schematic perspective side view of a pacemaker.
Figure 18B:
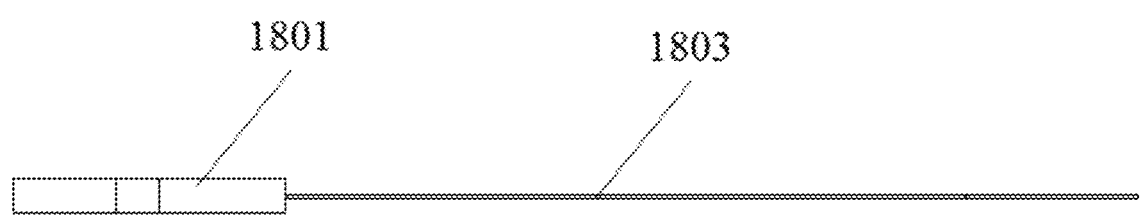
FIG. 18B is a schematic side view of the pacemaker of FIG. 18A.
Figure 18C:
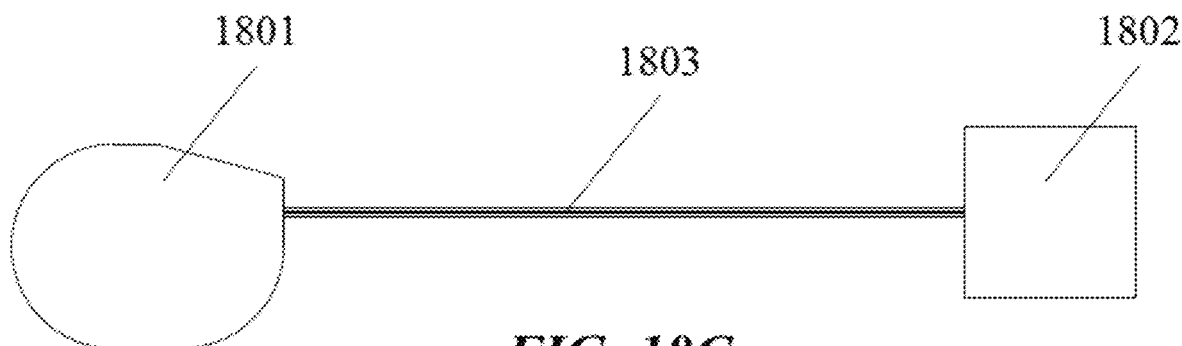
FIG. 18C is a schematic top view of the pacemaker of FIG. 18A.

Thermoelectric elements, devices and systems of the present disclosure can be used with electrical interconnects. The electrical interconnects may be any flexible electrically conductive material, which can be sufficiently thin to present low electrical resistance. Examples include metals and their alloys and intermetallics (e.g., aluminum, titanium, nickel, chromium, nichrome, tantalum, hafnium, niobium, zirconium, vanadium, tungsten, indium, copper, silver, platinum, gold, etc.), silicides (e.g., titanium silicide, nickel silicide, chromium silicide, tantalum silicide, hafnium silicide, zirconium silicide, vanadium silicide, tungsten silicide, copper silicide), conductive ceramics (e.g., titanium nitride, tungsten nitride, tantalum nitride, etc.), or combinations thereof. The thermoelectric elements may be formed of flexible substrates, such as materials that are sufficiently thin to be flexible. Examples of such materials include bismuth telluride, lead telluride, half-heuslers, skutterudites, silicon, and germanium. In some examples, the thermoelectric elements are formed of a nanostructured semiconductor (e.g., silicon), which can be made sufficiently thin to be flexible. The nanostructure semiconductor can have a thickness that is less than or equal to about 100 micrometer (microns), 10 microns, 1 micron, 0.5 microns, or 0.1 microns. FIG. 16 shows an electronic device having thermoelectric elements 1601 that are used with top interconnects 1602 and bottom interconnects 1603. The thermoelectric elements 1601 can be situated between at least a portion of the top interconnects 1602 and a bottom interconnects 1603. The interconnects 1602 and 1603 and thermoelectric elements 1601 can be disposed on a substrate 1604. The interconnects 1602 and 1603 can have a linear pattern 1605 or a zigzag pattern 1606.

In some cases, depending on the combination of component materials used, the flexible thermoelectric device may be optimally used at conditions at room temperature, near room temperature, or at temperatures substantially below room temperature, or at temperatures substantially above room temperature. The choice of nanostructured semiconductor for the thermoelectric elements can permit effective operation of the device across a broad temperature range spanning at least about −273° C. to above 1000° C.

Additionally, depending on the power rating, the interconnect pattern may be varied. For example, given a fixed device size, the output current can be maximized if the thermoelectric elements are connected in parallel linear chains. As another example, the output current can be halved and the output voltage doubled, if the thermoelectric elements are connected in a zigzag pattern (see FIG. 16). Many interconnect patterns are possible. Additionally, external circuitry or switches may be used to switch on/off specific interconnection segments, reroute the interconnection network, or step up/down the output voltage or current.

In some embodiments, thermoelectric elements, devices and systems provided herein can be used in or with wearable electronic devices. Such wearable electronic devices can be powered at least in part by body heat. For example, a thermoelectric device can be provided in a shirt or jacket lining, which can help generate power using the temperature difference between the body of a user and the external environment. This can be used to directly provide power to an electronic device (e.g., wearable electronic device or mobile device), or to charge a rechargeable battery of the electronic device.

A thermoelectric material can be integrated in an apparatus that converts body heat to electricity for purposes of powering electronic circuits. The apparatus can be integrated with a wearable electronic device, including, but not limited to, smart watches, smart glasses, worn or in-ear media players, consumer health monitors (such as pedometers or baby monitors), hearing aids, medical devices (such as heart rate monitors, blood pressure monitors, brain activity (EEG) monitors, cardiac activity (EKG) monitors, pulse oximeters, insulin monitors, insulin pumps, pacemakers, wearable defibrillators). The apparatus can be a standalone apparatus that can be used to power electronic devices, such as mobile electronic devices, including, but not limited to, smart phones (e.g., Apple® iPhone) or laptop computers. The apparatus can be integrated into an electronically augmented piece of clothing or body accessory, including, but not limited to, smart clothing, smart jewelry (e.g., bracelets, bangles, rings, earrings, studs, necklaces, wristbands, or anklets). The apparatus may be used as the sole source of electrical power, generating at least about 1 µW, 10 µW, 100 µW, 1 mW, 10 mW, 20 mW, 30 mW, 40 mW, 50 mW, 100 mW, or 1 W, in some cases from 1 µW to 10 mW. It can also be augmented or supported by another source (e.g., battery, capacitors, supercapacitors, photovoltaic panels, kinetic energy, or rechargeable from wall).

In an example, the apparatus includes a heat collector, a heat expeller, and a thermoelectric device sandwiched therebetween so as to be interposed in the primary path of heat flow. In another example, the apparatus may be integrated with power management circuitry (e.g., step up transformers, direct current (DC) to DC converters, trickle charge circuits, etc.) or power storage (battery, capacitor, supercapacitor, etc.). In yet another example, the apparatus may be further integrated with sensors, data storage, communication and/or display circuitry, and microprocessor systems.

A heat collector can absorb heat from the body of a user and channel heat to the thermoelectric device. It may take any form amenable for its purpose and can be sufficiently thermally conductive to absorb heat from the body and channel heat to the thermoelectric device. In some cases, a heat collector is a slab, plate, ring, or annulus. The heat collector can be formed of a thermally conductive metal, ceramic, or plastic. In an example, the heat collector is a metallic band. In another example, the heat collector may be integrated with a heat pipe. The heat collector may be held on the body by physical insertion, loose or tight clamping, friction, or adhesives.

In some cases, the heat expeller can remove heat from the thermoelectric device and expel heat to the environment. The heat expeller can have any shape, form or configuration, such as, for example, a slab, plate, ring, or annulus. The heat expeller can be sufficiently thermally conductive to remove heat from the thermoelectric device and expel it to the environment. In some cases, the heat expeller is formed of a thermally conductive metal, ceramic, or plastic. In an example, the heat expeller is a metallic heat sink. In another example, the heat expeller may be integrated with a heat pipe.

The thermoelectric device can convert heat into electricity, and may be rigid, semi-rigid or flexible. In some cases, use of a flexible thermoelectric device can simplify manufacturing and assembly of the apparatus. In an example, this may be one or more layers of a flexible thermoelectric device and attached between the heat collector and expeller using thermally conductive adhesives, mechanical preforming or mechanical clamping.

In some cases, the apparatus may take the form of a bracelet or ring. In another implementation, the apparatus may take the form of spectacle frames. In yet another implementation, the apparatus may take the form of a patch to be applied over a human chest, back or torso using adhesive or attachment straps. In yet another implementation, the apparatus may take the form of an implantable film, disc or plate. The apparatus can provide an output power from the thermoelectric device of at least about 1 microwatts (1 µW), 10 µW, 100 µW, 1 mW, 10 milliwatts (mW), 20 mW, 30 mW, 40 mW, 50 mW, 100 mW, or 1 watt (W), in some cases from 1 µW to 10 mW, at a voltage of at least about 1 mV, 2 mV, 3 mV, 4 mV, 5 mV, 10 mV, 20 mV, 30 mV, 40 mV, 50 mV, 100 mV, 200 mV, 300 mV, 400 mV, 500 mV, 1 V, 2 V, 3 V, 4 V, 5 V or 10 V, in some cases from about 10 mV-10 V. In some situations, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and is used to power circuits directly or to trickle charge a power storage unit such as a battery. An auxiliary power supply, such as a battery, can also be included in the apparatus to provide reserve power in times of intermittent bodily contact, decreased power output or increased power consumption. The apparatus can also contain a set of sensors, display and communication circuits, and microprocessors to measure, store and display information.

FIGS. 17A-17D show various views of a baby monitor. The baby monitor can be powered at least in part by body heat, such as the body heat of a baby. The baby monitor includes a band or belt 1701 and a buckle or harness piece 1702 that is integrated with heat collectors and heat expellers, a thermoelectric device with thermoelectric material, power management electronics and energy storage, a sensor, a communications interface (e.g., for wireless communication with another electronic device) and a computer processor.

FIGS. 18A-18D s various views of a body heat powered pacemaker system. The system includes a pacemaker 1801, an implantable thermoelectric module 1802 comprising a thermoelectric device of the present disclosure, and power leads 1803. The thermoelectric module 1802 can be in film, disc or plate form, for example.

Figure 19A:
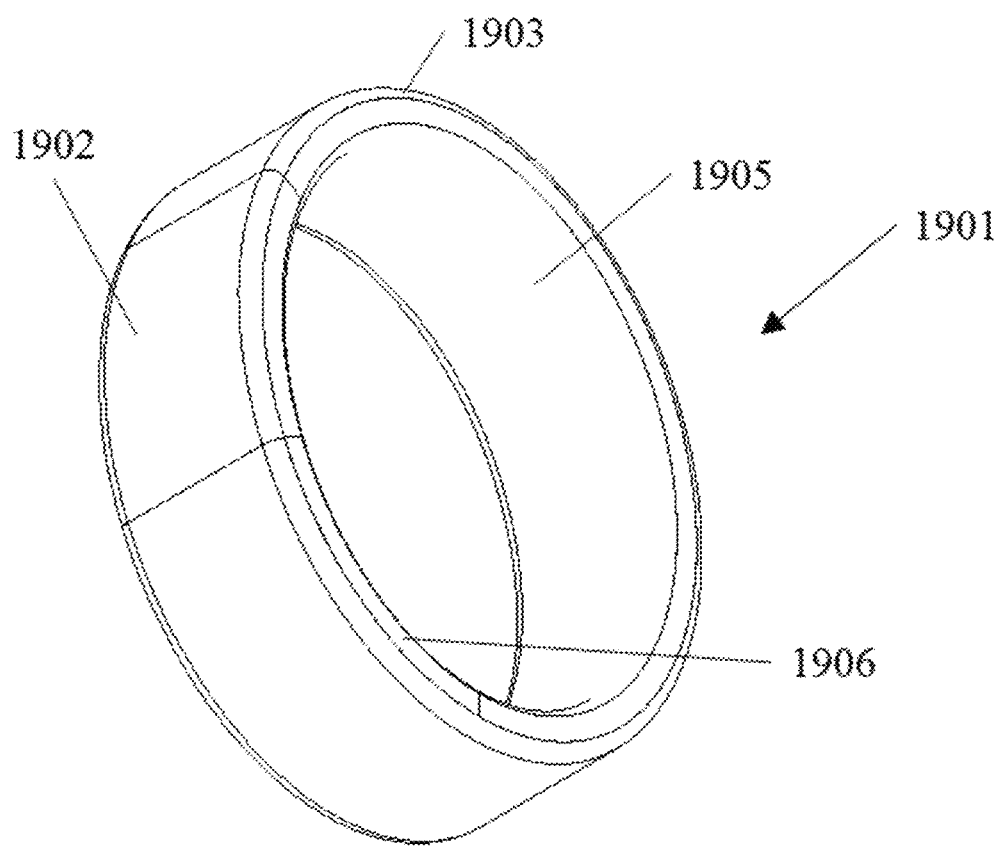
FIG. 19A is a schematic perspective view of a wearable electronic device.
Figure 19B:
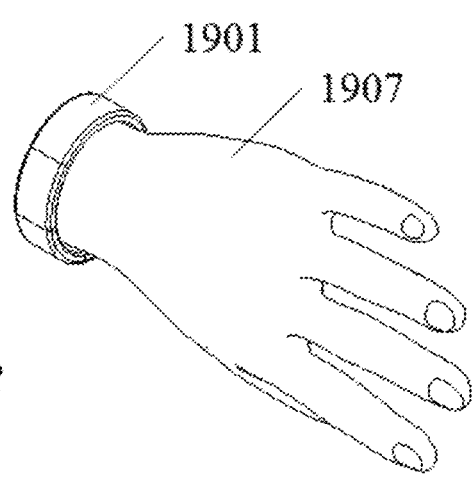
FIG. 19B schematically illustrates the wearable electronic device of FIG. 19A adjacent to a hand of a user.

FIGS. 19A and 19B schematically illustrate an electronic device that can be body heat powered and wearable by a user (e.g., as jewelry). The device comprises a control module 1902 having a sensor display, communications interface and computer processor, which can be in electrical communication with one another. The device 1901 further comprises a heat expeller 1903, thermoelectric device 1904 having a thermoelectric material, a heat collector 1905, and a power module 1906 having power management electronics and an energy storage system. The energy storage system can be a battery, such as a rechargeable battery. The thermoelectric device 1904 can be in electrical communication with the control module 1902. Power to the control module 1902 can be at least partially provided by the thermoelectric device 1904 either directly to the control module 1902 or, in some cases, used to charge the energy storage system in the power module 1906. FIG. 19B shows the device 1901 disposed around a hand 1907 of a user.

Figure 20:
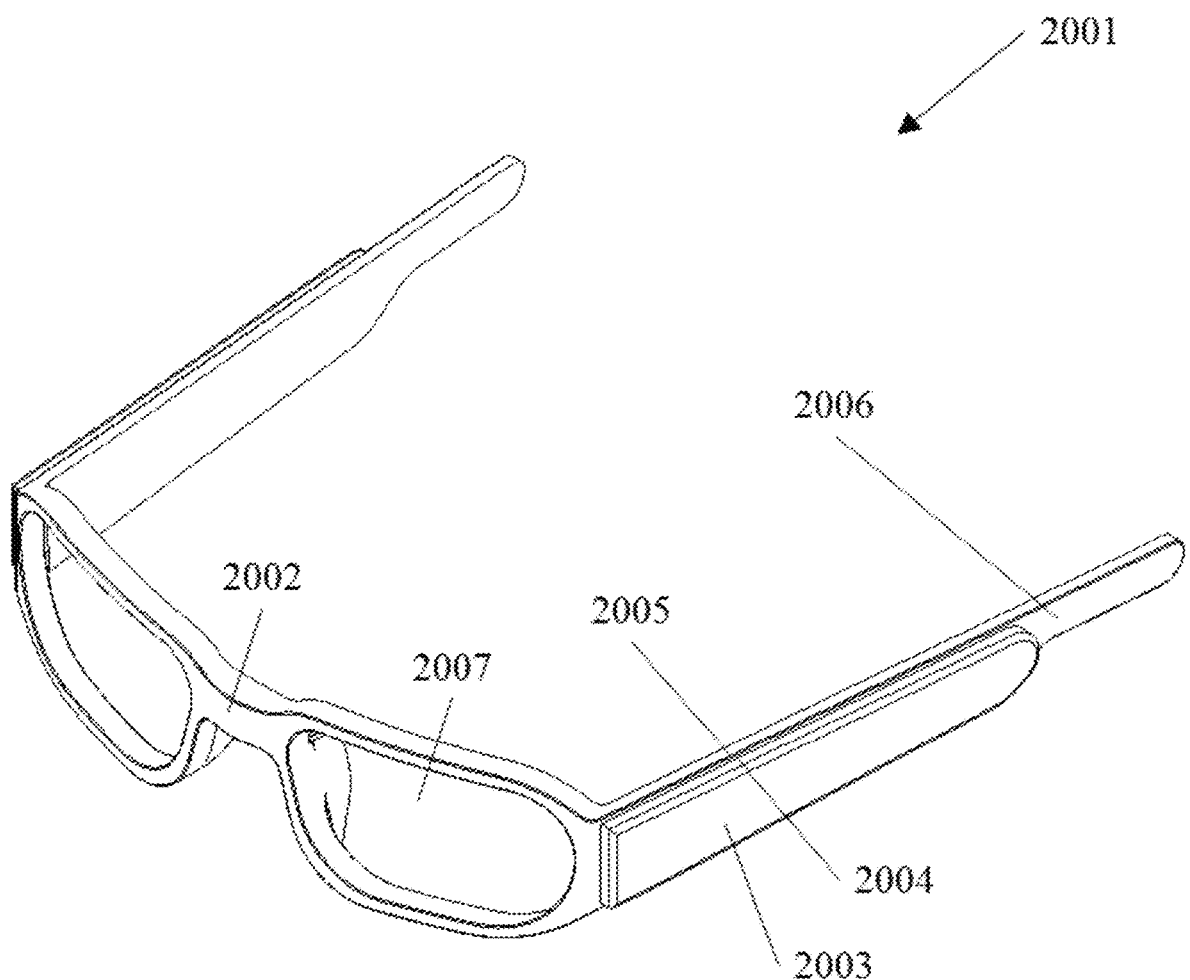
FIG. 20 is a schematic perspective view of eyewear.

FIG. 20 shows eyewear 2001 that can be configured to operate on power at least partially generated from body heat. The eyewear 2001 comprises a control module 2002 that includes a sensor, communications interface and a computer processor, which can be in electrical communication with one another. The eyewear 2001 further comprises a heat expeller 2003, thermoelectric device 2004, a heat collector 2005, and a power module 2006 having power management electronics and an energy storage system. The thermoelectric device 2004 can be in electrical communication with the control module 2002. Power to the control module 2002 can be at least partially provided by the thermoelectric device 2004 either directly to the control module 2002 or, in some cases, used to charge the energy storage system in the power module 2006, which can then provide power to the control module 2002.

The control module 2002 can be configured to present content to the user, such as on at least one of the glasses 2007 of the eyewear 2001. The content can include electronic communications, such as text messages and electronic mail, geographic navigation information, network content (e.g., content from the World Wide Web), and documents (e.g., text document).

Figure 21A:
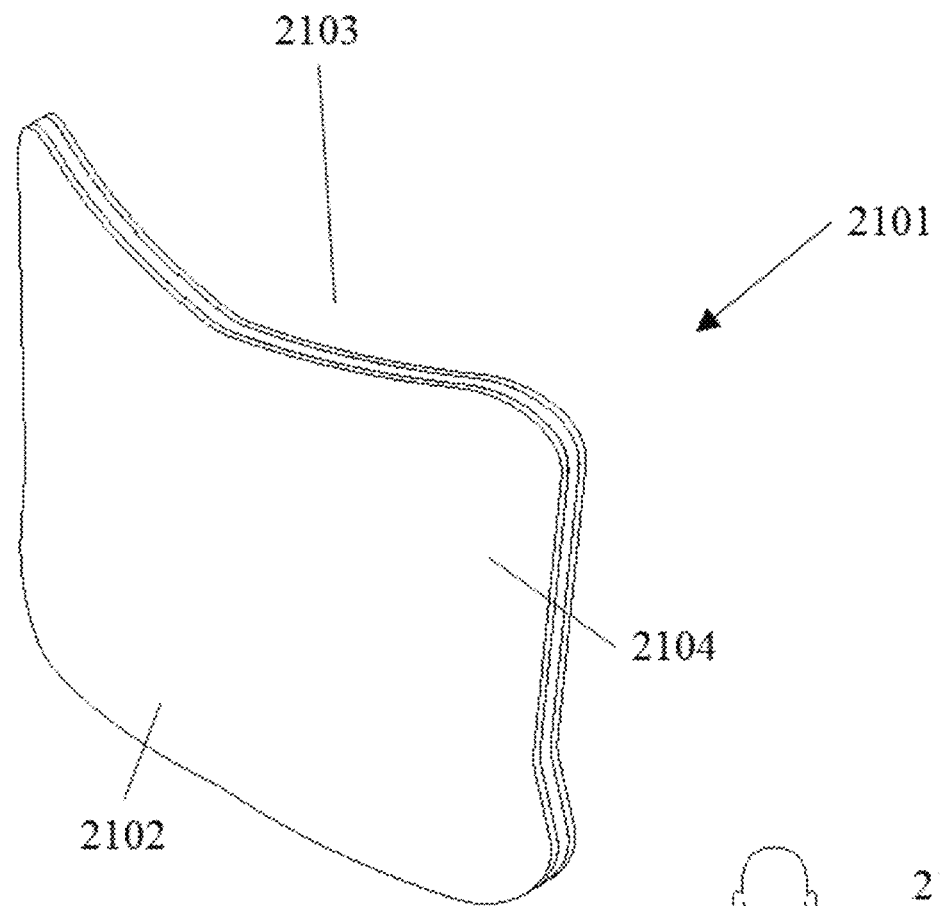
FIG. 21A is a schematic perspective view of a medical device.
Figure 21B:
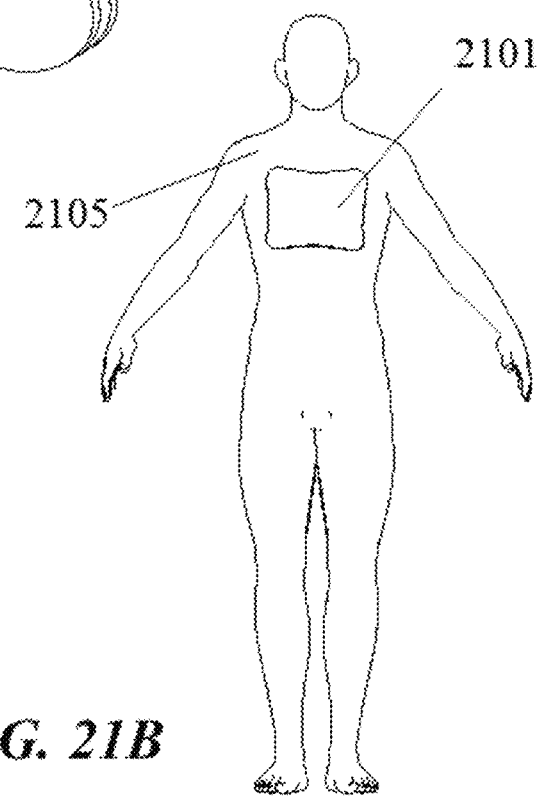
FIG. 21B schematically illustrates the medical device of FIG. 21A mounted on a body of a user.

FIGS. 21A and 21B show a medical device 2101 that can be configured to operate on power at least partially generated from body heat. The medical device 2101 comprises a control module and power module, as described elsewhere herein. The medical device 2101 further comprises a heat expeller 2102 on one surface and a heat collector 2103 on an opposing surface, and a thermoelectric device 2104 with thermoelectric material between the heat expeller and the heat collector. The thermoelectric device 2104 can be in electrical communication with the control module and the power module. FIG. 21B shows the medical device 2101 disposed adjacent the body 2105 of a user.

In some cases, during use of a device having a thermoelectric device, heat from an object (e.g., body of a user) generates a temperature gradient (high temperature to low temperature) from a heat collector to a heat expeller. The heat collector collects heat and the heat expeller expels heat. The temperature gradient can be used to generate power using a thermoelectric device between the heat collector and heat expeller.

Thermoelectric elements, devices and systems provided herein can be used in a vehicle waste heat recovery, such as in an apparatus that uses thermoelectric materials to convert vehicular waste heat to electricity (or electric power). The apparatus can be integrated with components common to automotive vehicles, including, but not limited to, engine blocks, heat exchangers, radiators, catalytic converters, mufflers, exhaust pipes and various components in the cabin of the vehicle, such as a heating and/or air conditioning unit, or components common to industrial facilities, including, but not limited to, turbine blocks, engine blocks, exchangers, radiators, reaction chambers, chimneys and exhaust. The apparatus may be used as the sole source of electrical power to the vehicle or an electrical component of the vehicle (e.g., radio, heating or air conditioning unit, or control system), generating at least about 1 W, 2 W, 3 W, 4 W, 5 W, 6 W, 7 W, 8 W, 9 W, 10 W, 20 W, 30 W, 40 W, 50 W, 60 W, 70 W, 80 W, 90 W, 100 W, 200 W, 300 W, 400 W, 500 W, 600 W, 700 W, 800 W, 900 W, 1000 W, or 5000 W of power, in some cases from about 100 W to 1000 W of power. Power from the apparatus can be augmented or supported by another power source. For example, in the context of automotive vehicles, power can be augmented or supported by power from a battery, alternator, regenerative braking, or a vehicular recharge station. As another example, in the context of industrial or commercial facilities, power can be augmented or supported by power from one or more of batteries, generators, the power grid, turbine blocks, engine blocks, heat exchangers, radiators, reaction chambers, chimneys and exhaust, and/or a renewable energy source, such as one or more of solar power, wind power, wave power, and geothermal power.

Flexible thermoelectric devices can be wrapped around pipes through which hot fluid can be flowed. The wrapped pipes may also be further integrated with heat sinks to increase thermal transfer. The hot fluid may be hot exhaust, hot water, hot oil, hot air etc. Over the wrapped pipes, a cool fluid can be flowed. The cool fluid may be cool exhaust, cool water, cool oil, cool air etc. The wrapped pipes may be enclosed within a housing through which the coolant is flowed if the coolant fluid is to be isolated from the ambient environment. They may be exposed to the environment if the coolant fluid is ambient air or water.

In an implementation, an apparatus for power generation from heat is a power generating pipe wrapping. Hot fluid (such as hot exhaust) is passed through a pipe wrapped with thermoelectric devices. The hot side of the thermoelectric device may be physically or chemically bonded to the external surface of the tube to improve thermal transfer. The cold side of the thermoelectric device may be physically or chemically bonded with heat sinks to improve thermal transfer. A cool fluid (e.g., air or water) can be forced over the wrapped pipes to extract heat from the hot fluid. The thermoelectric devices interspersed in the path of heat flow can convert heat to electricity, providing an output power at least about 1 W, 2 W, 3 W, 4 W, 5 W, 6 W, 7 W, 8 W, 9 W, 10 W, 20 W, 30 W, 40 W, 50 W, 60 W, 70 W, 80 W, 90 W, 100 W, 200 W, 300 W, 400 W, 500 W, 600 W, 700 W, 800 W, 900 W, 1000 W, or 5000 W, in some cases from about 100 W to 1000 W. If desired, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and is used to power circuits directly or to trickle charge a power storage unit such as a battery.

In another implementation, an apparatus for power generation from heat is a power generating exhaust pipe. Hot fluid (such as hot exhaust gas) can be passed through a pipe wrapped with thermoelectric devices. The hot side of the thermoelectric device may be physically or chemically bonded to the external surface of the tube to improve thermal transfer. The cold side of the thermoelectric device may be physically or chemically bonded with heat sinks to improve thermal transfer. To further increase the surface area of the pipe and improve thermal transfer, the pipe internal surface may be molded with dimples, corrugations, pins, fins or ribs. The pipe may be made from a material that is readily weldable, extrudable, machinable or formable, such as, for example, steel, aluminum etc. A cool fluid (e.g., air or water) can be forced over the wrapped pipes to extract heat from the hot fluid. The thermoelectric devices interspersed in the path of heat flow can convert heat to electricity, providing an output power at least about 1 W, 2 W, 3 W, 4 W, 5 W, 6 W, 7 W, 8 W, 9 W, 10 W, 20 W, 30 W, 40 W, 50 W, 60 W, 70 W, 80 W, 90 W, 100 W, 200 W, 300 W, 400 W, 500 W, 600 W, 700 W, 800 W, 900 W, 1000 W, or 5000 W, in some cases from about 100 W to 1000 W. If desired, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and is used to power circuits directly or to trickle charge a power storage unit such as a battery.

In yet another implementation, an apparatus for power generation from heat is a discrete power generating unit to be installed on an exhaust pipe or on any hot surface. A hot surface can be placed in contact with the apparatus containing thermoelectric devices. A mating face can be provided, which can be attached in close physical contact to a hot surface using any suitable technique (e.g., bolted, strapped, welded, brazed, or soldered). The hot side of the thermoelectric device may be physically or chemically bonded to the opposite side of the mating face to improve thermal transfer. The cold side of the thermoelectric device may be physically or chemically bonded with heat sinks to improve thermal transfer. A cool fluid (such as air) can be forced over the unit to extract heat from the hot surface. The thermoelectric devices interspersed in the path of heat flow can convert heat to electricity, providing an output power at least about 1 W, 2 W, 3 W, 4 W, 5 W, 6 W, 7 W, 8 W, 9 W, 10 W, 20 W, 30 W, 40 W, 50 W, 60 W, 70 W, 80 W, 90 W, 100 W, 200 W, 300 W, 400 W, 500 W, 600 W, 700 W, 800 W, 900 W, 1000 W, or 5000 W, in some cases from about 100 W to 1000 W. If desired, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and is used to power circuits directly or to trickle charge a power storage unit such as a battery.

Figure 22:
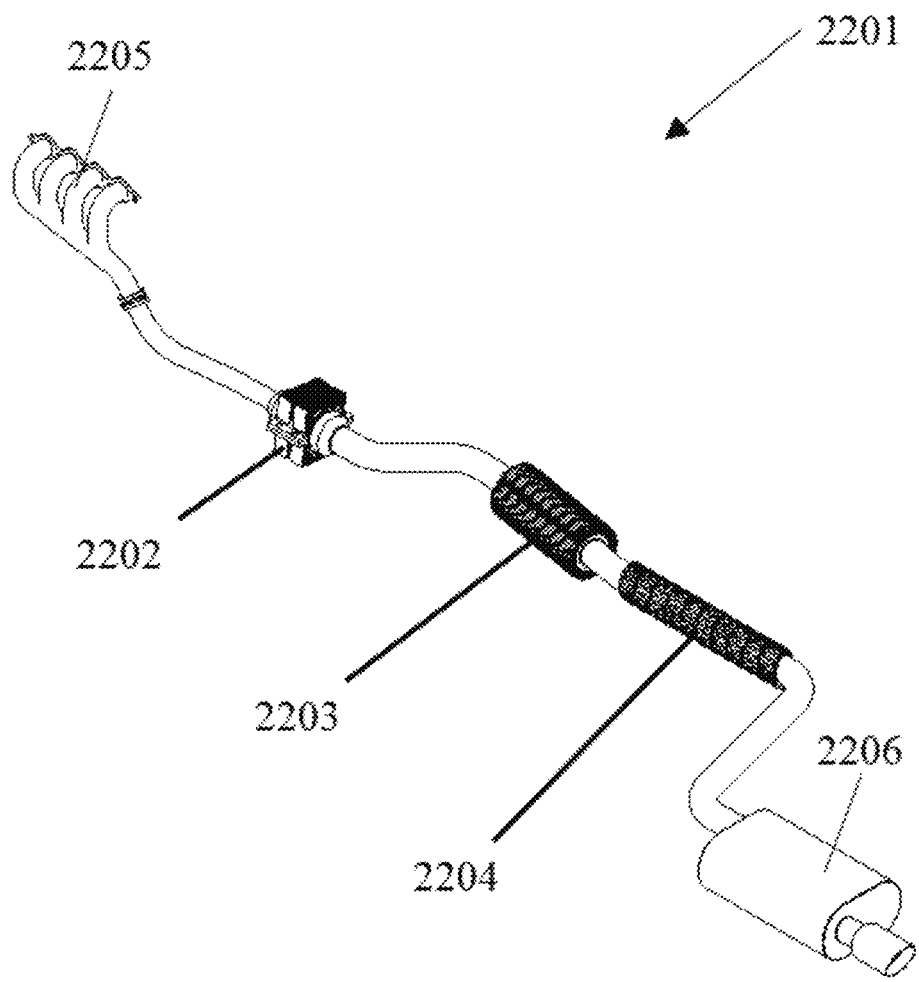
FIG. 22 schematically illustrates heat recover systems as part of a vehicle exhaust system.

FIG. 22 schematically illustrates thermoelectric power recovery from vehicle exhaust. Apparatuses for heat recovery can be installed at various locations of an exhaust pipe 2201, such as clamped around a catalytic converter 2202, welded in an in-line fashion 2203, and/or wrapped around 2204 at least a portion of the exhaust pipe 2201.

During use, exhaust gas is directed from a manifold 2205 through the pipe 2201 to a muffler 2206. Waste heat in the exhaust gas can be used to generate power using one or more apparatuses for heat recovery, which can generate power from waste heat.

In another implementation, an apparatus for power generation from heat is a power generating radiator unit. Hot fluid (such as hot water or steam, hot oil) can be passed through a series of pipes wrapped with thermoelectric devices. The hot side of the thermoelectric device may be physically or chemically bonded to the external surface of the tube to improve thermal transfer. The cold side of the thermoelectric device may be physically or chemically bonded with heat sinks to improve thermal transfer. A cool fluid (such as air) can be forced over the wrapped pipes to extract heat from the hot fluid. The thermoelectric devices interspersed in the path of heat flow can convert heat to electricity, providing an output power at least about 1 W, 2 W, 3 W, 4 W, 5 W, 6 W, 7 W, 8 W, 9 W, 10 W, 20 W, 30 W, 40 W, 50 W, 60 W, 70 W, 80 W, 90 W, 100 W, 200 W, 300 W, 400 W, 500 W, 600 W, 700 W, 800 W, 900 W, 1000 W, or 5000 W, in some cases from about 100 W to 1000 W. If desired, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and is used to power circuits directly or to trickle charge a power storage unit such as a battery.

Figure 23A:
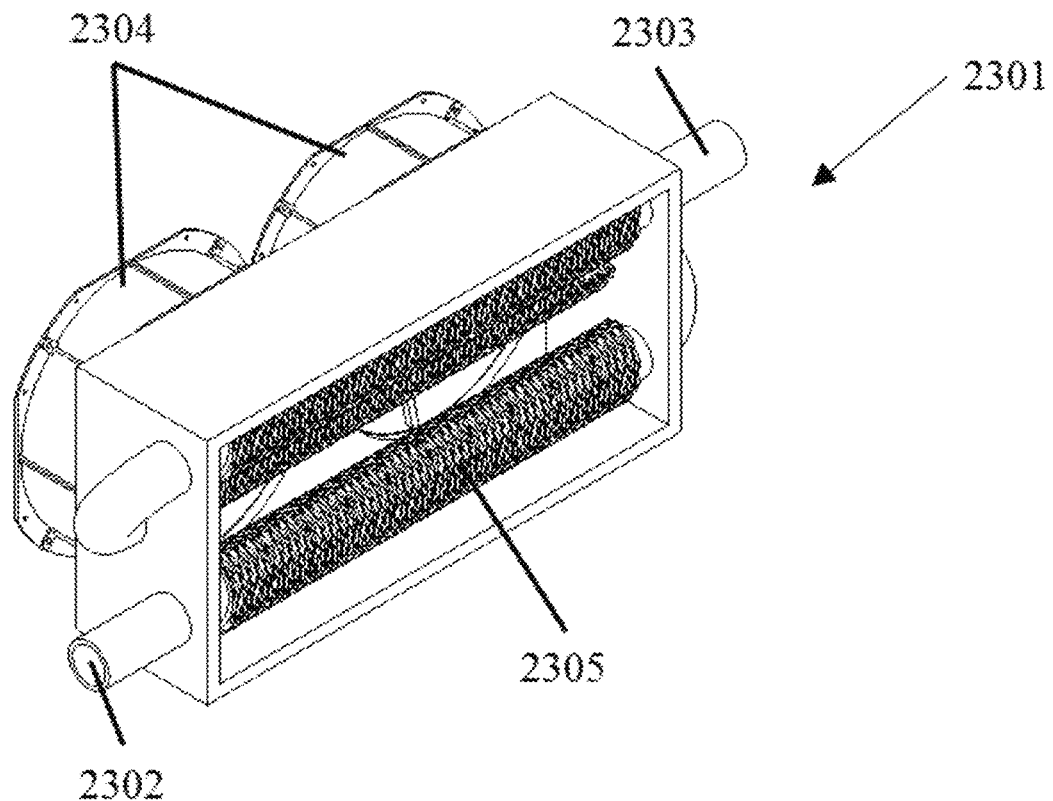
FIG. 23A is a schematic perspective side view of a heat recovery and power generation system installed on a radiator.
Figure 23B:
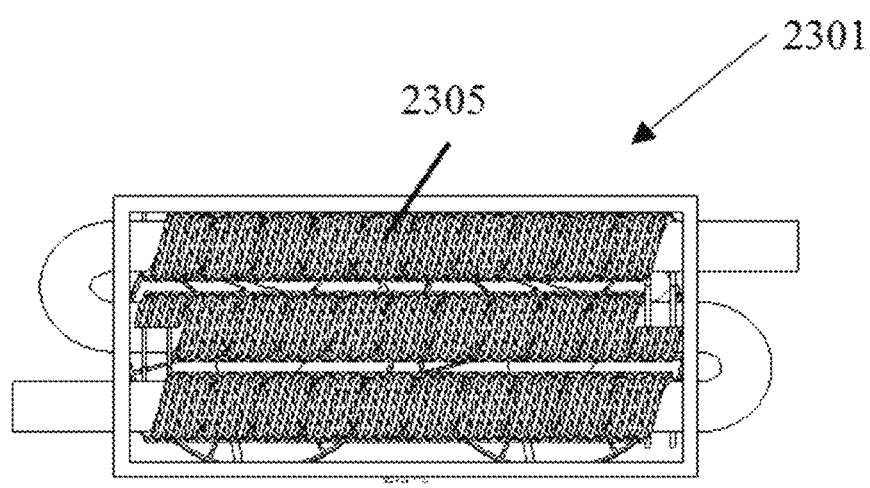
FIG. 23B is a schematic side view of the heat recovery and power generation system of FIG. 23A.

FIGS. 23A and 23B show an apparatus for heat recovery and power generation installed in a radiator 2301, which comprises a hot fluid inlet 2302 in fluid communication with a hot fluid outlet 2303, in addition to cooling fans 2304. The radiator 2301 can be part of a vehicle. Hot pipes of the radiator are at least partially wrapped by a heat recovery apparatus 2305 comprising a flexible thermoelectric device with flexible heat sinks. The flexible thermoelectric device can include thermoelectric elements disclosed herein.

During use, a hot fluid is directed from the hot fluid inlet 2302 to the hot fluid outlet 2303. Waste heat in the fluid can be used to generate power using the apparatus 2305 for heat recovery, which can generate power from the waste heat.

In another implementation, an apparatus for power generation from heat is a power generating exchanger unit. Hot fluid (e.g., hot water or steam, or hot oil) can be passed through a series of pipes wrapped with thermoelectric devices. The hot side of the thermoelectric device may be physically or chemically bonded to the external surface of the tube to improve thermal transfer. The cold side of the thermoelectric device may be physically or chemically bonded with heat sinks to improve thermal transfer. A cool fluid (e.g., cool water or cool oil) can be pumped over the wrapped pipes to extract heat from the hot fluid. The thermoelectric devices interspersed in the path of heat flow can convert heat to electricity, providing an output power at least about 1 W, 2 W, 3 W, 4 W, 5 W, 6 W, 7 W, 8 W, 9 W, 10 W, 20 W, 30 W, 40 W, 50 W, 60 W, 70 W, 80 W, 90 W, 100 W, 200 W, 300 W, 400 W, 500 W, 600 W, 700 W, 800 W, 900 W, 1000 W, or 5000 W, in some cases from about 100 W to 1000 W. If desired, a lower voltage can be converted to at least about 1 V, 2, V, 2.1 V, 2.2 V, 2.3 V, 2.35 V, 2.4 V, 2.45 V, 2.5 V, 3 V, 3.1 V, 3.2 V, 3.3 V, 3.4 V, 3.5 V, 3.6 V, 3.7 V, 3.8 V, 3.9 V, 4 V, 4.1 V, 4.2 V, 4.3 V, 4.4 V, 4.5 V, or 5.0 V using a DC-DC converter and associated power management circuitry, and is used to power circuits directly or to trickle charge a power storage unit such as a battery.

Figure 24A:
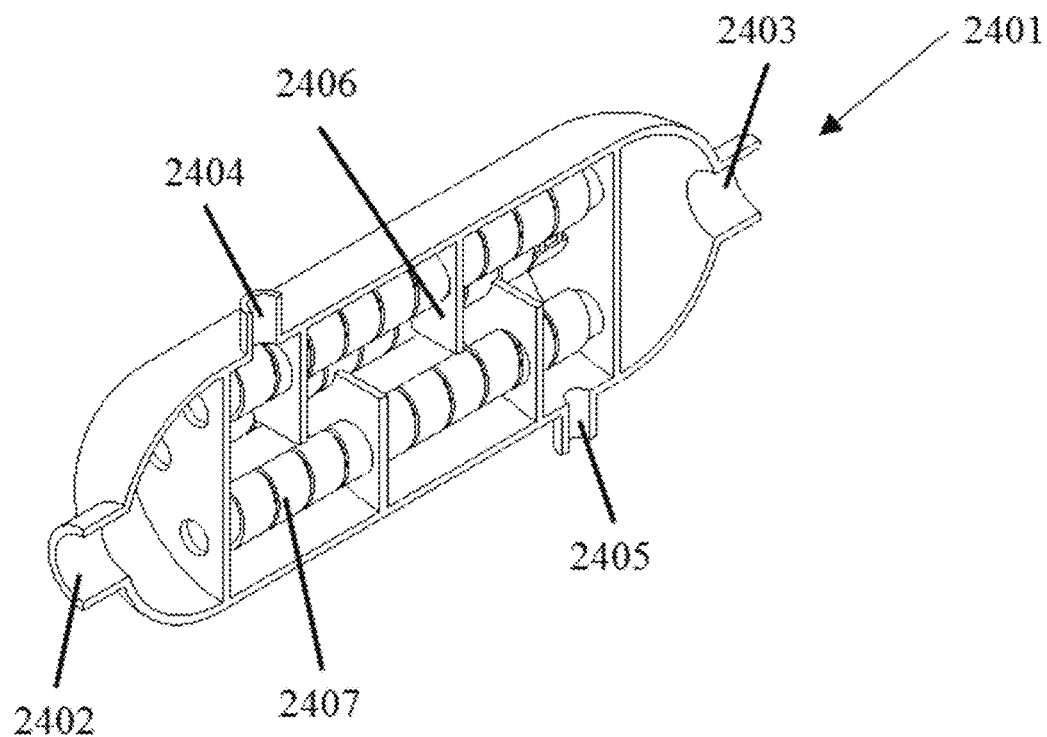
FIG. 24A is a schematic perspective side view of a heat recovery and power generation system installed in a heat exchanger.
Figure 24B:
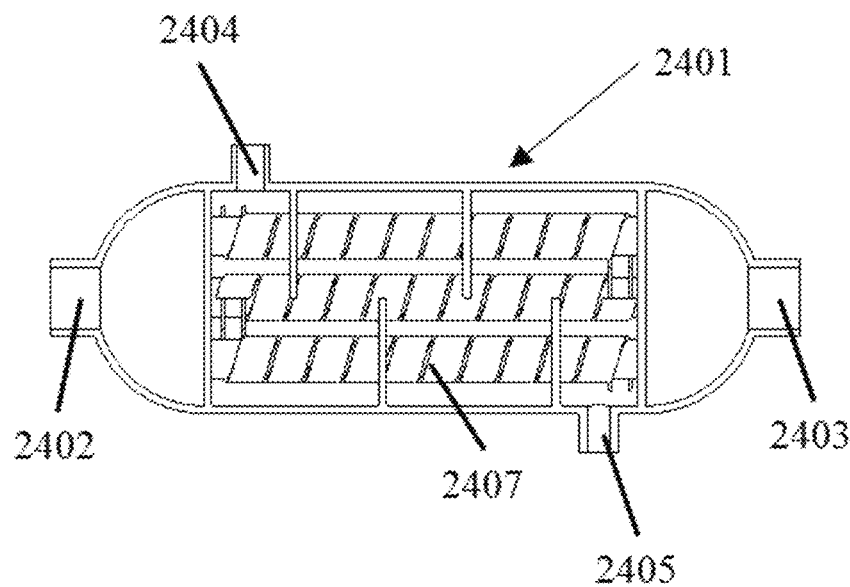
FIG. 24B is a schematic side view of the heat recovery and power generation system of FIG. 24A.

FIGS. 24A and 24B show an apparatus for heat recovery and power generation installed in a heat exchanger 2401, which comprises a hot fluid inlet 2402 in fluid communication with a hot fluid outlet 2403 and a cold fluid inlet 2404 in fluid communication with a cold fluid outlet 2405. The heat exchanger 2401 further includes baffles 2406 to direct cold fluid flow, and hot pipes 2407 wrapped with a flexible thermoelectric device.

During use, a hot fluid (e.g., steam) is directed from the hot fluid inlet 2402 to the hot fluid outlet 2403 and a cold fluid (e.g., liquid water) is directed from the cold fluid inlet 2404 to the cold fluid outlet 2405. The hot fluid flow through the hot pipes 2407 and dissipates heat to the cold fluid being directed from the fold fluid inlet 2404 to the cold fluid outlet 2405. Waste heat in the fluid can be used to generate power using the flexible thermoelectric device wrapped around the hot pipes 2407.

Computer Control Systems

Figure 25:
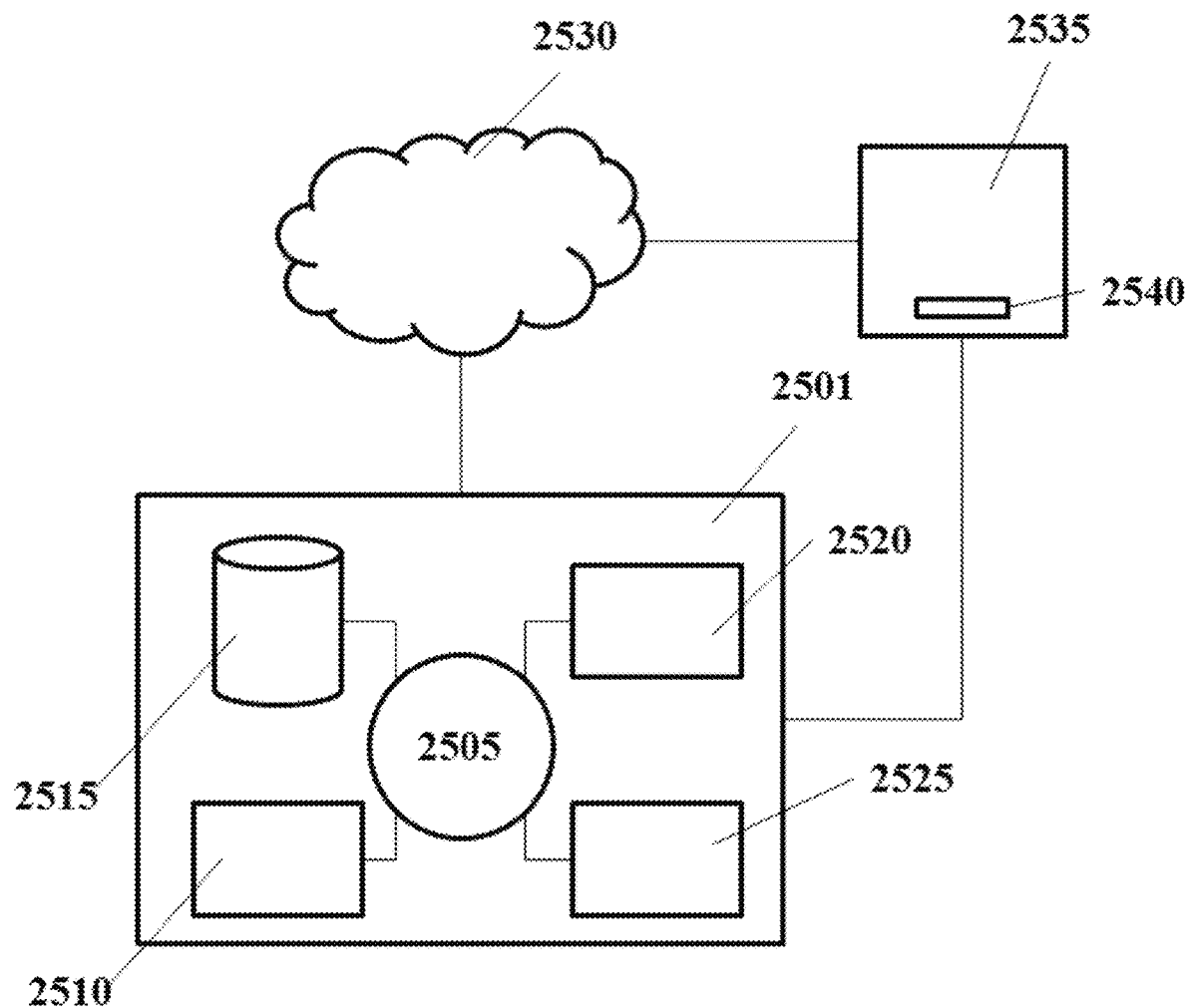
FIG. 25 shows a computer control system that is programmed or otherwise configured to implement various methods provided herein, such as manufacturing thermoelectric elements.

The present disclosure provides computer control systems that are programmed or otherwise configured to implement various methods of the disclosure, such as manufacturing a thermoelectric element. FIG. 25 shows a computer system (also "system" herein) 2501 programmed or otherwise configured to facilitate the formation of thermoelectric devices of the disclosure. The system 2501 can be programmed or otherwise configured to implement methods described herein. The system 2501 includes a central processing unit (CPU, also "processor" and "computer processor" herein)

2505, which can be a single core or multi core processor, or a plurality of processors for parallel processing. The system 2501 also includes memory 2510 (e.g., random-access memory, read-only memory, flash memory), electronic storage unit 2515 (e.g., hard disk), communications interface 2520 (e.g., network adapter) for communicating with one or more other systems, and peripheral devices 2525, such as cache, other memory, data storage and/or electronic display adapters. The memory 2510, storage unit 2515, interface 2520 and peripheral devices 2525 are in communication with the CPU 2505 through a communications bus (solid lines), such as a motherboard. The storage unit 2515 can be a data storage unit (or data repository) for storing data. The system 2501 is operatively coupled to a computer network ("network") 2530 with the aid of the communications interface 2520. The network 2530 can be the Internet, an internet and/or extranet, or an intranet and/or extranet that is in communication with the Internet. The network 2530 in some cases is a telecommunication and/or data network. The network 2530 can include one or more computer servers, which can enable distributed computing, such as cloud computing. The network 2530 in some cases, with the aid of the system 2501, can implement a peer-to-peer network, which may enable devices coupled to the system 2501 to behave as a client or a server.

The system 2501 is in communication with a processing system 2535 for forming thermoelectric elements and devices of the disclosure. The processing system 2535 can be configured to implement various operations to form thermoelectric devices provided herein, such as forming thermoelectric elements and forming thermoelectric devices (e.g., thermoelectric tape) from the thermoelectric elements. The processing system 2535 can be in communication with the system 2501 through the network 2530, or by direct (e.g., wired, wireless) connection. In an example, the processing system 2535 is an electrochemical etching system. In another example, the processing system 2535 is a dry box.

The processing system 2535 can include a reaction space for forming a thermoelectric element from the substrate 2540. The reaction space can be filled with an electrolyte and include electrodes for etching (e.g., cathodic or anodic etching).

Methods as described herein can be implemented by way of machine (or computer processor) executable code (or software) stored on an electronic storage location of the system 2501, such as, for example, on the memory 2510 or electronic storage unit 2515. During use, the code can be executed by the processor 2505. In some examples, the code can be retrieved from the storage unit 2515 and stored on the memory 2510 for ready access by the processor 2505. In some situations, the electronic storage unit 2515 can be precluded, and machine-executable instructions are stored on memory 2510.

The code can be pre-compiled and configured for use with a machine have a processor adapted to execute the code, or can be compiled during runtime. The code can be supplied in a programming language that can be selected to enable the code to execute in a pre-compiled or as-compiled fashion.

Aspects of the systems and methods provided herein, such as the system 2501, can be embodied in programming. Various aspects of the technology may be thought of as "products" or "articles of manufacture" typically in the form of machine (or processor) executable code and/or associated data that is carried on or embodied in a type of machine readable medium. Machine-executable code can be stored on an electronic storage unit, such memory (e.g., read-only memory, random-access memory, flash memory) or a hard disk. "Storage" type media can include any or all of the tangible memory of the computers, processors or the like, or associated modules thereof, such as various semiconductor memories, tape drives, disk drives and the like, which may provide non-transitory storage at any time for the software programming. All or portions of the software may at times be communicated through the Internet or various other telecommunication networks. Such communications, for example, may enable loading of the software from one computer or processor into another, for example, from a management server or host computer into the computer platform of an application server. Thus, another type of media that may bear the software elements includes optical, electrical and electromagnetic waves, such as used across physical interfaces between local devices, through wired and optical landline networks and over various air-links. The physical elements that carry such waves, such as wired or wireless links, optical links or the like, also may be considered as media bearing the software. As used herein, unless restricted to non-transitory, tangible "storage" media, terms such as computer or machine "readable medium" refer to any medium that participates in providing instructions to a processor for execution.

Hence, a machine readable medium, such as computer-executable code, may take many forms, including but not limited to, a tangible storage medium, a carrier wave medium or physical transmission medium. Non-volatile storage media include, for example, optical or magnetic disks, such as any of the storage devices in any computer(s) or the like, such as may be used to implement the databases, etc. shown in the drawings. Volatile storage media include dynamic memory, such as main memory of such a computer platform. Tangible transmission media include coaxial cables; copper wire and fiber optics, including the wires that comprise a bus within a computer system. Carrier-wave transmission media may take the form of electric or electromagnetic signals, or acoustic or light waves such as those generated during radio frequency (RF) and infrared (IR) data communications. Common forms of computer-readable media therefore include for example: a floppy disk, a flexible disk, hard disk, magnetic tape, any other magnetic medium, a CD-ROM, DVD or DVD-ROM, any other optical medium, punch cards paper tape, any other physical storage medium with patterns of holes, a RAM, a ROM, a PROM and EPROM, a FLASH-EPROM, any other memory chip or cartridge, a carrier wave transporting data or instructions, cables or links transporting such a carrier wave, or any other medium from which a computer may read programming code and/or data. Many of these forms of computer readable media may be involved in carrying one or more sequences of one or more instructions to a processor for execution.

Methods described herein can be automated with the aid of computer systems having storage locations with machine-executable code implementing the methods provided herein, and a processor for executing the machine-executable code.

Example 1

A thermoelectric element is formed by providing a semiconductor substrate in a reaction chamber having an etching solution comprising hydrofluoric acid at a concentration from about 10% to 50% (by weight) HF. The semiconductor substrate has a dopant concentration such that the semiconductor substrate has a resistivity from about 0.001 ohm-cm to 0.1 ohm-cm. The etching solution is at a temperature of about 25° C. A working electrode is brought in contact with a backside of the substrate and a counter electrode is submerged in the etching solution facing a front side of the substrate. The counter electrode is not in contact with the substrate. Next, a power source is used to force a current density from about 10 mA/cm² to 20 mA/cm², which yields an electrical potential of about 1 V between the working electrode and the counter electrode. The applied electrical potential and flow of electrical current is maintained for a time period of about 1 hour. This forms a disordered pattern of holes in the substrate.

Example 2

Figure 26A:
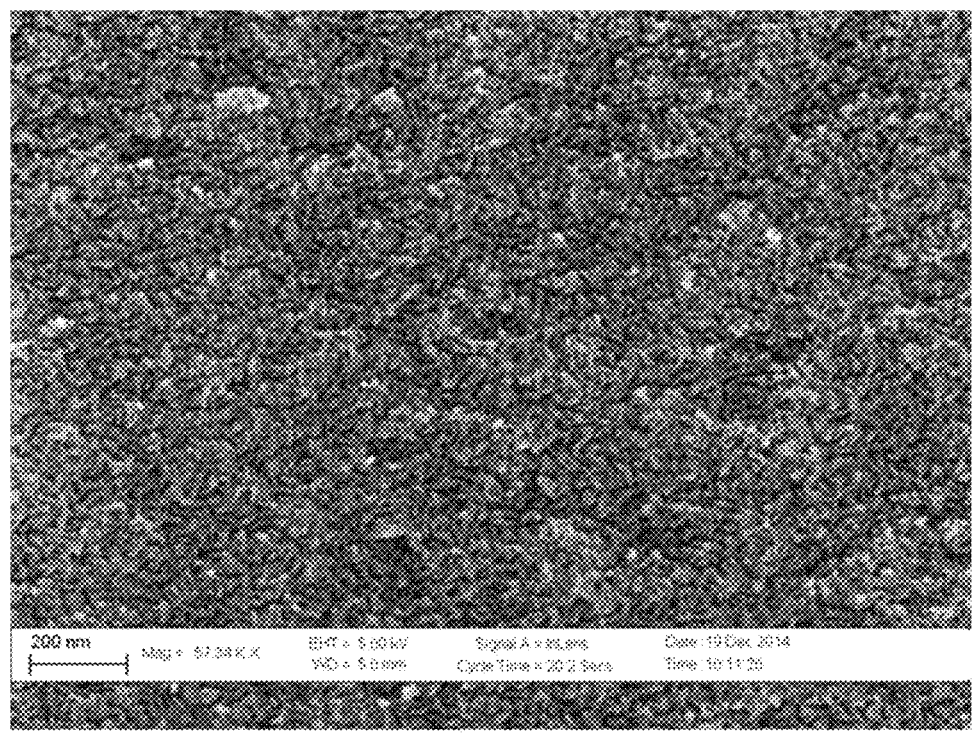
FIG. 26A shows a scanning electron microscopy (SEM) micrograph of a thermoelectric element.
Figure 26B:
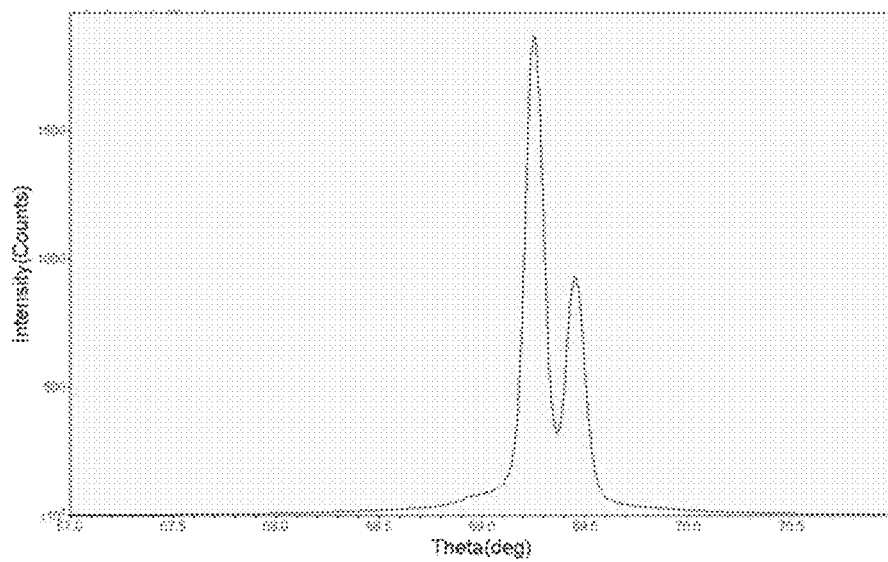
FIG. 26B shows an x-ray diffraction (XRD) plot showing bulk and porous silicon in a thermoelectric element.

A thermoelectric element is formed according to the method described in Example 1. FIGS. 26A and 26B show an SEM micrograph and XRD spectrum, respectively, of the thermoelectric element. The SEM micrograph is obtained under the following conditions: 5 kilovolts (kV) and a working distance of 5 millimeters. The SEM micrograph shows a disordered pattern of holes in silicon. The XRD spectrum shows two peaks. The taller peak (left) is of porous silicon and the smaller peak (right) is of bulk silicon.

Devices, systems and methods provided herein may be combined with or modified by other devices, systems and methods, such as devices, systems and/or methods described in U.S. Pat. No. 7,309,830 to Zhang et al., U.S. Patent Publication No. 2006/0032526 to Fukutani et al. U.S. Patent Publication No. 2009/0020148 to Boukai et al., U.S. patent application Ser. No. 13/550,424 to Boukai et al., PCT/US2012/047021, filed Jul. 17, 2012, PCT/US2013/021900, filed Jan. 17, 2013, PCT/US2013/055462, filed Aug. 25, 2013, and PCT/US2013/067346, filed Oct. 29, 2013, each of which is entirely incorporated herein by reference.

While preferred embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations or equivalents. It is intended that the following claims define the scope of the invention and that methods and structures within the scope of these claims and their equivalents be covered thereby.

What is claimed is:

1. A method for forming a thermoelectric element having a figure of merit (ZT) that is at least 0.25 at 25° C., comprising:
   (a) providing a reaction space comprising a semiconductor substrate in electrical communication with a plurality of electrodes, wherein said semiconductor substrate is substantially free of a metallic coating; and
   (b) using said plurality of electrodes to direct electrical current through said semiconductor substrate at a current density of at least 0.1 mA/cm² and an electrical potential of at least 1 volt (V), to form a thermoelectric element comprising a pattern of holes, wherein said thermoelectric element has said ZT that is at least 0.25 at 25° C.

2. The method of claim 1, wherein said plurality of electrodes comprises a working electrode and a counter electrode that are each in electrical communication with said semiconductor substrate.

3. The method of claim 1, further comprising providing an etching solution in said reaction space, wherein during (b), said etching solution is in contact with said semiconductor substrate.

4. The method of claim 3, wherein said etching solution comprises an acid.

5. The method of claim 1, wherein said pattern of holes comprises a disordered pattern of holes.

6. The method of claim 1, wherein said pattern of holes is polydisperse.

7. The method of claim 1, wherein said thermoelectric element has a metal content of less than 1% as measured by x-ray photoelectron spectroscopy (XPS).

8. The method of claim 7, wherein said metal content is less than or equal to 0.1% as measured by XPS.

9. The method of claim 8, wherein said metal content is less than or equal to 0.01% as measured by XPS.

10. The method of claim 9, wherein said metal content is less than or equal to 0.001% as measured by XPS.

11. The method of claim 1, wherein said ZT is at least 0.3 at 25° C.

12. The method of claim 11, wherein said ZT is at least 0.6 at 25° C.

13. The method of claim 12, wherein said ZT is at least 0.8 at 25° C.

14. The method of claim 13, wherein said ZT is at least 1.0 at 25° C.

15. The method of claim 14, wherein said ZT is at least 1.3 at 25° C.

16. The method of claim 1, wherein said current density is at least 1 mA/cm².

17. The method of claim 16, wherein said current density is at least 10 mA/cm².

18. The method of claim 17, wherein said current density is less than or equal to 50 mA/cm².

19. The method of claim 1, wherein a hole of said pattern of holes has a surface roughness from 0.1 nanometers (nm) to 50 nm as measured by transmission electron microscopy (TEM).

* * * * *